(12) United States Patent
Ohnuki

(10) Patent No.: US 8,792,284 B2
(45) Date of Patent: Jul. 29, 2014

(54) OXIDE SEMICONDUCTOR MEMORY DEVICE

(75) Inventor: Tatsuya Ohnuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 282 days.

(21) Appl. No.: 13/196,226

(22) Filed: Aug. 2, 2011

(65) Prior Publication Data

US 2012/0032164 A1     Feb. 9, 2012

(30) Foreign Application Priority Data

Aug. 6, 2010   (JP) ................. 2010-177874
May 13, 2011   (JP) ................. 2011-108422

(51) Int. Cl.
*G11C 11/34*     (2006.01)
*G11C 11/24*     (2006.01)

(52) U.S. Cl.
USPC ........... 365/187; 257/298; 257/300; 257/304; 257/E27.084; 365/149

(58) Field of Classification Search
CPC ........... G09G 2300/0842; G11C 11/24; G11C 11/405; G11C 11/565
USPC ....... 257/5, 300, E27.084; 365/149, 186, 187
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 5,748,538 A | 5/1998 | Lee et al. | |
| 6,127,702 A | 10/2000 | Yamazaki et al. | |
| 6,294,274 B1 | 9/2001 | Kawazoe et al. | |
| 6,314,017 B1* | 11/2001 | Emori et al. .................. | 365/149 |
| 6,563,174 B2 | 5/2003 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Kenneth Parker
*Assistant Examiner* — Paul Budd
(74) *Attorney, Agent, or Firm* — Fish & Richardson P.C.

(57) ABSTRACT

In a semiconductor device which conducts multilevel writing operation and a driving method thereof, a signal line for controlling on/off of a writing transistor for conducting a writing operation on a memory cell using a transistor including an oxide semiconductor layer is disposed along a bit line, and a multilevel writing operation is conducted with use of, also in a writing operation, a voltage which is applied to a capacitor at a reading operation. Because an oxide semiconductor material that is a wide gap semiconductor capable of sufficiently reducing off-state current of a transistor is used, data can be held for a long period.

15 Claims, 34 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,068,546 B2 | 6/2006 | Schneider et al. |
| 7,105,868 B2 | 9/2006 | Nause et al. |
| 7,211,825 B2 | 5/2007 | Shih et al |
| 7,262,985 B2 | 8/2007 | Sakai |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,542,326 B2 | 6/2009 | Yoshimura et al. |
| 7,674,650 B2 | 3/2010 | Akimoto et al. |
| 7,732,819 B2 | 6/2010 | Akimoto et al. |
| 7,821,329 B2 | 10/2010 | Kwon |
| 8,009,459 B2 * | 8/2011 | Wu et al. ................ 365/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0169039 A1* | 8/2005 | Peng et al. ................ 365/149 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0049487 A1 | 2/2008 | Yoshimura et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101351 A1 | 5/2011 | Yamazaki |
| 2011/0110145 A1 | 5/2011 | Yamazaki et al. |
| 2011/0134683 A1 | 6/2011 | Yamazaki et al. |
| 2012/0032172 A1 | 2/2012 | Noda et al. |
| 2012/0075917 A1 | 3/2012 | Takemura |
| 2013/0033925 A1 | 2/2013 | Yamazaki et al. |
| 2013/0140558 A1 | 6/2013 | Yamazaki et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-264794 A | 10/1996 |
| JP | 11-025682 A | 1/1999 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2009-033145 A | 2/2009 |
| JP | 2009-182194 A | 8/2009 |
| WO | 2004/114391 A1 | 12/2004 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

(56) References Cited

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

(56) References Cited

OTHER PUBLICATIONS

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner 400   450a   437

450b

453

● In
◐ Sn
◔ Zn
• O

● In
○ Ga
○ Zn
● O

OXIDE SEMICONDUCTOR MEMORY DEVICE

BACKGROUND OF THE INVENTION

1. Field of the Invention

One embodiment of the disclosed invention relates to a semiconductor device using a semiconductor element and a method for driving the semiconductor device.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a memory element is selected and electric charge is stored in a capacitor.

When data is read from a DRAM, electric charge in a capacitor is lost on the above-described principle; thus, another writing operation is necessary whenever data is read out. Moreover, since leakage current (off-state current) or the like flows between a source and a drain of a transistor included in a memory element when the transistor is in an off state, electric charge flows into or out even if the transistor is not selected, which makes a data holding period short. For that reason, another writing operation (refresh operation) is necessary at given intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding period is extremely long (almost permanent) and refresh operation which is necessary in a volatile storage device is not needed (e.g., see Patent Document 1).

However, a gate insulating layer included in a memory element deteriorates by tunneling current generated in writing, so that the memory element stops its function after a given number of writing operations. In order to suppress adverse effects of this problem, a method in which the number of writing operations for memory elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary in order to inject electric charge into the floating gate or remove the electric charge, and a circuit therefor is required. Therefore, there is a problem of high power consumption. Further, it takes a relatively long time to inject or remove electric charges, and it is not easy to perform writing and erasing at higher speed.

Further, as for the above-described flash memory, in order to increase storage capacity, a "multilevel" flash memory is proposed, in which data having more levels than two levels is stored in one memory cell (e.g., see Patent Document 2).

REFERENCE

Patent Document 1: Japanese Published Patent Application No. S57-105889
Patent Document 2: Japanese Published Patent Application No. H11-25682

SUMMARY OF THE INVENTION

Multilevel memory devices use many different voltage values accompanying the increase in storage capacity and thus the number of circuits needed is increased, which leads to growth in size and cost increase. This is a problem for multilevel memory devices.

In view of the problem, an object of one embodiment of the invention disclosed herein is to provide a semiconductor device with a novel structure in which stored data can be retained even when power is not supplied, and does not have a limitation on the number of writing. Further, another object is to simplify the semiconductor device by employing the novel structure and further to increase the storage capacity per unit area.

In a semiconductor device which conducts multilevel writing operation, disclosed in this specification, a signal line for controlling on/off of a writing transistor for writing operation is disposed along a bit line of a memory cell using a transistor including an oxide semiconductor layer. Further, as for a driving method of the semiconductor device, a multilevel writing operation is conducted with use of, also in a writing operation, a voltage which is applied to a capacitor at a reading operation.

In a multilevel memory using a transistor including an oxide semiconductor layer, a writing operation is conducted while an appropriate potential is given to a capacitor of a memory in accordance with data to be written, and thereby a potential corresponding to data to be written can be given to a floating node without change in writing voltage. In other words, without setting a writing voltage in accordance with data to be written, a voltage given to a capacitor of a memory is controlled, and thereby a multilevel operation can be conducted. Therefore, a circuit for controlling writing voltage can be omitted, so that a circuit configuration can be simplified.

A transistor used for the memory cell is a transistor having, as a semiconductor layer, a material which can decrease off-state current sufficiently, for example, a wide gap material (specifically, e.g., a semiconductor material having an energy gap Eg more than 3 eV). Because an oxide semiconductor material is a wide gap semiconductor material, it can constitute a part of a semiconductor device having a transistor including an oxide semiconductor layer. When a semiconductor material which can sufficiently decrease off-state current of a transistor is used, data can be held for a long period.

One embodiment of the semiconductor device disclosed in this specification is a semiconductor device comprising a source line; a bit line; m word lines; a first signal line; a second signal line; a first selection line; a second selection line; first to m-th memory cells connected in series between the source line and the bit line; a first selection transistor, a gate terminal of which is electrically connected to the first selection line; and a second selection transistor, a gate terminal of which is electrically connected to the second selection line. And each of the first to m-th memory cells comprises a first transistor including a first gate terminal, a first source terminal, and a first drain terminal; a second transistor including a second gate terminal, a second source terminal, and a second drain terminal; and a capacitor; the first transistor is formed on a substrate including a semiconductor layer; the second transistor is formed including an oxide semiconductor material; the source line is electrically connected to the first source terminal of the m-th memory cell via the second selection transistor; the bit line is electrically connected to the first drain terminal of the first memory cell via the first selection transistor; the first signal line is electrically connected to the second drain terminal; the second signal line is electrically connected to the second gate terminal; a first drain terminal of the l-th (l is a natural number of from 2 to m) memory cell is electrically connected to a first source terminal of a (l−1)-th memory cell; a k-th (k is a natural number of from 1 to m) word line is electrically connected to one terminal of the capacitor of the k-th memory cell; a second source terminal of the k-th memory cell is electrically connected to a first gate terminal of the k-th memory cell and the other terminal of the capacitor of the k-th memory cell.

One embodiment of the semiconductor device disclosed in this specification is a semiconductor device comprising a source line; a bit line; m word lines; a first signal line; a second signal line; a selection line; first to m-th memory cells connected in series between the source line and the bit line; and a selection transistor, a gate terminal of which is electrically connected to the selection line. And each of the first to m-th memory cells comprises a first transistor including a first gate terminal, a first source terminal, and a first drain terminal; a second transistor including a second gate terminal, a second source terminal, and a second drain terminal; and a capacitor; the first transistor is formed on a substrate including a semiconductor material; the second transistor is formed including an oxide semiconductor layer; the source line is electrically connected to the first terminal source terminal of the m-th memory cell via the selection transistor; the bit line is electrically connected to the first drain terminal of the first memory cell; the first signal line is electrically connected to the second drain terminal; the second signal line is electrically connected to the second gate terminal; a first drain terminal of the l-th (l is a natural number of from 2 to m) memory cell is electrically connected to a first source terminal of a (l−1)-th memory cell; a k-th (k is a natural number of from 1 to m) word line is electrically connected to one terminal of the capacitor of the k-th memory cell; and a second drain terminal of the l-th memory cell is electrically connected to a first gate terminal of the (l−1)-th memory cell, a second source terminal of the (l−1)-th memory cell, and the other terminal of the capacitor of the (l−1)-th memory cell.

In any of the above-described embodiments, the first transistor may be configured to include a channel formation region provided in the substrate including the semiconductor material, impurity regions disposed so as to interpose the channel formation region therebetween, a first gate insulating layer over the channel formation region; and a first gate electrode overlapping with the channel formation region and provided over the first gate insulating layer.

In addition, in this specification and the like, the term such as "electrode" or "wiring" does not limit a function thereof. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used interchangeably in this specification.

Note that in this specification and the like, the term "electrically connected" includes the case where components are connected via an object having some electric function. There is no particular limitation on an "object having some electric function" as long as electric signals can be transmitted and received between components that are connected. Examples of an "object having some electric function" are a switching element such as a transistor, a resistor, an inductor, a capacitor, and an element with a variety of functions as well as an electrode and a wiring.

In a multilevel memory using a transistor including an oxide semiconductor layer, a writing operation is conducted while an appropriate potential is given to a capacitor of a memory in accordance with data to be written, and thereby a potential corresponding to the data can be given to a floating node without change in writing voltage. Therefore, a circuit for controlling writing voltage can be omitted, so that a circuit configuration can be simplified.

Since the off-state current of a transistor including an oxide semiconductor is extremely low, stored data can be held for an extremely long time with use of the transistor. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, a semiconductor device according to one embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing, which is a problem in a conventional nonvolatile memory, and thus reliability thereof is drastically improved. Furthermore, data is written depending on the on state or the off state of the transistor, whereby high-speed operation can be easily realized. In addition, there is an advantage that there is no need of operation for erasing data.

Since a transistor including a material other than an oxide semiconductor can operate at sufficiently high speed, a semiconductor device employing a combination of the transistor with a transistor including an oxide semiconductor can perform high speed operation (e.g., reading data) readily. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a material other than an oxide semiconductor (a transistor capable of operation at a sufficiently high speed, in a wider sense) and the transistor including an oxide semiconductor (a transistor whose off-state current is sufficiently low, in a wider sense).

BRIEF DESCRIPTION OF THE DRAWINGS

In the accompanying drawings:

FIGS. 2A-1, 2A-2, and 2B are circuit diagrams of a semiconductor device;

DETAILED DESCRIPTION OF THE INVENTION

Figure 1:
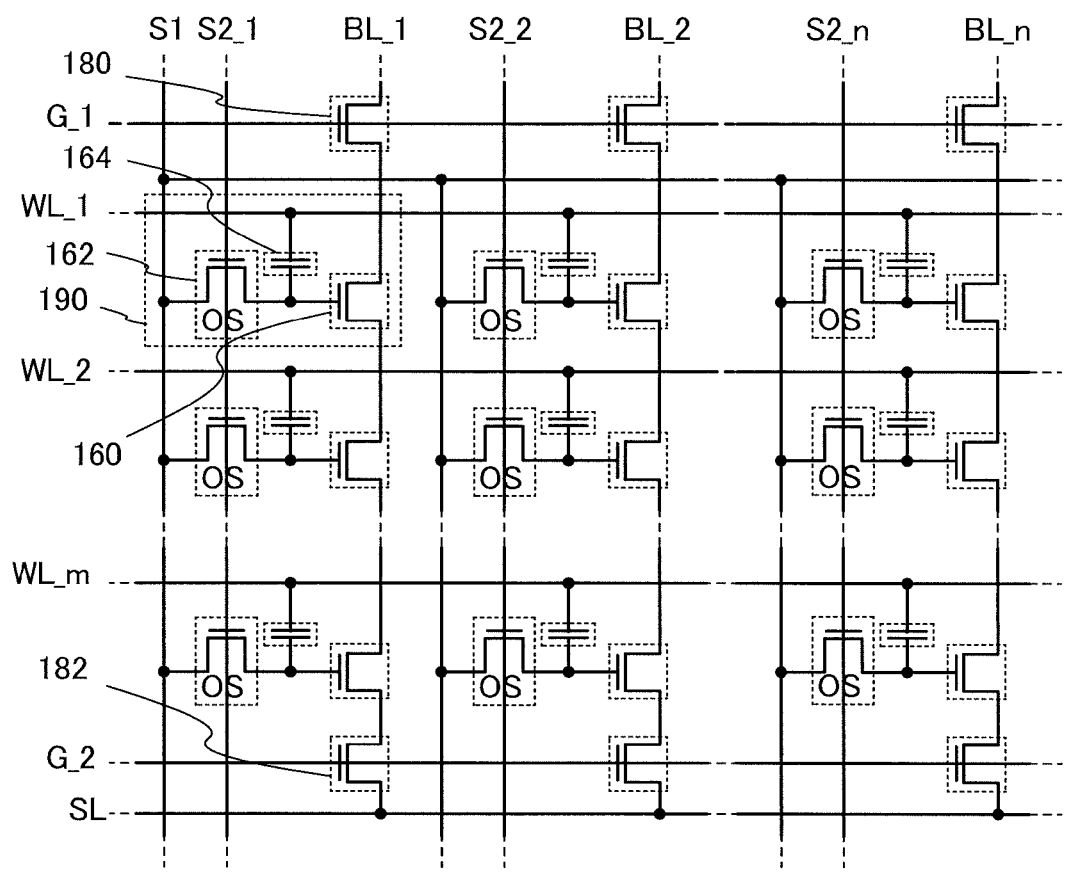
FIG. 1 is a circuit diagram of a semiconductor device.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

Note that in this specification and the like, the ordinal numbers such as "first", "second", and "third" are used in order to avoid confusion among components, and the terms do not limit the components numerically.

(Embodiment 1)

In this embodiment, a circuit configuration and an operation of a semiconductor device according to one embodiment of the disclosed invention will be described with reference to FIG. 1, FIGS. 2A-1, 2A-2, and 2B, FIG. 3, FIG. 4, FIG. 5, FIG. 6, FIG. 7, and FIG. 8. Note that in each of circuit diagrams, in some cases, "OS" is written beside a transistor in order to indicate that the transistor includes an oxide semiconductor.

In the semiconductor device in this embodiment, a signal line for controlling on/off of a writing transistor for conducting a writing operation on a memory cell is disposed along a bit line. Further, in the driving method of the semiconductor device, a multilevel writing operation is conducted with use of, also in a writing operation, a voltage which is applied to a capacitor at a reading operation.

<Basic Circuit>

First, a basic circuit configuration and its operation will be described with reference to FIGS. 2A-1, 2A-2, and 2B. In a semiconductor device illustrated in FIG. 2A-1, a first wiring (a 1st Line) is electrically connected to a source electrode (or a drain electrode) of a transistor 160. A second wiring (a 2nd Line) is electrically connected to the drain electrode (or the source electrode) of the transistor 160. In addition, a third wiring (a 3rd Line) and a source electrode (or a drain electrode) of a transistor 162 are electrically connected to each other, and a fourth wiring (a 4th Line) and a gate electrode of the transistor 162 are electrically connected to each other. In addition, a gate electrode of the transistor 160 and the drain electrode (or the source electrode) of the transistor 162 are electrically connected to one electrode of a capacitor 164, and a fifth wiring (a 5th Line) and the other electrode of the capacitor 164 are electrically connected to each other.

Here, a transistor including an oxide semiconductor is used as the transistor 162, for example. A transistor including an oxide semiconductor has a characteristic of a significantly small off current. For that reason, a potential of the gate electrode of the transistor 160 can be held for an extremely long time by turning off the transistor 162. Provision of the capacitor 164 facilitates holding of electric charge given to the gate electrode of the transistor 160 and reading of stored data.

Note that there is no particular limitation on the transistor 160. In terms of increasing the speed of reading data, it is preferable to use, for example, a transistor with high switching rate such as a transistor formed using single crystal silicon.

Figures 1, 2A:
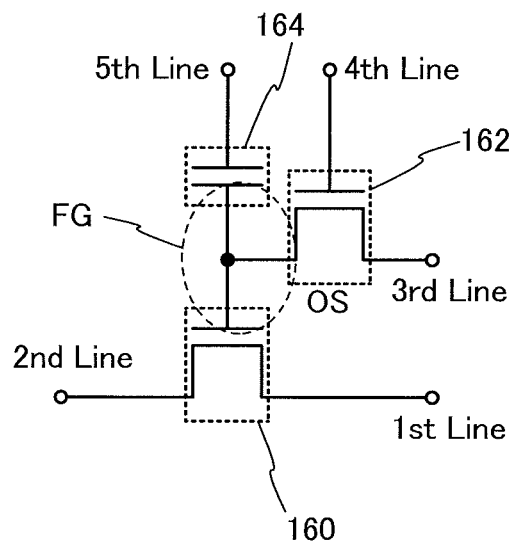
Figure 2B:
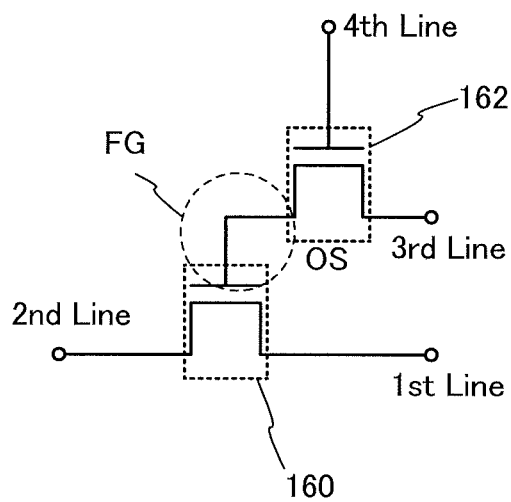

Alternatively, a structure in which the capacitor 164 is not provided as illustrated in FIG. 2B can be employed.

The semiconductor device in FIG. 2A-1 utilizes a characteristic in which the potential of the gate electrode of the transistor 160 can be held, whereby writing, holding, and reading of data can be performed as follows.

Firstly, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, a predetermined electric charge is given to the gate electrode of the transistor 160 (writing operation). Here, one of electric charges for supply of two different potentials (hereinafter, an electric charge for supply of a low potential is referred to as a charge $Q_L$ and an electric charge for supply of a high potential is referred to as a charge $Q_H$) is given to the gate electrode of the transistor 160. Note that electric charges giving three or more different potentials may be applied to improve a storage capacity. After that, the potential of the fourth wiring is set to a potential at which the transistor 162 is turned off, so that the transistor 162 is turned off. Thus, the electric charge given to the gate electrode of the transistor 160 is held (storing operation).

Since the off current of the transistor 162 is significantly small, the electric charge of the gate electrode of the transistor 160 is held for a long time.

Next, reading operation of data will be described. By supplying an appropriate potential (reading potential) to the fifth wiring while a predetermined potential (constant potential) is supplied to the first wiring, the potential of the second wiring varies depending on the amount of electric charges held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is used to turn on the transistor 160. Thus, the potential of the fifth wiring is set to a potential $V_0$ intermediate between $V_{th\_H}$ and $V_{th\_L}$, whereby electric charge given to the gate electrode of the transistor 160 can be determined. For example, in the case where $Q_H$ is applied in writing operation, when the potential of the fifth wiring is set to $V_0$ ($>V_{th\_H}$), the transistor 160 is turned on. In the case where $Q_L$ is applied in writing operation, even when the potential of the fifth wiring is set to $V_0$ ($<V_{th\_L}$), the transistor 160 remains off. Therefore, the stored data can be read by determining the potential of the second wiring.

Note that in the case where memory cells are arrayed to be used, only data of desired memory cells should be read. When data of a predetermined memory cell is read and data of the other memory cells is not read, in the case where the transistors 160 are connected in parallel, fifth wirings in memory cells that are not a target for reading data may be supplied with a potential at which the transistors 160 are turned off regardless of the state of the gate electrodes, that is, a potential lower than $V_{th\_H}$. On the other hand, in the case where the transistors 160 are connected in series, fifth wirings may be supplied with a potential with which the transistors 160 are turned on regardless of a state of the gate electrodes, that is, a potential higher than $V_{th\_L}$.

Next, rewriting operation of data will be described. Rewriting operation of data is performed in a manner similar to that of the writing and holding of data. That is, the potential of the fourth wiring is set to a potential which allows the transistor 162 to be turned on, whereby the transistor 162 is turned on. Accordingly, the potential of the third wiring (potential related to new data) is supplied to the gate electrode of the transistor 160 and the capacitor 164. After that, the potential of the fourth wiring is set to a potential which allows the transistor 162 to be turned off, whereby the transistor 162 is turned off. Accordingly, electric charge related to new data is given to the gate electrode of the transistor 160.

In the semiconductor device according to one embodiment of the invention disclosed herein, data can be directly rewritten by another writing operation of data as described above. Therefore, extracting of electric charge from a floating gate with the use of a high voltage needed in a flash memory or the like is not necessary and thus, reduction in operation speed, which is attributed to erasing operation, can be suppressed. In other words, high-speed operation of the semiconductor device can be realized.

Note that the drain electrode (or the source electrode) of the transistor 162 is electrically connected to the gate electrode of the transistor 160, thereby having an effect similar to that of a floating gate of a floating gate type transistor used for a non-volatile memory element. In this specification, a portion which the drain electrode (or the source electrode) of the transistor 162 is electrically connected to the gate electrode of the transistor 160 is called a floating node (node FG). When the transistor 162 is turned off, the node FG can be regarded as being embedded in an insulator and electric charge is held in the node FG The off-state current of the transistor 162 including an oxide semiconductor is smaller than or equal to one hundred thousandth of the off-state current of a transistor including a silicon semiconductor or the like; thus, loss of the electric charge accumulated in the node FG due to leakage current of the transistor 162 is negligible. That is, with the transistor 162 including an oxide semiconductor, a nonvolatile memory device which can hold data without being supplied with power can be realized.

For example, when the off current of the transistor 162 is 10 zA (1 zA (zeptoampere) is $1 \times 10^{-21}$ A) or less at room temperature (25° C.) and the capacitance of the capacitor 164 is approximately 10 fF, data can be stored for $10^4$ seconds or longer. It is needless to say that the holding time depends on transistor characteristics and the capacitance.

Further, the semiconductor device according to one embodiment of the disclosed invention does not have the problem of deterioration of a gate insulating layer (a tunnel insulating film), which is a problem of a conventional floating gate transistor. That is, the problem of deterioration of a gate insulating layer due to injection of electrons into a floating gate, which has been problematic, can be solved. This means that there is no limit on the number of times of writing in principle. Furthermore, a high voltage needed for writing or erasing in a conventional floating gate transistor is not necessary.

Figures 2, 2A:
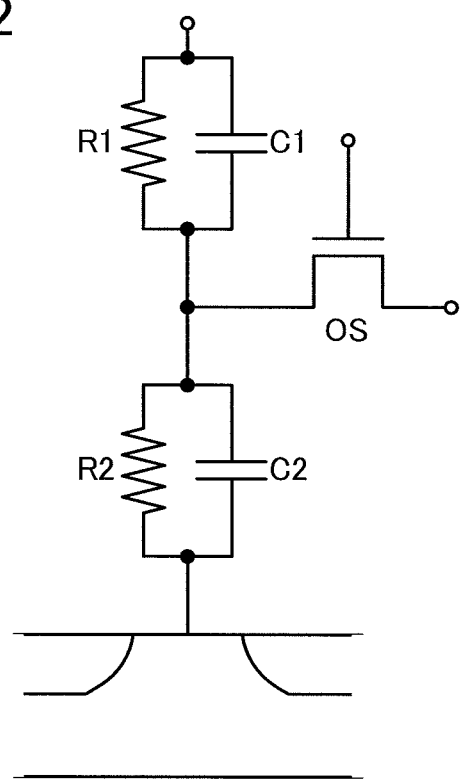

Components such as transistors in the semiconductor device illustrated in FIG. 2A-1 can be regarded as including resistors and capacitors as illustrated in FIG. 2A-2. That is, in FIG. 2A-2, the transistor 160 and the capacitor 164 are each regarded as including a resistor and a capacitor. R1 and C1 denote the resistance and the capacitance of the capacitor 164, respectively. The resistance R1 corresponds to the resistance which depends on an insulating layer included in the capacitor 164. Further, R2 and C2 denote the resistance and the capacitance of the transistor 160, respectively. The resistance R2 corresponds to the resistance which depends on a gate insulating layer at the time when the transistor 160 is turned on. The capacitance C2 corresponds to the capacitance of a so-called gate capacitance (the capacitance formed between the gate electrode and the source electrode or the drain electrode, and the capacitance formed between the gate electrode and the channel formation region).

A charge holding period (also referred to as a data holding period) is determined mainly by off-state current of the transistor 162 under the condition where gate leakage current of the transistor 162 is sufficiently small, R1 is higher than or equal to ROS (R1≥ROS), and R2 is higher than or equal to ROS (R2≥ROS), where ROS is the resistance value (also referred to as effective resistance) between the source electrode and the drain electrode at the time when the transistor 162 is in an off-state.

On the other hand, when the conditions are not met, it is difficult to sufficiently secure the holding period even if the off current of the transistor 162 is small enough. This is because a leakage current other than the off-state current of the transistor 162 (e.g., a leakage current generated between the source electrode and the gate electrode of the transistor 160) is large. Accordingly, it can be said that it is preferable that the semiconductor device disclosed in this embodiment satisfies the above relations of R1≥ROS and R2≥ROS.

On the other hand, it is desirable that C1 and C2 satisfy C1≥C2 (C1 is larger than or equal to C2). This is because by increasing C1, the potential of the fifth wiring can be effectively applied to the node FG when the potential in the node FG is controlled by the fifth wiring, and thus the difference between the potentials applied to the fifth wiring (e.g., a potential of reading and a potential of not reading) can be made small.

As described above, when the above relation is satisfied, a more favorable semiconductor device can be realized. Note that R1 and R2 are controlled by the gate insulating layer of the transistor 160 and the insulating layer of the capacitor 164. The same is applied to C1 and C2. Therefore, the material, the thickness, and the like of the gate insulating layer are desirably set as appropriate to satisfy the above relation.

In the semiconductor device described in this embodiment, the node FG operates similarly to a floating gate of a floating-gate transistor in a flash memory or the like, but the node FG in this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of an adjacent cell. This is one of inhibiting factors for high integration of the semiconductor device. The factor is attributed to a basic principle of a flash memory, in which a tunneling current flows in applying a high electric field.

In contrast, the semiconductor device according to this embodiment is operated by switching of a transistor including an oxide semiconductor and does not use the above-described principle of electric charge injection by tunneling current. That is, a high electric field for electric charge injection is not necessary, unlike a flash memory. Accordingly, it is not necessary to consider an influence of a high electric field from a control gate on an adjacent cell, which facilitates high integration.

In addition, it is also advantageous that a high electric field is unnecessary and a large peripheral circuit (such as a booster circuit) is unnecessary, over a flash memory. For example, the highest voltage applied to the memory cell according to this embodiment (the difference between the highest potential and the lowest potential applied to the terminals of the memory cell at the same time) can be 5 V or lower, preferably 3 V or lower in a memory cell in the case where two levels (one bit) of data are written.

In the case where the dielectric constant ∈r1 of the insulating layer included in the capacitor 164 is different from the dielectric constant ∈r2 of the insulating layer included in the transistor 160, C1 can easily be made greater than or equal to C2 (C1≥C2) while S1 that is the area of the insulating layer included in the capacitor 164 and S2 that is the area of an insulating layer forming gate capacitance of the transistor 160 satisfy the relation where 2·S2 is greater than or equal to S1 (2·S2≥S1), (desirably S2 is greater than or equal to S1 (S2≥S1)). That is, it is easy to satisfy C1≥C2 while the area of the insulating layer included in the capacitor 164 is small. Specifically, for example, a film formed of a high-k material such as hafnium oxide or a stacked-layer structure of a film formed of a high-k material such as hafnium oxide and a film formed of an oxide semiconductor is used for the insulating layer included in the capacitor 164 so that ∈r1 can be set to 10 or more, preferably 15 or more, and silicon oxide is used for the insulating layer forming the gate capacitance of the transistor 160 so that ∈r2 can be set to 3 to 4.

Combination of such structures enables higher integration of the semiconductor device according to one embodiment of the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to that in the case where two-level (one-bit) data is written. The multilevel technique can be achieved by, for example, giving charge Q, which is different from the charge $Q_L$ for supplying a low potential and the charge $Q_H$ for supplying a high potential, to the gate electrode of the first transistor, in addition to the charge $Q_L$ and the charge $Q_H$. In that case, enough storage capacity can be ensured even in a circuit configuration with a relatively large scale.

Next, a more specific circuit configuration to which the circuit illustrated in FIGS. 2A-1, 2A-2, and 2B is applied and an operation thereof will be described with reference to FIG. 1, FIG. 3, FIG. 4, FIG. 5, FIG. 6, FIG. 7, and FIG. 8.

FIG. 1 is an example of a circuit diagram of a semiconductor device including m (rows) (in a vertical direction)×n (columns) (in a horizontal direction) memory cells 190. The configuration of the memory cells 190 in FIG. 1 is similar to that in FIG. 2A-1. That is, the first wiring in FIG. 2A-1 corresponds to a bit line BL in FIG. 1; the second wiring in FIG. 2A-1, a source line SL in FIG. 1; the third wiring in FIG. 2A-1, the first signal line S1 in FIG. 1; the fourth wiring in FIG. 2A-1, the second signal line S2 in FIG. 1; and the fifth wiring in FIG. 2A-1, a word line WL in FIG. 1. Note that in FIG. 1, the transistors 160 in the memory cells 190 are connected in series in the column direction. Thus, only the memory cells 190 in the first row are connected to the bit lines BL without other memory cells 190 interposed therebetween, and only the memory cells 190 in the m-th row are connected to the source line SL without other memory cells 190 interposed therebetween. The memory cells 190 in the other rows are electrically connected to the bit lines BL and the source line SL through other memory cells 190 of the same columns.

The semiconductor device illustrated in FIG. 1 includes m (m is an integer greater than or equal to 2) word lines WL; n (n is an integer greater than or equal to 2) bit lines BL; the first signal lines S1; n second signal lines S2; a memory cell array having the memory cells 190 arranged in a matrix of m (rows) (in the vertical direction)×n (columns) (in the horizontal direction); a source line SL; a selection line G_1 and a selection line G_2; n selection transistors 180 which are arranged along the selection line G_1 and between the bit lines BL and the memory cells 190 in the first row and gate electrodes of which are electrically connected to the selection line G_1; and n selection transistors 182 which are arranged along the selection line G_2 and between the memory cells 190 in the m-th row and the source line SL and gate electrodes of which are electrically connected to the selection line G_2.

That is, the bit lines BL are electrically connected to the drain electrodes of the transistors 160 in the memory cells 190 in the first row via the selection transistors 180. Further, the source line SL is electrically connected to the source electrodes of the transistors 160 in the memory cells 190 in the m-th row via the selection transistors 182. The first signal line S1 is electrically connected to the drain electrodes of all of the transistors, the signal line S2_k in the k-th column (k is a natural number of from 1 to n) is electrically connected to the gate electrodes of the transistors 162 in the memory cells 190 in the k-th column. The word line WL in the k-th row is electrically connected to electrodes on one side of the capacitors 164 in the memory cells 190 in the k-th row.

Further, the second signal lines S2 are parallel to the bit lines, and are electrically connected to the transistors 162 in the adjacent memory cells 190.

The node FG in each of the memory cells 190 in the k-th row of the semiconductor device illustrated in FIG. 1 is the same as the structure illustrated in FIG. 2A-1. Here, the transistors 162 including an oxide semiconductor have significantly small off-state current in the k-th row, in the memory cells 190 in the semiconductor device illustrated in FIG. 1, the potentials of the nodes FG can be held for a long time by turning off the transistors 162 as in the semiconductor device illustrated in FIG. 2A-1.

Further, the gate electrodes of the transistors 162 in the memory cells 190 are electrically connected to the second signal line S2, which is parallel to the bit line, and thereby a writing operation using voltage given to the capacitor 164 is possible. Therefore, also in the case where multilevel data is written in the memory cell 190, the peripheral circuit such as the circuit which controls writing voltage can be omitted, because voltage applied to the drain electrodes of the transistors 162 are not necessary to be changed corresponding to writing data.

Figure 3:
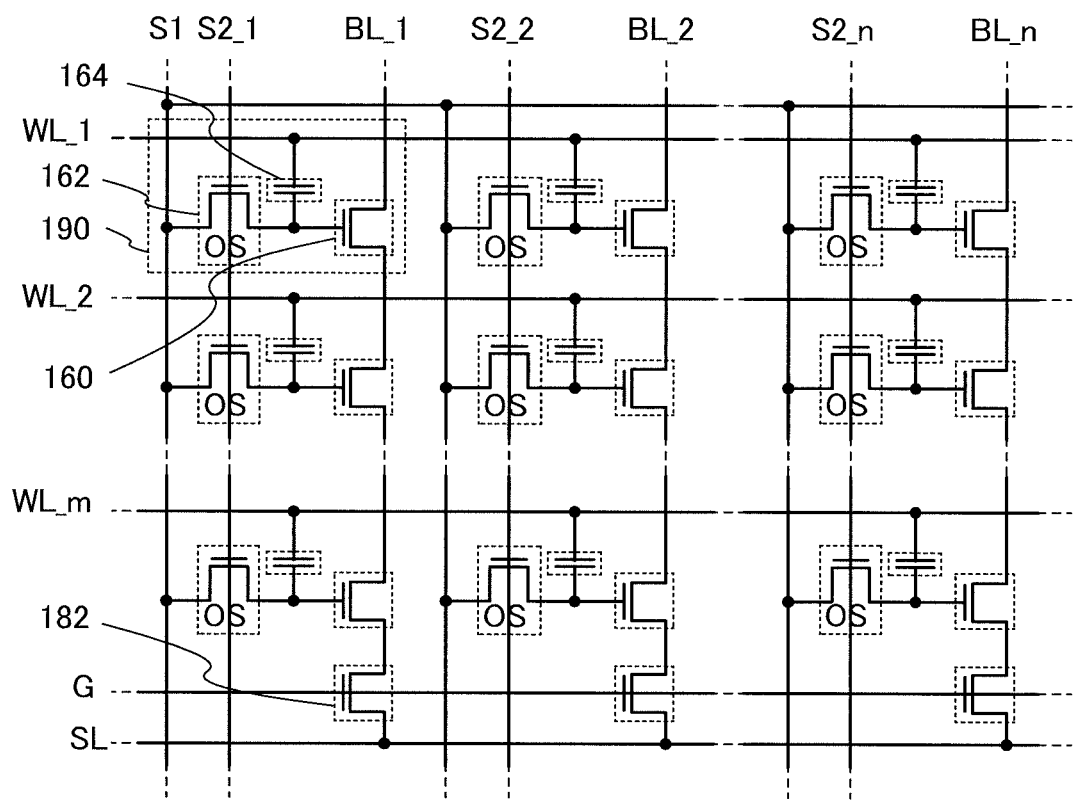
FIG. 3 is a circuit diagram of a semiconductor device.

Note that the selection line G_1, the selection line G_2, the selection transistors 180, and the selection transistors 182 are not necessarily provided. The selection line G_1 and the selection transistors 180 may be omitted. Alternatively, the selection line G_2 and the transistors 182 may be omitted. For example, as illustrated in FIG. 3, a structure may be employed in which a selection line G corresponding to the selection line G_2 and the selection transistors 182 alone are provided.

Figure 4:
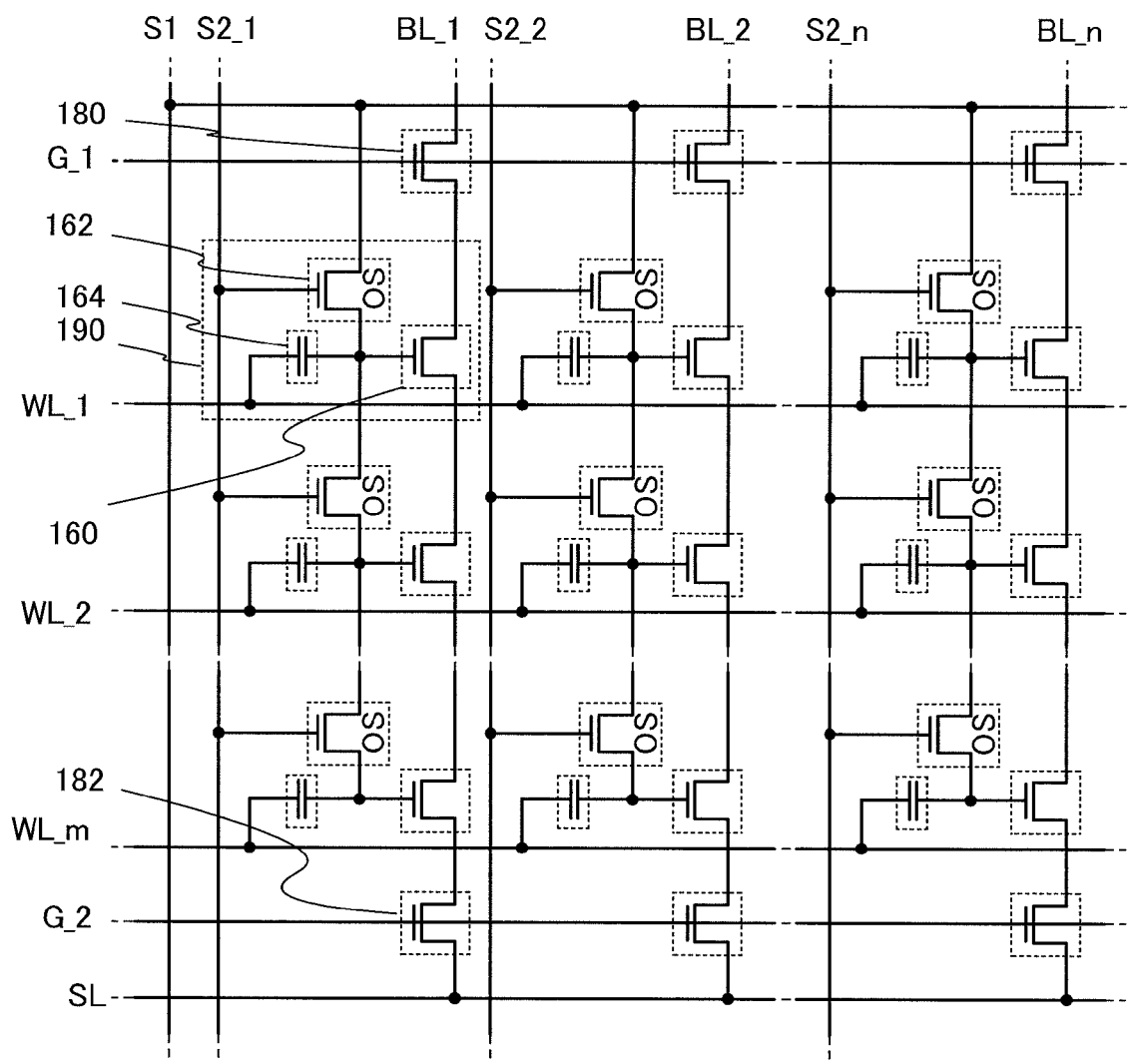
FIG. 4 is a circuit diagram of a semiconductor device.

Moreover, as illustrated in FIG. 4, the source electrode of the transistor 162 in a memory cell 190 and the drain electrode of the transistor 162 in the adjacent memory cell 190 thereto may be connected in series. Note that the selection line G_1, the selection line G_2, the selection transistors 180, and the selection transistors 182 are not necessarily provided. The selection line G_1 and the selection transistors 180 may be omitted. Alternatively, the selection line G_2 and the transistors 182 may be omitted. For example, as illustrated in FIG. 5, a structure may be employed in which a selection line G corresponding to the selection line G_2 and the selection transistors 182 alone are provided.

Figure 5:
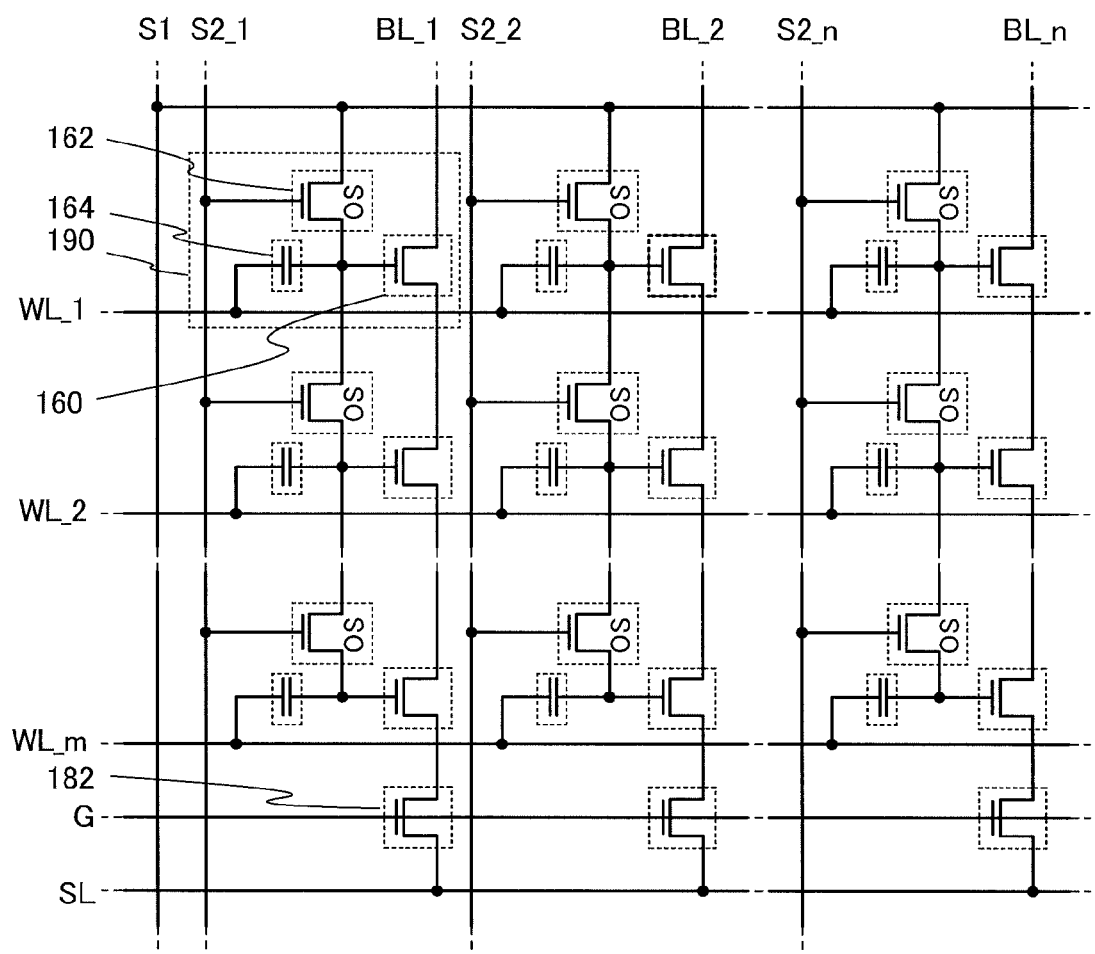
FIG. 5 is a circuit diagram of a semiconductor device.

Data writing, holding, and reading operations in the semiconductor device illustrated in FIG. 5 basically similar to those in the case of FIG. 2. Note that data writing is conducted on each column. This is because a gate electrode of a transistor 162 in a memory cell 190 is connected to a gate electrode of a transistor 162 in the adjacent memory cell 190 by a second signal line S2 and thus it is difficult to conduct writing operation on each memory cell 190. As an example of specific writing operation, an example in which any of potentials V1, V2, V3, and a reference potential GND (VDD>V3>V2>V1>GND=0V) is given to a node FG is explained; however the relation in the potentials given to the nodes FG is not limited to the example. Data that is held when the potentials V1, V2, and V3 are given to the node FG is referred to as data "1" "2", and "3" respectively, and data that is held when the reference potential GND is given to the node FG is referred to as data "0".

First, a potential is given to capacitors 164 in the memory cells 190 of a column into which data is written, in accordance with data to be written. A potential V4 (sufficiently high potential, e.g., VDD) is given to the second signal line S2 of the same column so that transistors 162 of the memory cells 190 to which data is written are turned on, and thereby data is written. Note that a writing voltage to be used for supplying an electric charge to nodes FG via the transistors 162 from the signal line S1 is referred to as Von. Here, Von is a voltage much higher than threshold voltages of selection transistor 182 connected to the bit line.

When data "0" is written into the memory cell 190, Von is given to the capacitor 164. When data "1" is written into the memory cell 190, −(V1−Von) is given to the capacitor 164. When data "2" is written into the memory cell 190, −(V2−Von) is given to the capacitor 164. When data "3" is written into the memory cell 190, −(V3−Von) is given to the capacitor 164. At this time, whichever voltage is applied to the capacitor 164, the voltage Von is applied to the node FG at the time of writing.

In this case, when data "1" is written, GND is given to the capacitor 164 for the data writing, and thereby the peripheral circuit can be more simplified. In other words, by employing V1=Von, the number of voltages to be adjusted is decreased by one, and thereby the peripheral circuit can be more simplified.

Data holding operation is conducted as follows: the potential of the second signal line S2 connected to the memory cells 190 that are targets for holding data is set to GND. When the potential of the signal line S2 is fixed to GND, the potential of the nodes FG is fixed to the potential at the time of writing. In other words, in the memory cells 190 in which data is written, the potential of the nodes FG is Von in the state where a potential in accordance with data to be written is given to the capacitors 164. Thus, after the potential Von is given to the nodes FG and thus the nodes FG are in a floating state, the potential of the capacitors 164 is turned into GND. At this time, the potential of the node FG in the memory cell 190 in which data "1" is written is V1, the potential of the node FG in the memory cell 190 in which data "2" is written is V2, the potential of the node FG in the memory cell 190 in which data "3" is written is V3, and the potential of the node FG in the memory cell 190 in which data "0" is written is the reference potential GND.

Because GND is supplied to the signal line S2, the transistor 162 is turned off even when any of data "0", data "1", data "2", and data "3" is written. Since the off-state current of the transistor 162 is significantly small, the electric charge of the gate electrode of the transistor 160 is held for a long time. In this manner, writing into an arbitrary column is completed.

Data reading operation is conducted as follows: the potential of the word line WL connected to the memory cells 190 that are targets for reading data is set to any one of GND, −(V1−Von), and −(V2−Von), and the potential of the word lines WL connected to the memory cells 190 that are not targets for reading data is set to Von, and the potentials of the selection line G_1 and the selection line G_2 are set to V4.

When the potential of the word line WL connected to the memory cells 190 that are targets for reading data is set to GND, the transistors 160 are turned on when any of data "1", data "2", and data "3" is supplied to the nodes FG of the memory cells 190 that are targets for reading data. On the other hand, the transistor 160 is turned off when GND for data "0" is supplied to the node FG.

Similarly, when the potential of the word line WL connected to the memory cells 190 that are targets for reading data is −(V1−Von) and data "2" or data "3" is given to the nodes FG of the memory cells 190 that are targets for reading data, the transistors 160 are turned on. On the other hand, when the potential of the word line WL connected to the memory cells 190 for reading operation is −(V1−Von) and data "0" or data "1" is given to the nodes FG of the memory cells 190 for reading operation, the transistors 160 are turned off. In addition, when the potential of the word line WL connected to the memory cells 190 that are targets for reading data is −(V2−Von) and data "3" is given to the nodes FG of the memory cells 190 for reading operation, the transistors 160 are turned on. On the other hand, when the potential of the word line WL connected to the memory cells 190 that are targets for reading data is −(V2−Von) and data "0", data "1", or data "2" is given to the nodes FG of the memory cells 190 that are targets for reading data, the transistors 160 are turned off.

When the potential of the word line WL connected to the memory cells 190 from which data is not to be read is set to Von, in a case where data "0" is written in the memory cells 190 that are not targets for reading data and in a case where any of data "1", data "2", and data "3" is written in the memory cells 190 that are not targets for reading data, the transistors 160 are turned on in any case.

Note that in the configuration illustrated in FIG. 1, writing cannot be conducted on each arbitrary memory cell 190, and thus re-writing should be conducted per column. The reason for that is the same as that for the case where writing is conducted per column. In other words, because a gate electrode of a transistor 162 in a certain memory cell 190 is connected to a gate electrode of a transistor 162 in the adjacent memory cell 190 by the second signal line S2, re-writing to each memory cell 190 is difficult.

Figure 6:
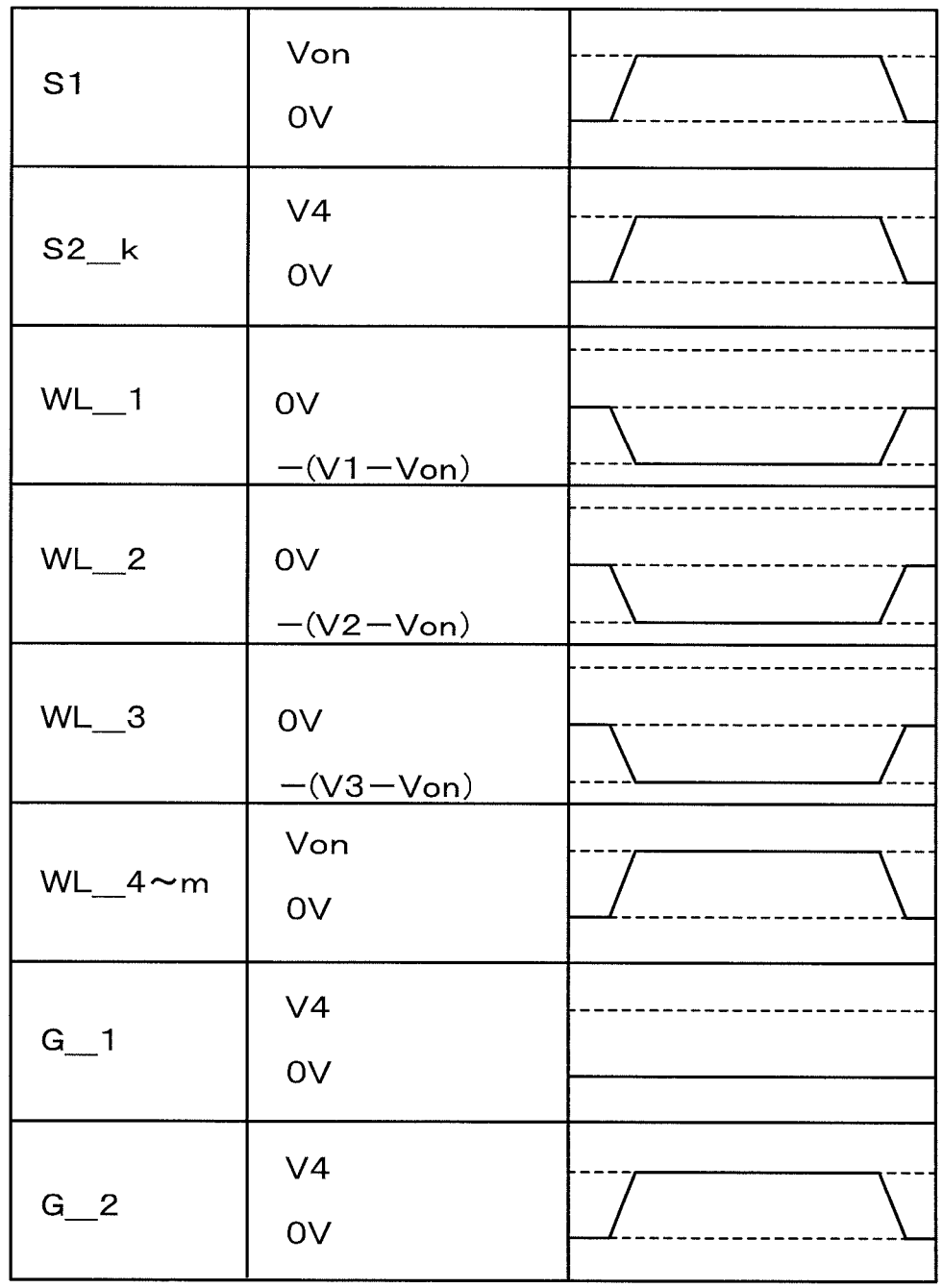
FIG. 6 is a timing chart.
Figure 7:
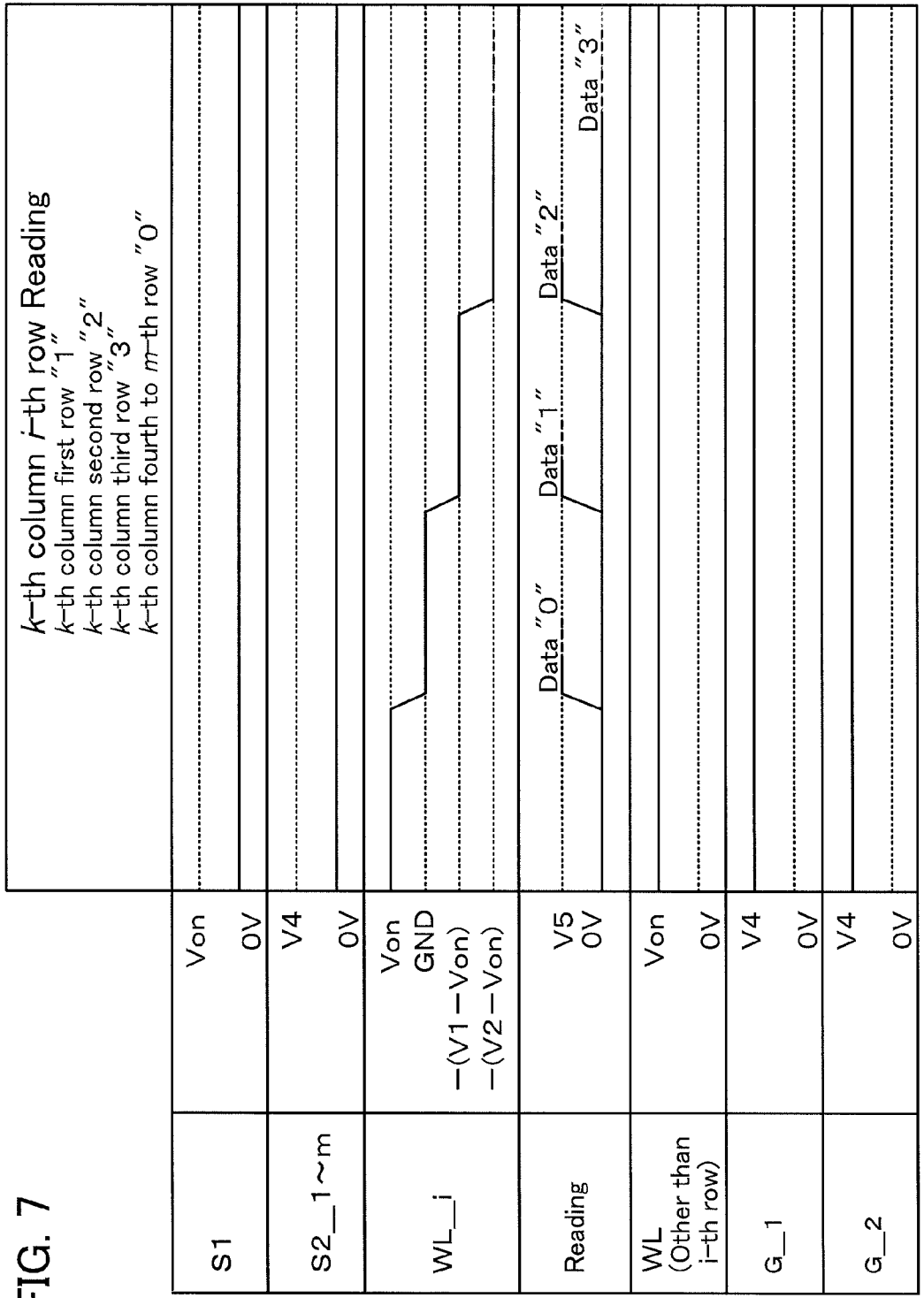
FIG. 7 is a timing chart.

FIG. 6 and FIG. 7 are examples of timing charts for more detailed operations of the semiconductor device in FIG. 1. S, BL, and the like in the timing charts denote the wirings to which the potentials shown in the timing chart are applied. Wirings having similar functions are distinguished by "_1", "_2", and the like added to the end of their names.

The timing chart in FIG. 6 shows the relation among the potentials of the wirings in the case where data "1" is written to a first row of an arbitrary memory cell column (k-th column), data "2" is written to a second row of the arbitrary memory cell column (k-th column), data "3" is written to a third row of the desired memory cell column (k-th column), and data "0" is written to a fourth row to an m-th row of the arbitrary memory cell column (k-th column). The timing chart in FIG. 7 shows the relation among the potentials of the wirings in the case where, after the writing operation, data written in an arbitrary i-th row (i is a natural number of from 1 to m) is read out. Note that in FIG. 7, V5 is a potential applied to BL at the time of reading.

In the writing operation, in accordance with data to be written in each memory cell 190 in a memory cell column to which data is to be written, a potential corresponding to the data is given to the capacitors 164 from the WL, and V4 is given to S2, so that all transistors 162 of the memory cell column to which data is to be written are turned on and Von is given to S1 so that the nodes FG of all of the memory cells 190 to which data is to be written are Von.

Figure 8:
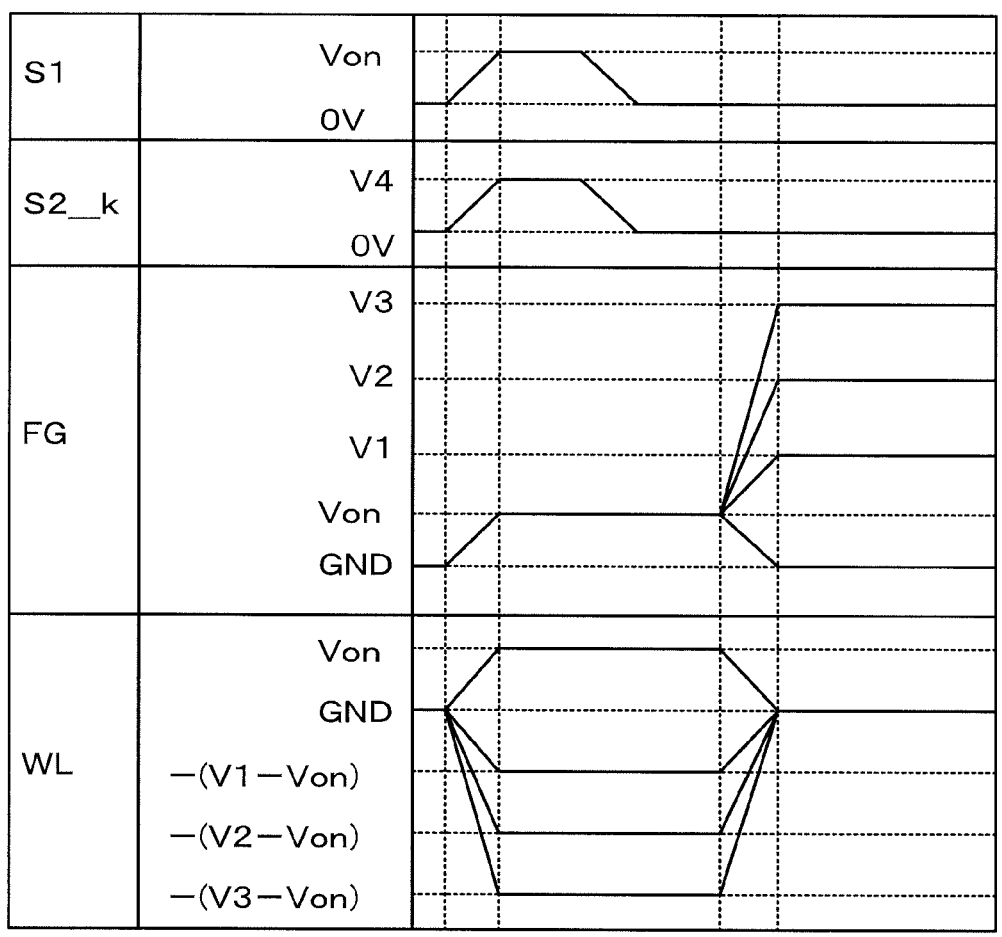
FIG. 8 is a timing chart.

After that, the potential given to the capacitors 164 from WL is set to GND so that the potentials of the nodes FG are adjusted. The relation of the potentials of the wirings at this time is shown in FIG. 8. In other words, in accordance with GND given to the capacitors 164 after writing, the potential of the first row on the k-th column is shifted into V1 and thus data "1" is written. In the same manner, the potential of the second row on the k-th column is shifted into V2 and thus data "2" is written, the potential of the third row on the k-th column is shifted into V3 and thus data "3" is written, the potential of the fourth row to the m-th row on the k-th column is shifted into GND and thus data "0" is written.

Note that in the semiconductor device described in this embodiment, when data is written to the memory cells 190 in the k-th row (k is a natural number of from 1 to m), the transistors 162 in the same column should be turned on; therefore, data should be written to the memory cell array per column.

In the reading operation, the voltage supplied to the capacitors 164 at the writing operation is used alone, and the reading operation can be completed.

When data reading is performed in the i-th row, S2_1 to S2_m are set to GND so that all the transistors 162 are turned off, and the selection line G_1 and the selection line G_2 are supplied with the potential V4 so that the selection transistors 180 and the selection transistors 182 are turned on. In addition, to WL_i connected to the memory cells 190 of the i-th row as reading target, GND, −(V1−Von), and −(V2−Von) are sequentially supplied, and the potential of the nodes FG, i.e., written data at each of GND, −(V1−Von), and −(V2−Von) is identified based on conductance state of BL. Note that the potential Von is given to the WL connected to the memory cells 190 that is not target for reading data.

In the case where a configuration is employed in which one of the pairs of the selection line G_1 and the selection transistor 180 or the selection line G_2 and the selection transistor 182 is omitted and only the selection line G corresponding to the selection line G_2 and the selection transistors 182 are provided as illustrated in FIG. 3 and FIG. 5, data writing, data holding, data reading, and data erasing at one time can also be performed basically in the same manner as in the above operations.

Since the off-state current of the transistor including an oxide semiconductor is extremely small in the semiconductor device described in this embodiment, stored data can be held for an extremely long period owing to such a transistor. In other words, power consumption can be adequately suppressed because refresh operation becomes unnecessary or the frequency of refresh operations can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing, which is a problem in a conventional nonvolatile memory, and thus reliability thereof is drastically improved. Furthermore, data is written depending on the on state or the off state of the transistor, whereby high-speed operation can be easily realized. In addition, there is an advantage that there is no need of operation for erasing data.

Since a transistor including a material other than an oxide semiconductor can operate at sufficiently high speed, a semiconductor device can perform operation (e.g., reading data) at sufficiently high speed in combination of the transistor with a transistor including an oxide semiconductor. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both a transistor including a material other than an oxide semiconductor (a transistor capable of operation at a sufficiently high speed, in a wider sense) and a transistor including an oxide semiconductor (a transistor whose off-state current is sufficiently low, in a wider sense).

In addition, in the semiconductor device in this embodiment, a signal line for controlling on/off of a writing transistor and a bit line are disposed in parallel. When data of more levels than 2 (multilevel) is written to be stored, the potential of a capacitor of a memory cell is shifted in accordance with writing data (the potential of the word line WL is shifted), so that multilevel data can be written into the node FG with one potential for data writing. In conventional art, for writing of multilevel data, potentials for respective levels are needed; however, in this embodiment, one potential is enough for writing of multilevel data. Therefore, conventional circuits for producing potentials for multilevel are not needed, and thereby the peripheral circuit can be simplified so that the memory itself can be downsized.

The configuration, structure, method and the like described in this embodiment can be combined with any of the configurations, structures, methods and the like of the other embodiments as appropriate.

(Embodiment 2)

In this embodiment, a structure and a manufacturing method of a semiconductor device according to one embodiment of the disclosed invention will be described with reference to FIG. 5 and FIGS. 9A and 9B, FIGS. 10A to 10D, FIGS. 11A to 11D, FIGS. 12A to 12D, and FIGS. 13A to 13C.

Figure 9A:
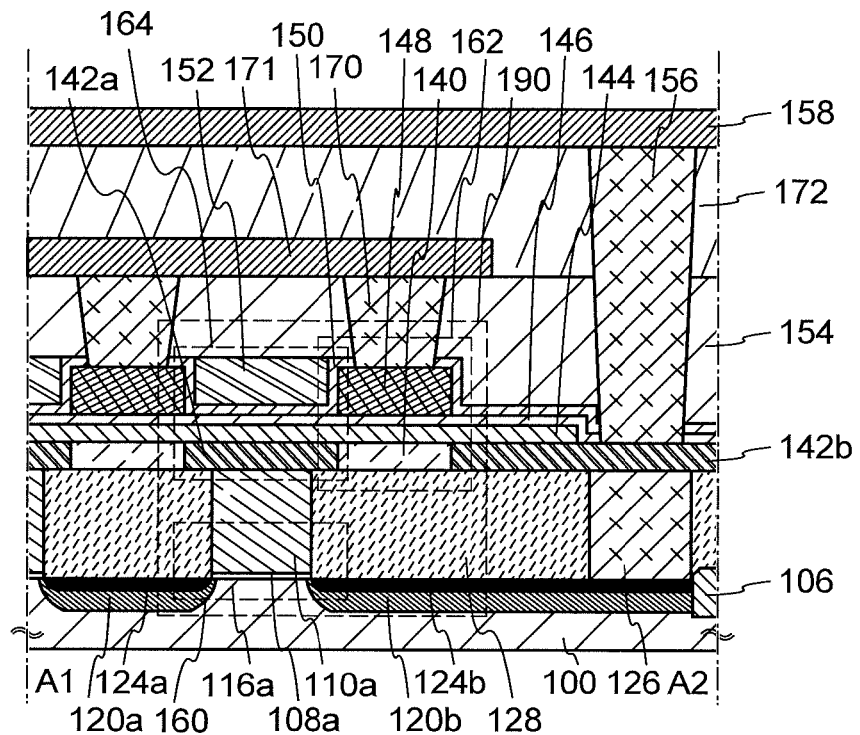
FIGS. 9A and 9B are a cross-sectional view and a plan view of a semiconductor device respectively.
Figure 9B:
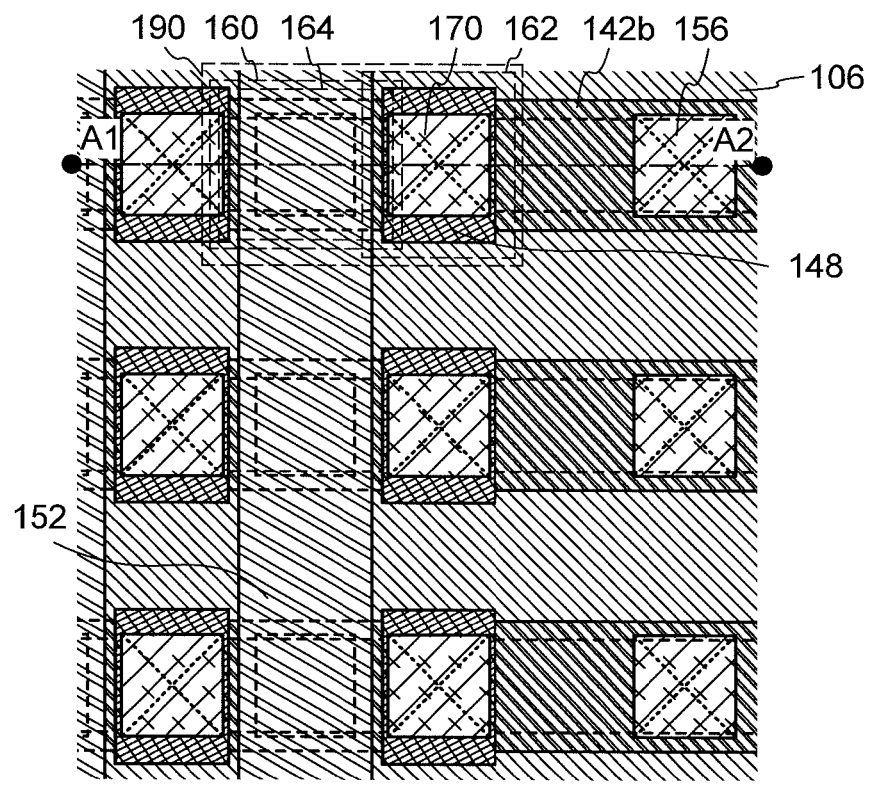

FIGS. 9A and 9B show an example of a structure of the memory cell 190 of the semiconductor device illustrated in the circuit diagram of FIG. 5. FIG. 9A illustrates a cross section of the semiconductor device, and FIG. 9B illustrates a plan view of the semiconductor device. Note that, in the plan view illustrated in FIG. 9B, the drawing is simplified without the insulating layer 154, the insulating layer 172, the wiring 171 and the wiring 158 illustrated. Here, in FIG. 9A, the direction parallel to the line A1-A2 of FIG. 9B corresponds to the column direction in the circuit diagram of FIG. 5, and the direction perpendicular to the line A1-A2 of FIG. 9B corresponds to the row direction in the circuit diagram of FIG. 5. The semiconductor device illustrated in FIGS. 9A and 9B includes, in a lower portion, a transistor 160 including a first semiconductor material, and in an upper portion, a transistor 162 including a second semiconductor material. Note that although the transistor 160 and the transistor 162 in the first row are illustrated in FIGS. 9A and 9B, as for the transistors 160 in the first to m-th rows, a source electrode (source region) of a transistor 160 and a drain electrode (drain region) of an adjacent transistor 160 are connected in series, and also as for the transistors 162 in the first to m-th rows, a source electrode (source region) of a transistor 162 and a drain electrode (drain region) of an adjacent transistor 162 are connected in series as illustrated in the circuit diagram of FIG. 5.

Here, the first semiconductor material is preferably different from the second semiconductor material. For example, the first semiconductor material may be a semiconductor material (e.g., silicon) other than an oxide semiconductor and the second semiconductor material may be an oxide semiconductor. A transistor using a material other than an oxide semiconductor can operate at high speed easily. On the other hand, a transistor using an oxide semiconductor can hold electric charges for a long time owing to its characteristics.

Although all the transistors are n-channel transistors here, it is needless to say that p-channel transistors can be used. The technical feature of the disclosed invention lies in the use of a semiconductor material with which off-state current can be sufficiently reduced, such as an oxide semiconductor, for the transistor 162 in order to hold data. Therefore, it is not necessary to limit specific conditions, such as a material, a structure, or the like of the semiconductor device, to those given here.

The transistor 160 in FIGS. 9A and 9B includes a channel formation region 116a provided in a substrate 100 including a semiconductor material (such as silicon), an impurity region 120a and an impurity region 120b provided such that the channel formation region 116a is sandwiched therebetween, a metal compound region 124a and a metal compound region 124b in contact with the impurity region 120a and the impurity region 120b, a gate insulating layer 108a provided over the channel formation region 116a, and a gate electrode 110a provided over the gate insulating layer 108a. Note that a transistor, a source electrode and a drain electrode of which are not illustrated in a drawing, may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region and the term "drain electrode" may include a drain region.

Here, the transistors 160 in the first to m-th rows share the impurity regions 120 and the metal compound regions 124 functioning as source regions and drain regions with each other, and thus are connected in series. That is, the impurity region 120 and the metal compound region 124 functioning as a source region of the transistor 160 in the (l−1)-th row (l is a natural number from 2 to m) also function as a drain region of the transistor 160 in the l-th row. In this manner, the transistors 160 in the memory cells 190 are connected in series, whereby the source regions and the drain regions can be shared by the transistors 160 in the adjacent memory cells 190. Therefore, the planar layout of the transistor 160 can easily overlap with the planar layout of the transistor 162 which is described later; thus, the area occupied by the memory cell 190 can be reduced.

An element isolation insulating layer 106 is provided over the substrate 100 to surround the transistor 160. An insulating layer 128 is provided to cover the transistor 160. Note that in order to realize higher integration, the transistor 160 preferably has a structure without a sidewall insulating layer as illustrated in FIGS. 9A and 9B. On the other hand, when the characteristics of the transistor 160 have priority, the sidewall insulating layer may be formed on a side surface of the gate electrode 110 and the impurity region 120 may include regions having different impurity concentrations.

Here, the insulating layer 128 preferably has a surface with favorable planarity; for example, the surface of the insulating layer 128 preferably has a root-mean-square (RMS) roughness of 1 nm or less.

The transistor 162 in FIGS. 9A and 9B includes a source electrode 142a and a drain electrode 142b which are embedded in an insulating layer 140 formed over the insulating layer 128; an oxide semiconductor layer 144 in contact with part of the insulating layer 140, the source electrode 142a, and the drain electrode 142b; a gate insulating layer 146 covering the oxide semiconductor layer 144; and a gate electrode 148 provided over the gate insulating layer 146 so as to overlap with the oxide semiconductor layer 144. The sidewall insulating layer may be formed on a side surface of the gate electrode 148. Note that the gate electrode 148 functions as the signal line S2 in the circuit diagram of FIG. 5.

Here, the oxide semiconductor layer 144 is preferably an oxide semiconductor layer from which an impurity such as hydrogen is sufficiently removed. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the above-described oxide semiconductor layer 144 is measured by secondary ion mass spectrometry (SIMS).

Note that a region which is part of a surface of the insulating layer 140 and in contact with the oxide semiconductor layer 144 preferably has a root-mean-square (RMS) roughness of 1 nm or less. In this manner, a channel formation region of the transistor 162 is provided in the extremely flat region having a root-mean-square (RMS) roughness of 1 nm or less, whereby the transistor 162 which can prevent a malfunction such as a short-channel effect and has favorable characteristics can be provided even when the transistor 162 is miniaturized.

The transistors 162 in the first to m-th rows share the source electrodes 142a and the drain electrodes 142b with each other, and thus are connected in series. That is, the source electrode 142a of the transistor 162 in the (l-1)-th row (l is a natural number from 2 to m) and the drain electrode 142b of the transistor 162 in the l-th row are formed of the same conductive layer.

In this manner, the transistors 162 in the memory cells 190 are connected in series, whereby the source electrodes 142a and the drain electrodes 142b of the transistors 162 in the adjacent memory cells 190 can be shared. Thus, only one of the source electrode 142a and the drain electrode 142b of the transistor 162 is included in the planar layout of the memory cell 190. That is, the length in the column direction in the planar layout of the memory cell 190 can be approximately equal to the length in the column direction in the gate electrode 148 and the source electrode 142a On the other hand, in the case where the transistors 162 of the memory cells 190 are connected in parallel and the source electrode 142a and the drain electrode 142b are provided for each of the transistors 162 in the memory cells 190, both the source electrode 142a and the drain electrode 142b of the transistor 162 are included in the planar layout of the memory cell 190.

Therefore, the structure illustrated in FIGS. 9A and 9B is employed as illustrated the planar layout of the memory cell 190, whereby the area occupied by the memory cell 190 can be reduced. For example, when F is used to express the minimum feature size, the area occupied by the memory cell 190 can be 4 F$^2$ to 12 F$^2$ (F can be the minimum feature size). Accordingly, the degree of integration of the semiconductor device can be enhanced, and the storage capacity per unit area can be increased.

The capacitor 164 in FIGS. 9A and 9B includes the source electrode 142a; the oxide semiconductor layer 144; the gate insulating layer 146; and an insulating layer 150 and an electrode 152 over the gate insulating layer 146. That is, the source electrode 142a functions as one electrode of the capacitor 164, and the electrode 152 functions as the other electrode of the capacitor 164. Here, one electrode of the capacitor 164 in the (l-1)-th row (l is a natural number from 2 to m) is the source electrode 142a of the transistor 162 in the (l-1)-th row (l is a natural number from 2 to m); therefore, the planar layout of the capacitor 164 can easily overlap with the planar layout of the transistor 162, and the area occupied by the memory cell 190 can be reduced. In addition, in the case of forming the electrode 152 on the insulating layer 150, the area of the electrode 152 can be increased more easily in a range of overlapping with the planar layout of the transistor 162 than the case of forming the electrode 152 and the gate electrode 148 with the same layer. Note that the electrode 152 functions as the word line WL in the circuit diagram of FIG. 5.

The insulating layer 150 is provided over the transistor 162, and an insulating layer 154 is provided over the insulating layer 150 and the electrode 152 of the capacitor 164. An opening that reaches the gate electrode 148 is formed in the insulating layer 150 and the insulating layer 154, and the electrode 170 is formed in the opening. By forming the wiring 171 so as to be in contact with the electrode 170 formed to be embedded in the insulating layer 154, over the insulating layer 154, the gate electrode 148 is electrically connected to the wiring 171. The insulating layer 172 is provided over the insulating layer 154 and the wiring 171.

In an opening formed in the gate insulating layer 146, the insulating layer 150, the insulating layer 154, and the insulating layer 172, an electrode 156 is provided. Over the insulating layer 154, the wiring 158 connected to the electrode 156 is formed. The wiring 158 and the metal compound region 124b functioning as a drain region of the transistor 160 are electrically connected to each other through the electrode 156 provided in the opening foamed in the gate insulating layer 146, the insulating layer 150, the insulating layer 154, and the insulating layer 172; the drain electrode 142b embedded in the insulating layer 140; and the electrode 126 embedded in the insulating layer 128. Here, the wiring 158 functions as the bit line BL in the circuit diagram of FIG. 5.

With the above structure, in the planar layout of the memory cell 190 including the transistor 160, the transistor 162, and the capacitor 164, the length in the row direction can be approximately equal to the width of the wiring 158, the length in the column direction can be approximately equal to the length of the gate electrode 148 and the source electrode 142a. When such a planar layout is employed, the degree of integration of the circuit in FIG. 5 can be enhanced. For example, when F is used to express the minimum feature size, the area occupied by a memory cell can be expressed as 4 F$^2$ to 12 F$^2$. Accordingly, the storage capacity per unit area of the semiconductor device can be increased.

Note that the structure of a semiconductor device according to one embodiment of the disclosed invention is not limited to that illustrated in FIG. 9A and FIG. 9B. Since the technical spirit of one embodiment of the disclosed invention is formation of a stacked-layer structure formed using an oxide semiconductor and a material other than an oxide semiconductor, details such as connection of an electrode or the like can be modified as appropriate.

Next, an example of a method for manufacturing the above-described semiconductor device will be described. First, a method for manufacturing the transistor 160 in the lower portion will be described below with reference to FIGS. 10A to 10D and FIGS. 11A to 11D; then, a method for manufacturing the transistor 162 in the upper portion and the capacitor 164 will be described with reference to FIGS. 12A to 12D and FIGS. 13A to 13C.

Figure 10A:
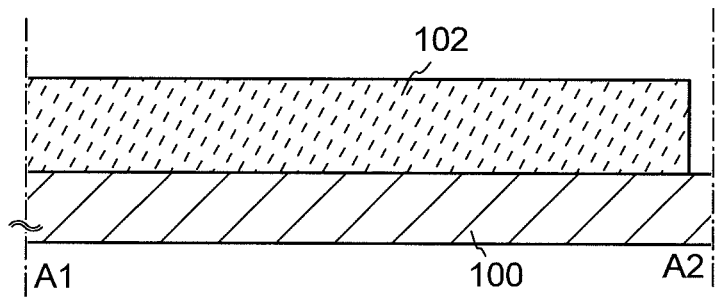
FIGS. 10A to 10D are cross-sectional views of a manufacturing process of a semiconductor device.
Figure 10B:
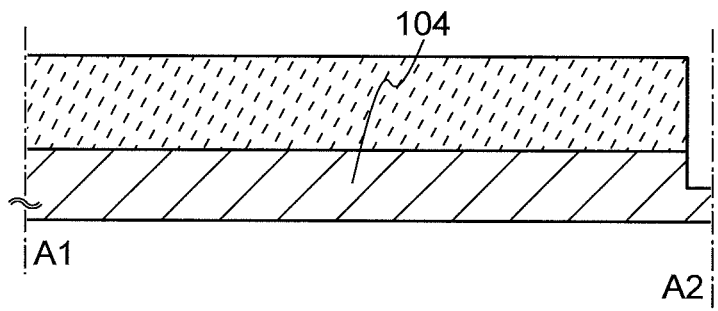

First, the substrate 100 including a semiconductor material is prepared (see FIG. 10A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, however, the term "SOI substrate" also includes a substrate where a semiconductor layer formed using a material other than silicon is provided over an insulating surface in its category. That is, the semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

A single crystal semiconductor substrate of silicon or the like is particularly preferably used as the substrate 100 including a semiconductor material, in which case the speed of reading operation of the semiconductor device can be increased.

In order to control the threshold voltage of the transistor, an impurity element may be added to regions which later function as the channel formation region 116a of the transistor 160 and the channel formation region 116b of the selection transistor 180 (not illustrated in FIG. 9 to FIG. 13, see FIG. 5) Here, an impurity element imparting conductivity is added so that the threshold voltage of the transistor 160 and the threshold voltage of the selection transistor 180 (not illustrated in FIG. 9 to FIG. 13, see FIG. 5) become positive. When the semiconductor material is silicon, the impurity imparting conductivity may be boron, aluminum, gallium, or the like. Note that it is preferable to perform heat treatment after adding an impurity element, in order to activate the impurity element or reduce defects which may be generated during addition of the impurity element.

A protective layer 102 serving as a mask for forming an element isolation insulating layer is formed over the substrate 100 (see FIG. 10A). As the protective layer 102, for example, an insulating layer formed using silicon oxide, silicon nitride, silicon oxynitride or the like can be used.

Next, part of the substrate 100 in a region that is not covered with the protective layer 102 (in an exposed region) is removed by etching with the use of the protective layer 102 as a mask. Thus, a semiconductor region 104 which is separated from another semiconductor region is formed (see FIG. 10B). As the etching, dry etching is preferably performed, but wet etching can be employed. An etching gas and an etchant can be selected as appropriate depending on a material to be etched.

Figure 10C:
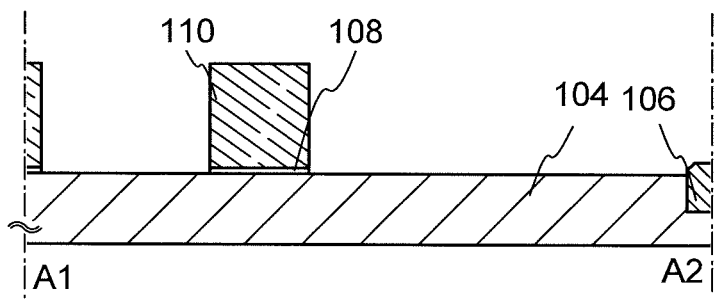

Then, an insulating layer is formed so as to cover the semiconductor region 104, and the insulating layer in a region overlapping with the semiconductor region 104 is selectively removed; thus, the element isolation insulating layer 106 is formed (see FIG. 10C). The insulating layer is formed using silicon oxide, silicon nitride, silicon oxynitride or the like. As a method for removing the insulating layer, any of polishing treatment such as chemical mechanical polishing (CMP) treatment, etching treatment, and the like can be employed. Note that the protective layer 102 is removed after the formation of the semiconductor region 104 or after the formation of the element isolation insulating layers 106.

Next, an insulating layer is formed over a surface of the semiconductor region 104, and a layer including a conductive material is formed over the insulating layer.

The insulating layer is to be a gate insulating layer later and can be formed by performing heat treatment (e.g., thermal oxidation treatment or thermal nitridation treatment) on the surface of the semiconductor region 104, for example. Instead of the heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed using a CVD method, a sputtering method, or the like. The insulating layer preferably has a single-layer structure or a stacked-layer structure which includes film including, silicon oxide, silicon oxynitride, silicon nitride, hafnium oxide, aluminum oxide, tantalum oxide, yttrium oxide, hafnium silicate ($HfSi_xO_y$, (x>0, y>0)), hafnium silicate to which nitrogen is added ($HfSi_xO_yN_z$(x>0, y>0, z>0)), hafnium aluminate to which nitrogen is added ($HfAl_xO_yN_z$ (x>0, y>0, z>0)), and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

After that, the insulating layer and the layer containing a conductive material are selectively etched, so that the gate insulating layer 108 and the gate electrode 110 are formed (see FIG. 10C).

Figure 10D:
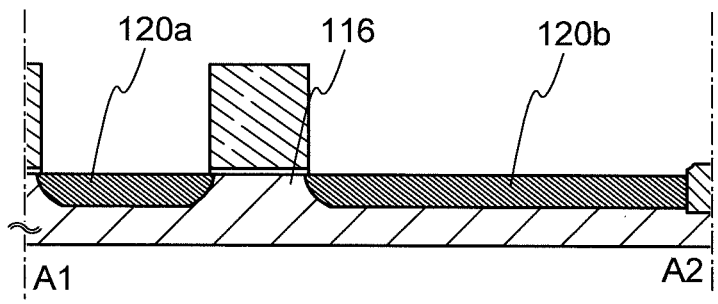

Then, phosphorus (P), arsenic (As), or the like is added to the semiconductor region 104, whereby the channel formation regions 116 and the impurity regions 120 (the impurity region 120a, the impurity region 120b) are formed (see FIG. 10D). Note that phosphorus or arsenic is added in order to form an n-channel transistor; an impurity element such as boron (B) or aluminum (Al) may be added in the case of forming a p-channel transistor. Here, the concentration of the impurity added can be set as appropriate; the concentration is preferably increased when a semiconductor element is highly miniaturized.

Note that a sidewall insulating layer may be formed in the periphery of the gate electrode 110 so that an impurity region to which an impurity element is added at different concentrations may be formed.

Figure 11A:
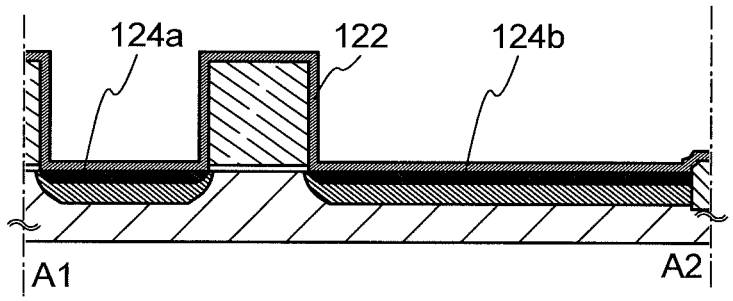
FIGS. 11A to 11D are cross-sectional views of a manufacturing process of a semiconductor device.

Next, a metal layer 122 is formed so as to cover the gate electrode 110, the impurity regions 120, and the like (see FIG. 11A). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to become a low-resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 (the metal compound region 124a, the metal compound region 124b) which are in contact with the impurity regions 120 (the impurity region 120a, the impurity region 120b) are formed (see FIG. 11A). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and enhance element characteristics. Note that the metal layer 122 is removed after the metal compound regions 124 are formed.

Figure 11B:
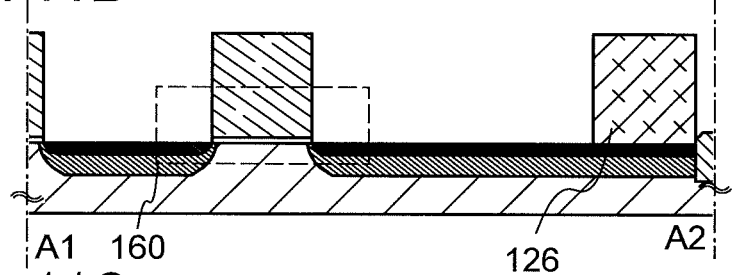

Next, the electrode 126 is formed over and in contact with the metal compound region 124b of the transistor 160 (see FIG. 11B). The electrode 126 is formed in such a manner that a conductive layer is formed by a PVD method such as a sputtering method or a CVD method such as a plasma CVD method and then the conductive layer is etched into a desired shape. As a material for the conductive layer, an element selected from the group of aluminum, chromium, copper, tantalum, titanium, molybdenum, and tungsten; an alloy containing any of these elements as a component; or the like can be used. Further, one of manganese, magnesium, zirconium, beryllium, neodymium, and scandium or more materials in combination thereof may be used. The details are similar to those of the source electrode 142a, the drain electrode 142b, and the like which are described later.

Figure 11C:
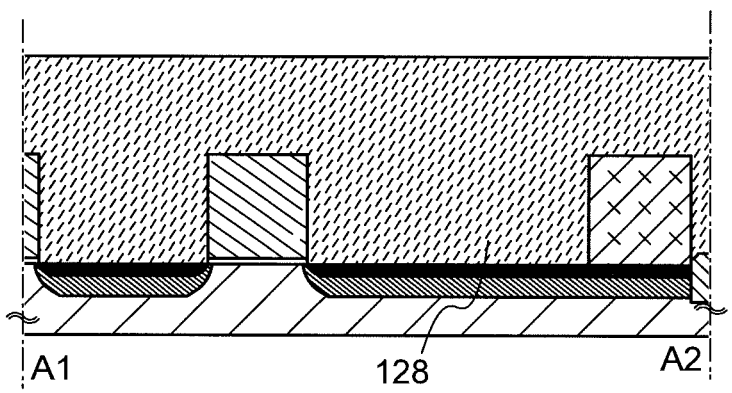

Through the above steps, the transistor 160 using the substrate 100 including a semiconductor material is formed (see FIG. 11C). Such a transistor 160 is capable of high-speed operation. Thus, when the transistor is used as a reading transistor, data can be read at a high speed.

Next, the insulating layer 128 is formed so as to cover the elements formed in the above steps (see FIG. 11C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of those materials. Since the porous insulating layer has low dielectric constant as compared to a dense insulating layer, capacitance due to electrodes or wirings can be further decreased. Further, the insulating layer 128 can be formed using an organic insulating material such as a polyimide or an acrylic resin. Note that although the insulating layer 128 has a single-layer structure here, one embodiment of the disclosed invention is not limited to this structure. The insulating layer 128 may have a stacked-layer structure of two or more layers.

Figure 11D:
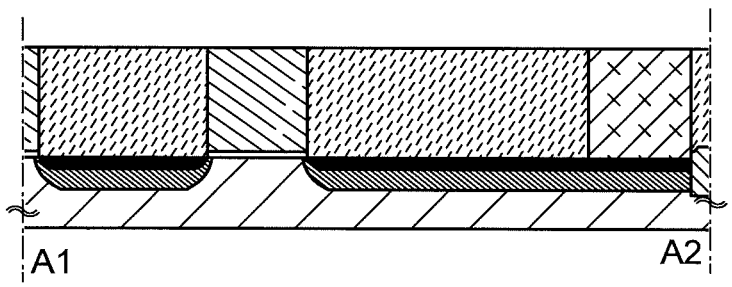

Then, as a pretreatment for the formation of the transistor 162 and the capacitor 164, CMP treatment is performed on the insulating layer 128 to expose the upper surfaces of the gate electrode 110 and the electrode 126 (see FIG. 11D). As the treatment for exposing the upper surfaces of the gate electrodes 110, etching treatment may be employed as an alternative to CMP treatment. Note that it is preferable to planarize the surface of the insulating layer 128 as much as possible in order to enhance the characteristics of the transistor 162. For example, the surface of the insulating layer 128 preferably has a root-mean-square (RMS) roughness of 1 nm or less.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Figure 12A:
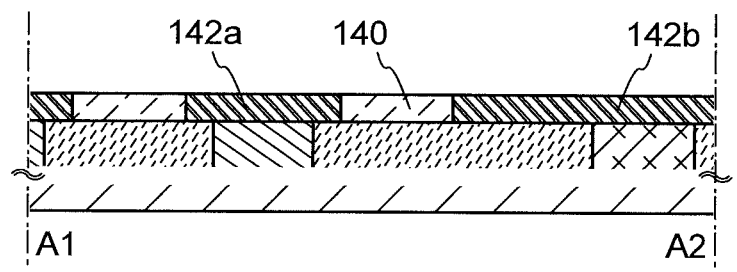
FIGS. 12A to 12D are cross-sectional views of a manufacturing process of a semiconductor device.

Next, a conductive layer is formed over the gate electrode 110, the electrode 126, the insulating layer 128, and the like, and the source electrode 142a and the drain electrode 142b are formed by selectively etching the conductive layer (see FIG. 12A).

The conductive layer can be formed by a PVD method such as a sputtering method or a CVD method such as a plasma CVD method. As a material for the conductive layer, an element selected from the group of aluminum, chromium, copper, tantalum, titanium, molybdenum, and tungsten; an alloy containing any of these elements as a component; or the like can be used. Further, one of manganese, magnesium, zirconium, beryllium, neodymium, and scandium or more materials in combination thereof may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has the single-layer structure of a titanium film or a titanium nitride film, there is an advantage that the source electrode 142a and the drain electrode 142b can be easily processed to be tapered.

Alternatively, the conductive layer may be formed using an conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

Although either dry etching or wet etching may be performed as the etching of the conductive layer, dry etching with high controllability is preferably used for miniaturization. The etching may be performed so that the source electrode 142a and the drain electrode 142b can have a tapered shape. The taper angle can be, for example, greater than or equal to 30° and less than or equal to 60°.

The channel length (L) of the transistor 162 in the upper portion is determined by the distance between an upper end portion of the source electrode 142a and an upper end portion of the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be set to less than 2 μm, preferably greater than or equal to 10 nm and less than or equal to 350 nm (0.35 μm), in which case the circuit can operate at higher speed. Moreover, miniaturization can lead to low power consumption of a semiconductor device.

Note that an insulating layer serving as a base may be provided over the insulating layer 128. The insulating layer can be formed by a PVD method, a CVD method or the like.

Next, the insulating layer 140 is formed so as to cover the source electrode 142a and the drain electrode 142b. Then, in order to planarize the insulating layer 140, chemical mechanical polishing (CMP) treatment is performed so that the source electrode 142a and the drain electrode 142b are exposed (see FIG. 12A).

The insulating layer 140 can be formed using a material including an inorganic insulating material such as silicon oxide, silicon oxynitride, silicon nitride, or aluminum oxide. It is particularly preferable that the insulating layer 140 is formed using silicon oxide because the oxide semiconductor layer 144 formed later is in contact with the insulating layer 140. Although there is no particular limitation on the forming method of the insulating layer 140, in consideration of the contact with the oxide semiconductor layer 144, a method with which hydrogen is sufficiently reduced is preferably employed. Examples of such a method include a sputtering method and the like. Needless to say, another deposition method such as a plasma CVD method may be used.

The chemical mechanical polishing (CMP) treatment is performed so as to expose at least part of surfaces of the source electrode 142a and the drain electrode 142b. In addition, the CMP treatment is preferably performed under such conditions that the root-mean-square (RMS) roughness of the surface of the insulating layer 140 becomes 1 nm or less (preferably 0.5 nm or less). By the CMP treatment performed under such conditions, the planarity of a surface where the oxide semiconductor layer 144 is formed later can be improved, and the characteristics of the transistor 162 can be enhanced.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surface of the insulating layer 140 can be further improved.

Then, after an oxide semiconductor layer is formed in contact with part of the top surfaces of the source electrode 142a, the drain electrode 142b, and the insulating layer 140, the oxide semiconductor layer is selectively etched to form the oxide semiconductor layer 144.

An oxide semiconductor to be used for the oxide semiconductor layer 144 preferably contains at least indium (In) or zinc (Zn). In particular, both In and Zn are preferably contained. As a stabilizer for reducing change in electric characteristics of a transistor using the oxide semiconductor, gallium (Ga) is preferably additionally contained. Moreover, the oxide semiconductor preferably contains tin (Sn), hafnium (Hf), and/or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In:Ga:Zn. Further, a metal element may be contained in addition to In, Ga, and Zn.

Alternatively, a material represented by $InMO_3(ZnO)_p$ (p>0 is satisfied and p is not an integer) may be used as an oxide semiconductor. Note that M represents one or more metal elements selected from the group of Ga, Fe, Mn, and Co. Still alternatively, a material represented by $In_3SnO_5(ZnO)_q$ (q>0 is satisfied, and q is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. The $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x,y) - Z_0|dxdy \qquad \text{[FORMULA 1]}$$

In the above formula, $S_0$ represents the area of a measurement plane (a rectangular region which is defined by four points represented by coordinates $(x_1, y_1)$, $(x_1, y_2)$, $(x_2, y_1)$ and $(x_2, y_2)$), and $Z_0$ represents an average height of the measurement plane. $R_a$ can be measured using an atomic force microscope (AFM). The measurement plane is a plane which is shown by all the measurement data, and the measurement data consists of three parameters (X, Y, Z), and the range of X (and Y) is from 0 to $X_{max}$ (and $Y_{max}$), and the range of Z is from $Z_{min}$ to $Z_{max}$.

In this embodiment, an oxide including a crystal with c-axis alignment (also referred to as a c-axis aligned crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

When oxygen is contained in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 18A to 18E, FIGS. 19A to 19C, and FIGS. 20A to 20C. In FIGS. 18A to 18E, FIGS. 19A to 19C, and FIGS. 20A to 20C, the vertical direction corresponds to the c-axis direction and a plane perpendicular to the c-axis direction corresponds to the a-b plane, unless otherwise specified. When the expressions an "upper half" and a "lower half" are simply used, the "upper half" and the "lower half" refer to an upper half above the a-b plane and a lower half below the a-b plane, respectively.

Figure 18A:
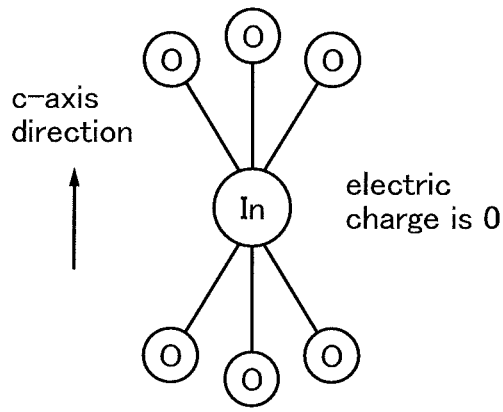
FIGS. 18A to 18E are diagrams each illustrating a crystal structure of an oxide material which can be applied to a transistor.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
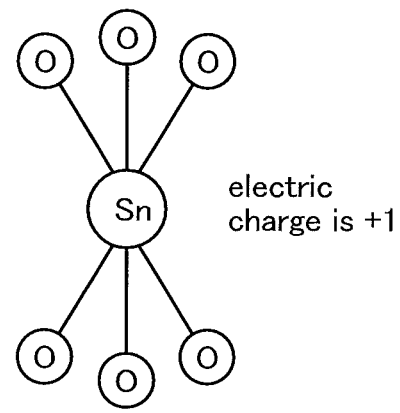
Figure 18B:
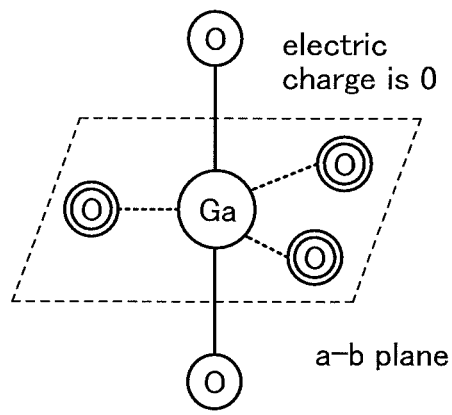

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
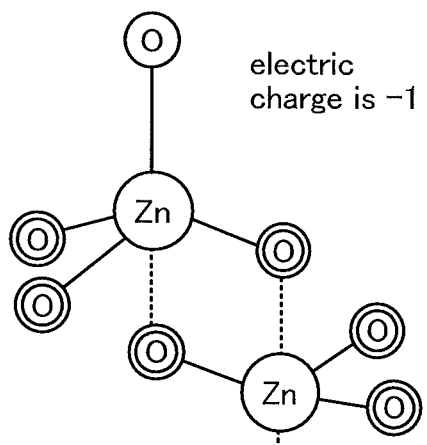
Figure 18C:
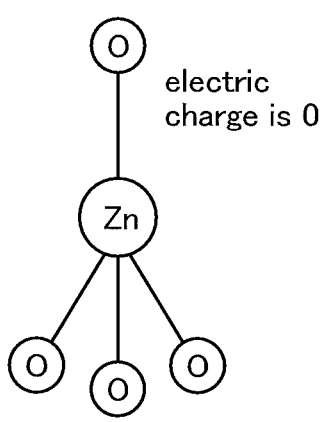

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom which is coordinated to the three tetracoordinate O atoms in the lower half, it is bonded to the pentacoordinate metal (Ga or In) atom or the tetracoordinate metal (Zn) atom through one of the three tetracoordinate O atoms.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 19A:
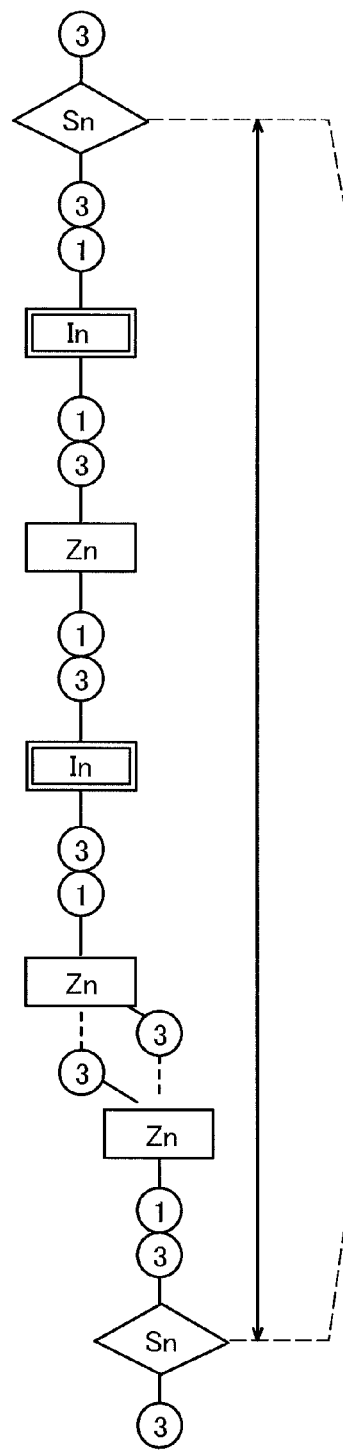
FIGS. 19A to 19C are diagrams illustrating a crystal structure of an oxide material which can be applied to a transistor.
Figure 19B:
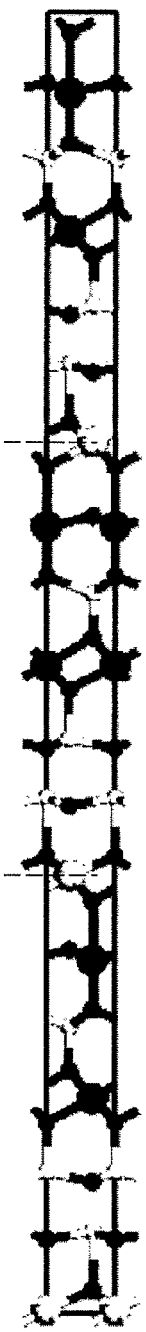
Figure 19C:
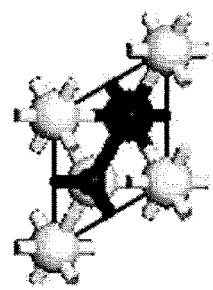

FIG. 19A illustrates a model of a medium group included in a layered structure of an In—Sn—Zn—O-based material. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, the state that three tetracoordinate O atoms existing in each of an upper half and a lower half with respect to a Sn atom is denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$, (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 20A:
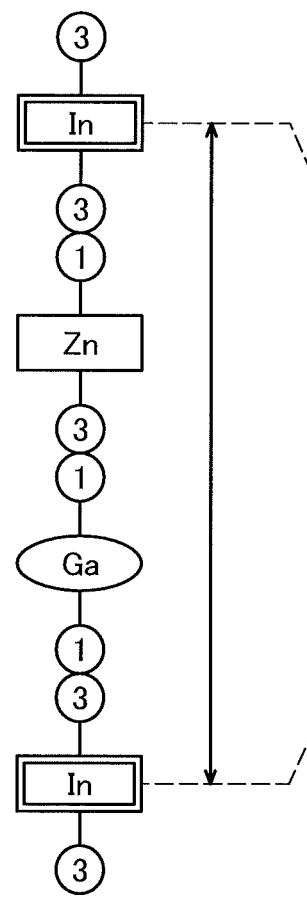
FIGS. 20A to 20C are diagrams illustrating a crystal structure of an oxide material which can be applied to a transistor.

As an example, FIG. 20A illustrates a model of a medium group included in a layered structure of an In—Ga—Zn—O-based material.

In the medium group included in the layered structure of the In—Ga—Zn—O-based material in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
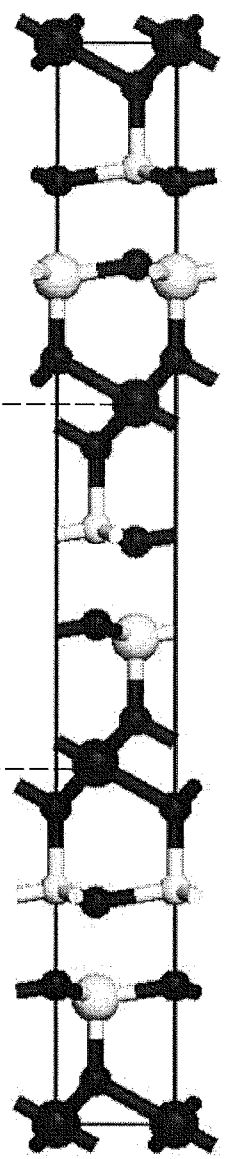
Figure 20C:
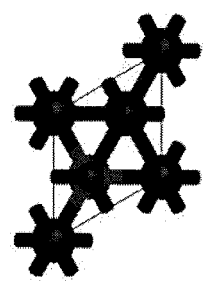

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 20A but also a medium group in which the arrangement of the In atom, the Ga atom, and the Zn atom is different from that in FIG. 20A.

As an oxide target used for forming the oxide semiconductor layer 144 by a sputtering method, a target having a composition ratio of In:Ga:Zn=1:x:y (x is 0 or more and y is from 0.5 l to 5) is preferably used. For example, a target having a composition ratio of In:Ga:Zn=1:1:1 [atomic ratio] (x=1, y=1) (i.e., a composition ratio of $In_2O_3:Ga_2O_3:ZnO=1:1:2$ [molar ratio]) can be used. In addition, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can also be used.

Further, an In—Sn—Zn-based oxide can be referred to as ITZO. An oxide target which has a composition ratio of In:Sn:Zn=1:2:2, 2:1:3, 1:1:1, 20:45:35, or the like in an atomic ratio is used.

In this embodiment, an oxide semiconductor layer having an amorphous structure is formed as the oxide semiconductor layer 144 by a sputtering method with the use of an In—Ga—Zn—O-based metal oxide target. The thickness ranges from 1 nm to 50 nm, preferably from 2 nm to 20 nm, more preferably from 3 nm to 15 nm.

The relative density of the metal oxide in the metal oxide target is 80% or more, preferably 95% or more, and more preferably 99.9% or more. The use of the metal oxide target with high relative density makes it possible to farm an oxide semiconductor layer having a dense structure.

The atmosphere in which the oxide semiconductor layer 144 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (25° C.±10° C.). Then, moisture in the treatment chamber is removed, a sputtering gas from which hydrogen, water, or the like is removed is introduced, and the above-described target is used; thus, the oxide semiconductor layer 144 is formed. By forming the oxide semiconductor layer 144 while heating the object to be processed, an impurity in the oxide semiconductor layer 144 can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be lowered.

Figure 12B:
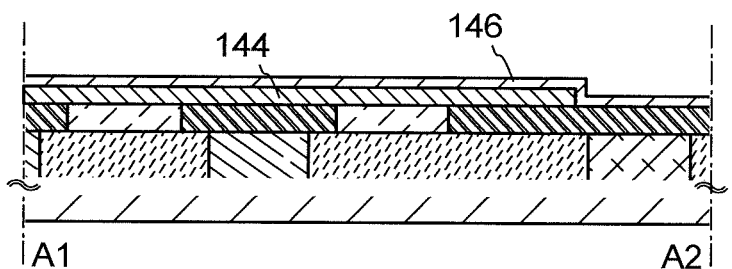

For example, conditions for forming the oxide semiconductor layer 144 can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (such as powder substances generated in film formation) can be reduced and the film thickness can be made uniform. The thickness of the oxide semiconductor layer 144 is set in the range of 1 nm to 50 nm, preferably 2 nm to 20 nm, more preferably 3 nm to 15 nm. By employing a structure according to the disclosed invention, a short-channel effect due to miniaturization can be suppressed even in the case of using the oxide semiconductor layer 144 having such a thickness. Note that an appropriate thickness differs depending on an oxide semiconductor material used, the usage of a semiconductor device, or the like; therefore, it is also possible to set the thickness as appropriate depending on the material to be used, the usage, or the like. Note that when the insulating layer 140 is formed in the above manner, a surface of a portion where the channel formation region is to be formed in the oxide semiconductor layer 144 can be sufficiently planarized; thus, the oxide semiconductor layer can be suitably formed even when having a small thickness. As illustrated in FIG. 12B, the portion corresponding to the channel formation region in the oxide semiconductor layer 144 preferably has a planar cross-sectional shape. By making the cross-sectional shape of the portion corresponding to the channel formation region of the oxide semiconductor layer 144 flat, leakage current can be reduced as compared to the case where the cross-sectional shape of the oxide semiconductor layer 144 is not flat.

Note that before the oxide semiconductor layer 144 is formed by a sputtering method, a substance attached to a surface where the oxide semiconductor layer 144 is to be formed (e.g., the surface of the insulating layer 140) may be preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

After the oxide semiconductor layer 144 is formed, heat treatment (first heat treatment) is preferably performed on the oxide semiconductor layer 144. Excessive hydrogen (including water and a hydroxyl group) in the oxide semiconductor layer 144 can be removed by the first heat treatment. The temperature of the first heat treatment is, for example, higher than or equal to 300° C. and lower than 550° C., preferably higher than or equal to 400° C. and lower than or equal to 500° C.

The heat treatment can be performed in such a way that, for example, an object to be heated is introduced into an electric furnace in which a resistance heating element or the like is used and heated, under a nitrogen atmosphere at 450° C. for one hour. During the heat treatment, the oxide semiconductor layer is not exposed to the atmosphere to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed under a condition that a process temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The above heat treatment (first heat treatment) can be referred to as dehydration treatment, dehydrogenation treatment, or the like because of its effect of removing hydrogen, water, and the like. The dehydration treatment or the dehydrogenation treatment can also be performed at the following timing: after the formation of the oxide semiconductor layer 144, after the formation of the gate insulating layer 146, after the formation of the gate electrode, or the like. Such dehydration treatment or dehydrogenation treatment may be conducted once or plural times.

The etching of the oxide semiconductor layer 144 may be performed before or after the heat treatment. In view of miniaturization of elements, dry etching is preferably used; however, wet etching may be used. An etching gas and an etchant can be selected as appropriate depending on a material of a layer to be etched. Note that in the case where leakage current in an element does not cause a problem, the oxide semiconductor layer may be used without being processed to have an island shape.

An oxide conductive layer serving as a source region and a drain region may be provided as a buffer layer between the oxide semiconductor layer 144 and the source and drain electrodes 142a, 142b.

As the formation method of the oxide conductive layer, a sputtering method, a vacuum evaporation method (an electron beam evaporation method or the like), an arc discharge ion plating method, or a spray method can be used. As a material for the oxide conductive layer, zinc oxide, zinc aluminum oxide, zinc aluminum oxynitride, zinc gallium oxide, or the like can be used. The thickness of the oxide conductive layer is set as appropriate in a range of from 50 nm to 300 nm. Further, silicon oxide may be contained in the above material.

The shape of the oxide conductive layer can be processed in the same photolithography process as the source electrode 142a and the drain electrode 142b. Alternatively, the shape of the oxide conductive layer may be processed once more in the photolithography process for forming the oxide semiconductor layer 144, with use of the same mask as the oxide semiconductor layer 144.

By providing the oxide conductive layer as the source region and the drain region between the oxide semiconductor layer 144 and the source electrode 142a, the drain electrode 142b, reduction in resistance in the source region and the drain region can be achieved and the transistor 162 can operate at high speed.

Further, by employing the structure of the oxide semiconductor layer 144, the oxide conductive layer, and the drain electrode 142b, withstand voltage of the transistor 162 can be increased.

It is also effective to use the oxide conductive layer for a source region and a drain region in order to enhance frequency characteristics of a peripheral circuit (a driver circuit). This is because the contact between a metal electrode (molybdenum, tungsten, or the like) and an oxide conductive layer can reduce the contact resistance as compared with the contact between a metal electrode (molybdenum, tungsten, or the like) and an oxide semiconductor layer. The contact resistance can be reduced by interposing an oxide conductive layer between an oxide semiconductor layer and source and drain electrode layers; accordingly, frequency characteristics of a peripheral circuit (a driving circuit) can be enhanced.

Next, the gate insulating layer 146 is formed so as to cover the oxide semiconductor layer 144 (see FIG. 12B).

The gate insulating layer 146 can be formed by a CVD method, a sputtering method, or the like. The gate insulating layer 146 preferably includes silicon oxide, silicon nitride, silicon oxynitride, aluminum oxide, tantalum oxide, hafnium oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), and the like. In addition, the gate insulating layer 146 may have a single-layer structure or a stacked-layer structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, a high dielectric constant (high-k) material such as hafnium oxide, tantalum oxide, yttrium oxide, hafnium silicate ($HfSi_xO_y$ ($x>0$, $y>0$)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)) is preferably used for the gate insulating layer 146. By using a high-k material for the gate insulating layer 146, electrical characteristics can be ensured and the thickness can be large to prevent gate leakage. For example, the relative permittivity of hafnium oxide is approximately 15, which is much higher than that of silicon oxide which is 3 to 4. With such a material, a gate insulating layer where the equivalent oxide thickness is less than 15 nm, preferably 2 nm to 10 nm, can be easily formed. Note that a stacked-layer structure of a film containing a high-k material and a film containing any one of silicon oxide, silicon nitride, silicon oxynitride, silicon nitride oxide, aluminum oxide, and the like may be employed.

Further, a metal oxide film is preferably used for the film in contact with the oxide semiconductor layer 144 like the gate insulating layer 146. The metal oxide film is formed using a material such as silicon oxide, silicon oxynitride, or silicon nitride oxide, for example. Alternatively, a material including an element of Group 13 and oxygen can be also used. For example, as the material including an element of Group 13 and oxygen, a material including one or more of gallium oxide, aluminum oxide, aluminum gallium oxide, and gallium aluminum oxide is given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent. The metal oxide film can be formed with a single-layer structure or a stacked-layer structure using the above-described materials.

After the gate insulating layer 146 is formed, second heat treatment is desirably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. The second heat treatment can suppress variation in electric characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is applied, whereby the oxide semiconductor layer 144 can be highly purified so as to minimize the amount of impurities that are not main components of the oxide semiconductor.

Next, the gate electrode 148 is formed over the gate insulating layer 146.

The gate electrode 148 can be formed in such a manner that a conductive layer is formed over the gate insulating layer 146 and then selectively etched. The conductive layer to become the gate electrode 148 can be formed by a PVD method such as a sputtering method or a CVD method such as a plasma CVD method. The details are similar to those in the case of the source electrode 142a, the drain electrode 142b, or the like; thus, the description thereof can be referred to.

Figure 12C:
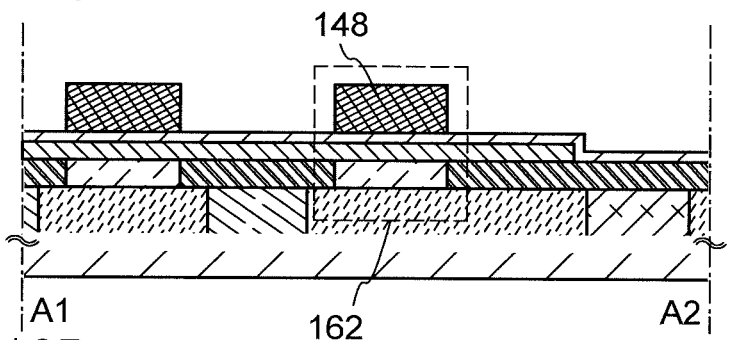

Through the above steps, the transistor 162 including the highly-purified oxide semiconductor layer 144 is completed (see FIG. 12C). Such a transistor 162 has a characteristic of sufficiently reduced off-state current. Therefore, with the use of the transistor as a writing transistor, electric charge can be held for a long time.

Figure 12D:
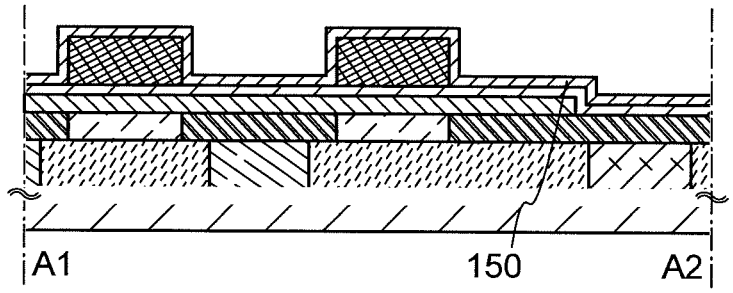

Then, the insulating layer 150 is formed over the gate insulating layer 146 and the gate electrode 148 (see FIG. 12D). The insulating layer 150 can be formed by a PVD method, a CVD method, or the like. The insulating layer 150 can be formed so as to have a single-layer structure or a stacked structure using a material including an inorganic insulating material such as silicon oxide, silicon oxynitride, silicon nitride, hafnium oxide, or aluminum oxide.

Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings, electrodes or the like can be reduced, so that operation speed can be increased.

Figure 13A:
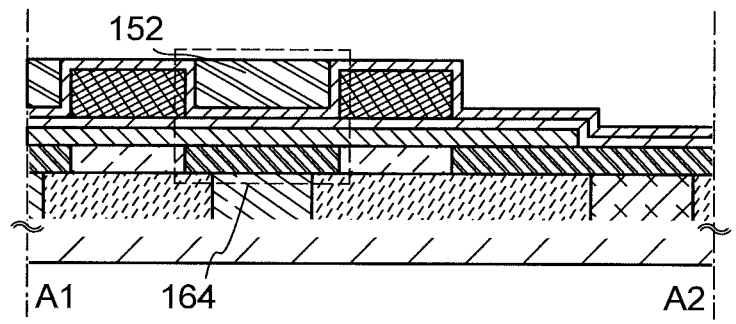
FIGS. 13A to 13C are cross-sectional views of a manufacturing process of a semiconductor device.
Figure 13B:
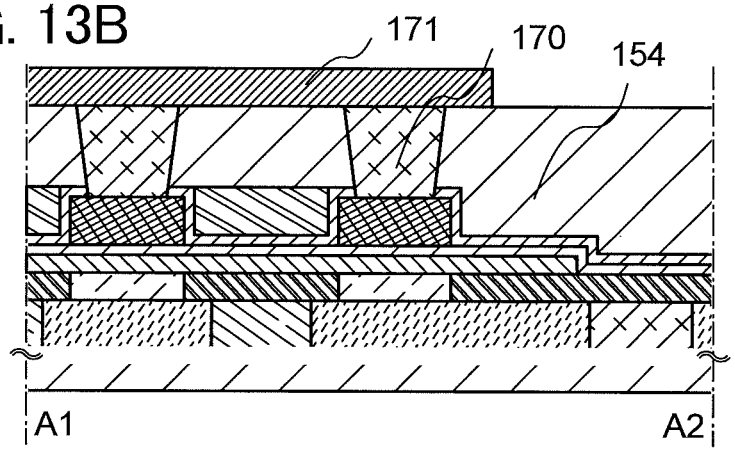
Figure 13C:
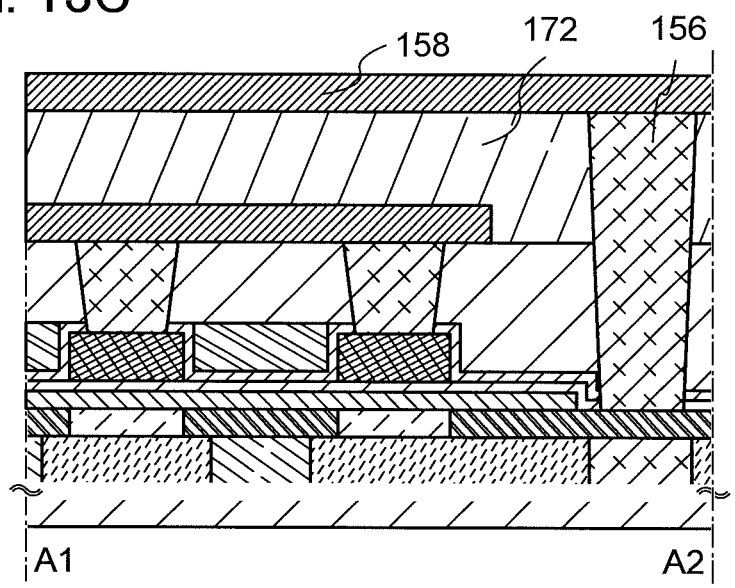

Next, the electrode 152 is formed over the insulating layer 150 so as to overlap with the source electrode 142a (see FIG. 13A). The method and materials for forming the gate electrode 148 can be applied to the electrode 152; therefore, the description of the gate electrode 148 can be referred to for the details of the electrode 152. Through the above steps, the capacitor 164 is completed.

Next, the insulating layer 154 is formed over the insulating layer 150 and the electrode 152. After an opening reaching the gate electrode 148 is formed in the insulating layer 150 and the insulating layer 154, the electrode 170 is formed in the opening, a wiring 171 in contact with the electrode 170 is formed over the insulating layer 154 (see FIG. 13B). The opening is formed by selective etching with the use of a mask or the like.

Next, the insulating layer 172 is formed over the electrode 152 and the wiring 171. An opening reaching the drain electrode 142b is formed in the gate insulating layer 146, the insulating layer 150, the insulating layer 154 and the insulating layer 172, and then an electrode 156 is formed in the opening and a wiring 158 is formed over the insulating layer 172 so as to be in contact with the electrode 156 (see FIG. 13C). The opening is formed by selective etching with the use of a mask or the like.

Like the insulating layer 150, the insulating layer 154 and the insulating layer 172 can be formed by a PVD method, a CVD method, or the like. The insulating layer 154 and the insulating layer 172 can be formed so as to have a single-layer structure or a stacked structure using a material including an inorganic insulating material such as silicon oxide, silicon oxynitride, silicon nitride, hafnium oxide, or aluminum oxide.

Note that for the insulating layer 154 and the insulating layer 172, a material with a low dielectric constant may be preferably used or a structure with a low dielectric constant (e.g., a porous structure) may be preferably employed. This is because by reducing the dielectric constant of the insulating layer 154 and the insulating layer 172, capacitance between wirings, electrodes, or the like can be reduced, so that operation speed can be increased.

Note that the insulating layer 154 and the insulating layer 172 are desirably formed so as to have flat surfaces. This is because when the insulating layer 154 and the insulating layer 172 have a flat surface, an electrode, a wiring, or the like can be favorably formed over the insulating layer 154 and the insulating layer 172 even in the case where the semiconductor device or the like is miniaturized. The insulating layer 154 and the insulating layer 172 can be planarized by a method such as chemical mechanical polishing (CMP).

The electrode 170 and the electrode 156 can be fanned in such a manner that, for example, a conductive layer is formed by a PVD method, a CVD method, or the like in a region including the openings and then part of the conductive layer is removed by etching treatment, CMP, or the like.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film (such as a natural oxide film) over which the titanium film is to be formed, and thereby lowering contact resistance with lower electrodes or the like (the drain electrode 142b, here). The titanium nitride film formed after the formation of the titanium film has a barrier function of preventing diffusion of the conductive material. A copper film may be formed by a plating method after the formation of the barrier film of titanium, titanium nitride, or the like.

The wiring 171 and the wiring 158 are formed in such a manner that a conductive layer is formed by a PVD method such as a sputtering method or a CVD method such as a plasma CVD method and then the conductive layer is etched into a desired shape. As a material for the conductive layer, an element selected from the group of aluminum, chromium, copper, tantalum, titanium, molybdenum, and tungsten; an alloy containing any of these elements as a component; or the like can be used. Further, one element selected from the group of manganese, magnesium, zirconium, beryllium, neodymium, and scandium or more elements in combination thereof may be used. The details are similar to those of the source electrode 142a or the like.

Note that a variety of wirings, electrodes, or the like may be formed following the above steps. The wirings or the electrodes can be formed by a method such as a so-called damascene method or dual damascene method.

Through the above steps, the semiconductor device having the structure illustrated in FIG. 5 and FIGS. 9A and 9B can be manufactured.

In the semiconductor device described in this embodiment, the transistors each including an oxide semiconductor in memory cells of the semiconductor device are connected in series; thus, the source electrode of the transistor including an oxide semiconductor in a memory cell and the drain electrode of the transistor including an oxide semiconductor in an adjacent memory cell can be shared in the memory cells. Therefore, the area occupied by the memory cell can be reduced, whereby the degree of integration of the semiconductor device can be enhanced and the storage capacity per unit area can be increased.

The methods and structures described in this embodiment can be combined as appropriate with any of the methods and structures described in the other embodiments.

(Embodiment 3)

In this embodiment, an example of a transistor that can be applied to a semiconductor device disclosed in this specification will be described. There is no particular limitation on the structure of the transistor that can be applied to a semiconductor device disclosed in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel formation region with a gate insulating layer provided therebetween.

FIGS. 15A to 15D each illustrate an example of a cross-sectional structure of a transistor that can be applied to a semiconductor device disclosed in this specification (for example, the transistor 162 in Embodiments 1 and 2). In each example of FIGS. 15A to 15D, the transistor is provided over an insulating layer 400; however, the transistor may be provided over a substrate such as a glass substrate. Note that in the case where any of the transistors illustrated in FIGS. 15A to 15D is applied to the transistor 162 in Embodiments 1 and 2, the insulating layer 400 corresponds to the insulating layer 128.

Figure 15A:
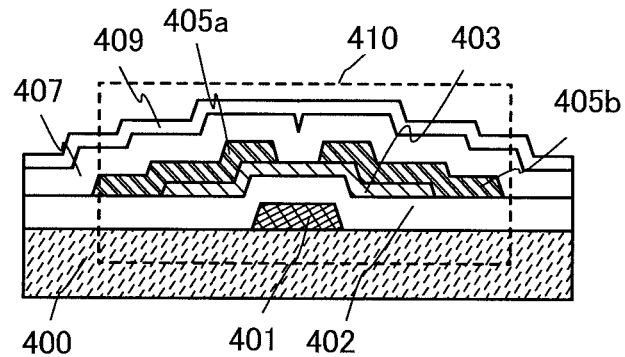
FIGS. 15A to 15D are cross-sectional views of semiconductor devices.

A transistor 410 illustrated in FIG. 15A is a kind of bottom-gate thin film transistor, and is also referred to as an inverted-staggered thin film transistor.

The transistor 410 includes, over the insulating layer 400, a gate electrode layer 401, a gate insulating layer 402, an oxide semiconductor layer 403, a source electrode layer 405a, and a drain electrode layer 405b. An insulating layer 407 covering the transistor 410 is stacked over the oxide semiconductor layer 403. An insulating layer 409 is formed over the insulating layer 407.

Figure 15B:
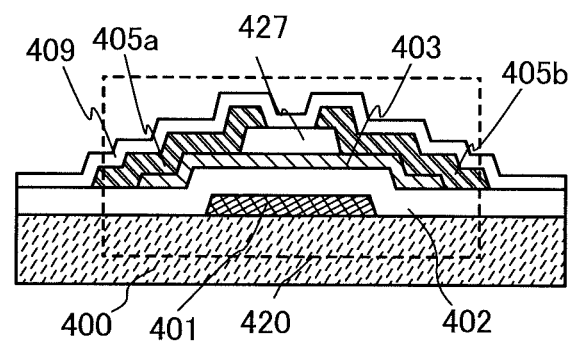

A transistor 420 illustrated in FIG. 15B has a kind of bottom-gate structure referred to as a channel-protective type (channel-stop type) and is also referred to as an inverted-staggered thin film transistor.

The transistor 420 includes, over the insulating layer 400, the gate electrode layer 401, the gate insulating layer 402, the oxide semiconductor layer 403, an insulating layer 427 functioning as a channel protective layer which covers a channel formation region of the oxide semiconductor layer 403, the source electrode layer 405a and the drain electrode layer 405b. The insulating layer 409 is formed to cover the transistor 420.

Figure 15C:
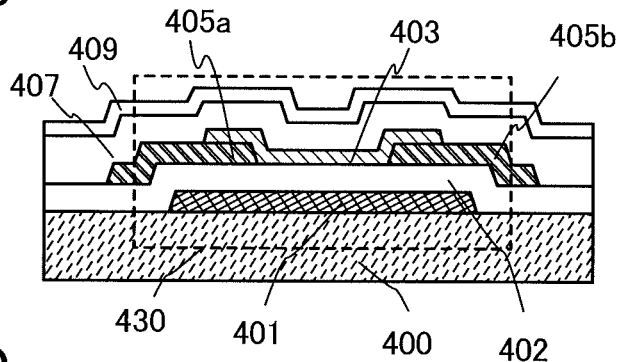

A transistor 430 illustrated in FIG. 15C is a bottom-gate thin film transistor and includes, over the insulating layer 400 which is a substrate having an insulating surface, the gate electrode layer 401, the gate insulating layer 402, the source electrode layer 405a, the drain electrode layer 405b, and the oxide semiconductor layer 403. In addition, the insulating layer 407 covering the transistor 430 is provided in contact with the oxide semiconductor layer 403. The insulating layer 409 is formed over the insulating layer 407.

In the transistor 430, the gate insulating layer 402 is provided over and in contact with the insulating layer 400 and the gate electrode layer 401, and the source electrode layer 405a, and the drain electrode layer 405b are provided over and in contact with the gate insulating layer 402. Further, the oxide semiconductor layer 403 is provided over the gate insulating layer 402, the source electrode layer 405a and the drain electrode layer 405b.

Figure 15D:
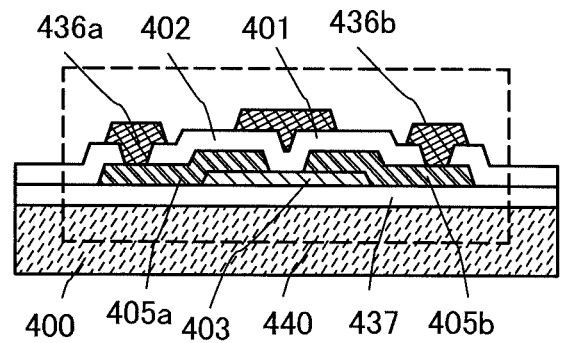

A transistor 440 illustrated in FIG. 15D is a kind of top-gate thin film transistor. The transistor 440 includes, over the insulating layer 400, an insulating layer 437, the oxide semiconductor layer 403, the source electrode layer 405a, the drain electrode layer 405b, the gate insulating layer 402 and the gate electrode layer 401. A wiring layer 436a and a wiring layer 436b are provided in contact with and electrically connected to the source electrode layer 405a and the drain electrode layer 405b respectively.

In the case of forming each of the bottom-gate transistors 410, 420, and 430 over a substrate, an insulating film serving as a base film may be provided between the substrate and the gate electrode layer. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The gate electrode layer 401 can be formed with a single-layer structure or a stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer ($SiN_y$ (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As the conductive layer used for the source electrode layer 405a and the drain electrode layer 405b, for example, a film of an element selected from the group of Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that for the source electrode layer 405a and the drain electrode layer 405b can be used for a conductive layer used for the wiring layer 436a and the wiring layer 436b which are respectively connected to the source electrode layer 405a and the drain electrode layer 405b.

Alternatively, the conductive layer to be the source and drain electrode layers 405a and 405b (including a wiring layer formed using the same layer as the source and drain electrode layers) may be formed using conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

As the insulating layers 407, 427, and 437, an inorganic insulating film, typical examples of which are a silicon oxide film, a silicon oxynitride film, an aluminum oxide film, and an aluminum oxynitride film, can be used.

As the insulating layer 409, an inorganic insulating film such as a silicon nitride film, an aluminum nitride film, a silicon nitride oxide film, or an aluminum nitride oxide film can be used.

In addition, a planarization insulating film may be formed over the insulating layer 409 in order to suppress surface unevenness due to the transistor. As the planarization insulating film, an organic material such as polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed using some of these materials.

Figure 16A:
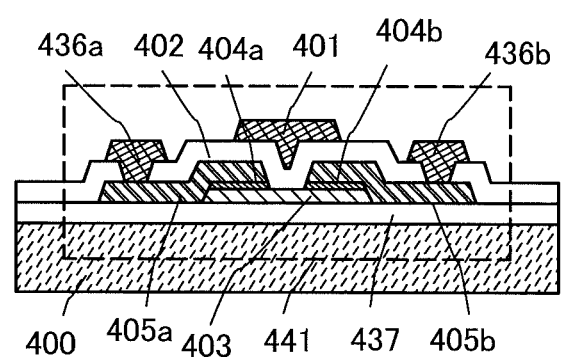
FIGS. 16A and 16B are cross-sectional views of semiconductor devices.
Figure 16B:
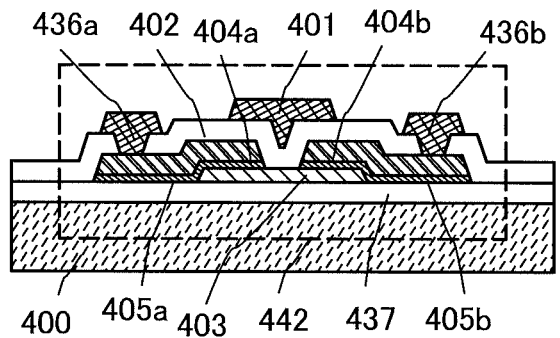

Note that an oxide conductive layer serving as source and drain regions may be provided between the oxide semiconductor layer 403 and the source and drain electrode layers 405a and 405b, as a buffer layer. FIGS. 16A and 16B illustrate transistors 441 and 442, respectively, each of which is obtained by providing an oxide conductive layer in the transistor 440 in FIG. 15D.

The transistors 441 and 442 in FIGS. 16A and 16B are each provided with oxide conductive layers 404a and 404b serving as source and drain regions between the oxide semiconductor layer 403 and the source and drain electrode layers 405a and 405b. The transistors 441 and 442 in FIGS. 16A and 16B are different from each other in the shapes of the oxide conductive layers 404a and 404b depending on a manufacturing process.

In the transistor 441 in FIG. 16A, a stack of an oxide semiconductor layer and an oxide conductive layer is formed and processed through the same photolithography process, so that the oxide semiconductor layer 403 and the oxide conductive layer are formed to have island shapes. After the source electrode layer 405a and the drain electrode layer 405b are formed over the oxide semiconductor layer and the oxide conductive layer, the oxide conductive layer having an island shape is etched using the source electrode layer 405a and the drain electrode layer 405b as masks so that the oxide conductive layers 404a and 404b to be source and drain regions are formed.

In the transistor 442 in FIG. 16B, an oxide conductive layer is formed over the oxide semiconductor layer 403, a metal conductive layer is formed thereover, and then the oxide conductive layer and the metal conductive layer are processed through the same photolithography process, so that the oxide conductive layers 404a and 404b to be source and drain regions, the source electrode layer 405a and the drain electrode layer 405b are formed.

In performing etching to process the oxide conductive layer, etching conditions (the kind and the concentration of an etching material, etching time, and the like) are appropriately adjusted so that the oxide semiconductor layer is not excessively etched.

As a formation method of the oxide conductive layers 404a and 404b, a sputtering method, a vacuum evaporation method (an electron beam evaporation method or the like), an arc discharge ion plating method, or a spray method can be used. As a material of the oxide conductive layers 404a and 404b, zinc oxide, zinc aluminum oxide, zinc aluminum oxynitride, gallium zinc oxide, or the like can be used. In addition, the above materials may contain silicon oxide.

When the oxide conductive layers are provided as the source and drain regions between the oxide semiconductor layer 403 and the source and drain electrode layers 405a and 405b, the resistance of the source and drain regions can be lowered, resulting in high-speed operation of the transistors 441 and 442.

Including the oxide semiconductor layer 403, the oxide conductive layers 404a and 404b, and the source and drain electrode layers 405a and 405b, the transistors 441 and 442 can each have a higher withstand voltage.

This embodiment can be combined with the structure of any of the other embodiments as appropriate.

(Embodiment 4)

Figure 17A:
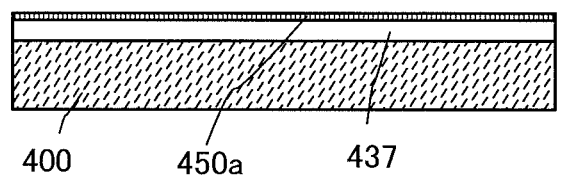
FIGS. 17A to 17C are cross-sectional views of a manufacturing process of a semiconductor device.
Figure 17B:
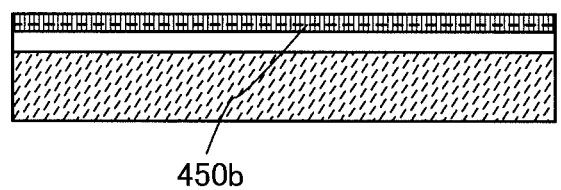

One embodiment of an oxide semiconductor layer which can be used as any of the semiconductor layers of the transistors in Embodiments 1 to 3 will be described with reference to FIGS. 17A to 17C.

The oxide semiconductor layer of this embodiment has a stacked structure including a first crystalline oxide semiconductor layer and a second crystalline oxide semiconductor layer. The second crystalline oxide semiconductor layer is stacked over the first crystalline oxide semiconductor layer and is thicker than the first crystalline oxide semiconductor layer.

An insulating layer 437 is formed over an insulating layer 400. In this embodiment, an oxide insulating layer with a thickness greater than or equal to 50 nm and less than or equal to 600 nm is formed as the insulating layer 437 by a plasma CVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor layer with a thickness greater than or equal to 1 nm and less than or equal to 10 nm is formed over the insulating layer 437. The first oxide semiconductor layer is formed by a sputtering method, and the substrate temperature in the film formation by a sputtering method is set to be higher than or equal to 200° C. and lower than or equal to 400° C.

In this embodiment, the first oxide semiconductor layer is formed to a thickness of 5 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$ and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 17A).

Depending on the substrate temperature at the time of deposition or the temperature of the first heat treatment, the deposition or the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is decreased. Therefore, it is preferable that oxygen be included in (in a bulk of) the insulating layer 437 used as a base insulating film or at the interface between the first crystalline oxide semiconductor layer 450a and the insulating layer 437 at an amount that exceeds at least the amount of oxygen in the stoichiometric composition ratio.

Next, a second oxide semiconductor layer with a thickness more than 10 nm is formed over the first crystalline oxide semiconductor layer 450a. The second oxide semiconductor layer is formed by a sputtering method, and the substrate temperature in the film formation is set to be higher than or equal to 200° C. and lower than or equal to 400° C. By setting the substrate temperature in the film formation in the range of from 200° C. to 400° C., precursors can be arranged in the oxide semiconductor layer formed over and in contact with the surface of the first crystalline oxide semiconductor layer and so-called orderliness can be obtained.

In this embodiment, the second oxide semiconductor layer is formed to a thickness of 25 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 17B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is decreased. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

Preferably, steps from the formation of the insulating layer 437 to the second heat treatment are successively performed without exposure to the air. The steps from the formation of the insulating layer 437 to the second heat treatment are preferably performed in an atmosphere which is controlled to include as little hydrogen and moisture as possible (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 17C:
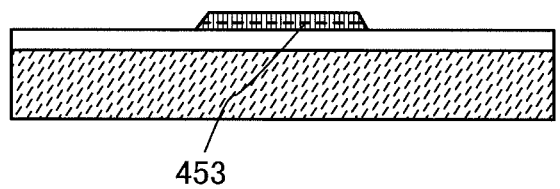

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 17C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface therebetween is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer include an oxide including a crystal having c-axis alignment (also referred to as c-axis aligned crystal (CAAC)), which has neither a single crystal structure nor an amorphous structure. The first crystalline oxide semiconductor layer and the second crystalline oxide semiconductor layer partly include a crystal grain boundary.

Note that examples of materials for the first crystalline oxide semiconductor layer and the second crystalline oxide semiconductor layer include a four-component metal oxides such as an In—Sn—Ga—Zn—O-based material; three-component metal oxides such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxide such as an In—O-based material, a Sn—O-based material, and a Zn—O-based material. In addition, the above materials may include $SiO_2$. Here, for example, an In—Ga—Zn—O-based material means an oxide including indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by performing once or plural times a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistors 162 in Embodiment 1 and Embodiment 2, the transistors 410, 420, 430, 440, 441, 442 in Embodiment 3) which can be applied to a semiconductor device disclosed in this specification.

In the transistor 440 in Embodiment 3 in which the oxide semiconductor layer of this embodiment is used as the oxide semiconductor layer 403, an electric field is not applied from one surface to the other surface of the oxide semiconductor layer and current does not flow in the thickness direction (from one surface to the other surface; e.g., in the vertical direction in FIG. 15D) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be combined with the structure of any of the other embodiments as appropriate.

(Embodiment 5)

In this embodiment, the cases where the semiconductor device described in any of the above embodiments is applied to electronic devices will be described with reference to FIGS. 14A to 14F. The cases where the above-described semiconductor device is applied to electronic devices such as a computer, a mobile phone set (also referred to as a mobile phone or a mobile phone device), a portable information terminal (including a portable game machine, an audio reproducing device, and the like), a camera such as a digital camera, a digital video camera, electronic paper, a television set (also referred to as a television or a television receiver), and the like are described in this embodiment.

Figure 14A:
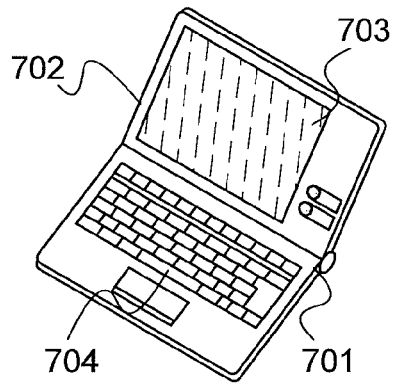
FIGS. 14A to 14F are diagrams each illustrating an electronic device including a semiconductor device.

FIG. 14A illustrates a notebook personal computer, which includes a housing 701, a housing 702, a display portion 703, a keyboard 704 and the like. The semiconductor device described in any of the above embodiments is provided in at least one of the housings 701 and 702. Thus, a notebook personal computer with sufficiently lowered power consumption, in which writing and reading of data can be performed at high speed and data can be stored for a long time, can be realized.

Figure 14D:
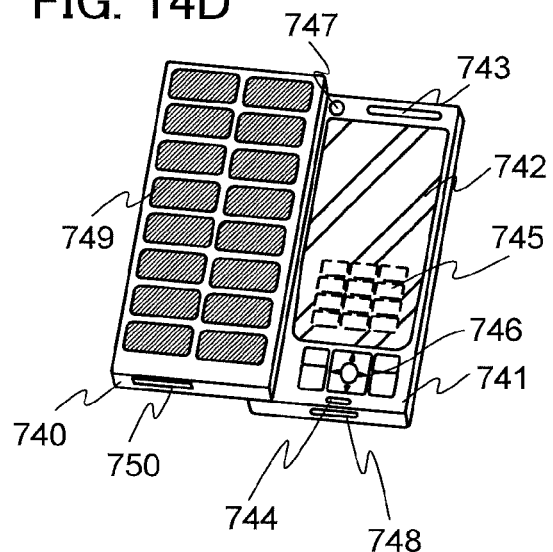
Figure 14B:
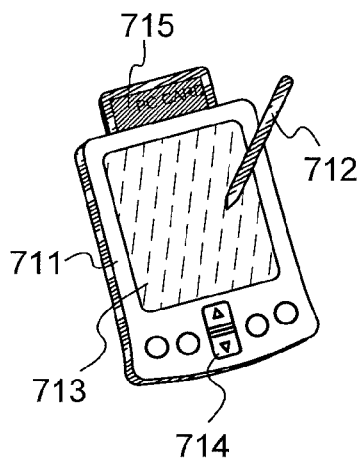

FIG. 14B illustrates a portable information terminal (PDA). A main body 711 is provided with a display portion 713, an external interface 715, operation buttons 714 and the like. Further, a stylus 712 for operation of the portable information terminal or the like is provided. The semiconductor device described in any of the above embodiments is provided in the main body 711. Thus, a portable information terminal with sufficiently lowered power consumption, in which writing and reading of data can be performed at high speed and data can be stored for a long time, can be realized.

Figure 14E:
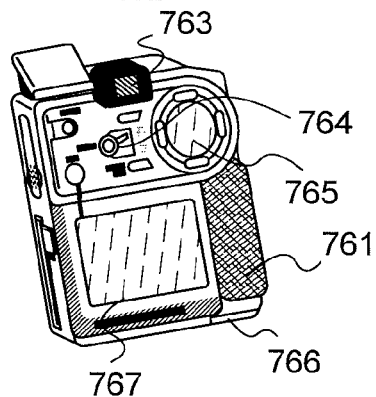
Figure 14C:
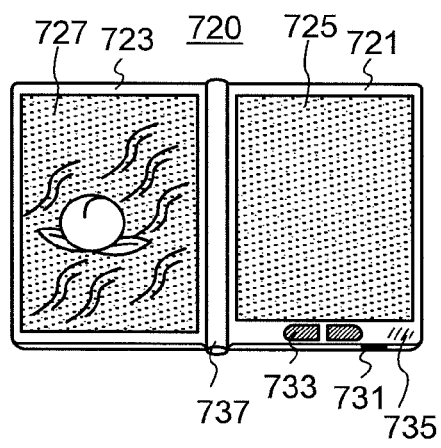

FIG. 14C illustrates an electronic book incorporating electronic paper, the electronic book 720 includes two housings, a housing 721 and a housing 723. The housing 721 and the housing 723 include a display portion 725 and a display portion 727, respectively. The housing 721 is connected to the housing 723 by a hinge 737, so that the electronic book 720 can be opened and closed using the hinge 737 as an axis. In addition, the housing 721 is provided with a power switch 731, operation keys 733, a speaker 735, and the like. At least one of the housings 721 and 723 is provided with the semiconductor device described in any of the above embodiments. Thus, an electronic book with sufficiently lowered power consumption, in which writing and reading of data can be performed at high speed and data can be stored for a long time, can be realized.

FIG. 14D illustrates a mobile phone set, which includes two housings, a housing 740 and a housing 741. Moreover, the housings 740 and 741 in a state where they are developed as illustrated in FIG. 14D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently lowered power consumption, in which writing and reading of data can be performed at high speed and data can be stored for a long time, can be realized.

FIG. 14E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently lowered power consumption, in which writing and reading of data can be performed at high speed and data can be stored for a long time, can be realized.

Figure 14F:
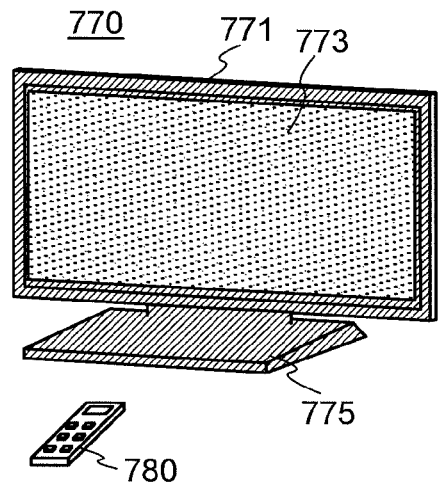

FIG. 14F is a television set 770, which includes a housing 771, a display portion 773, a stand 775, and the like. The television set 770 can be operated with a switch included in the housing 771 or with a remote controller 780. The semiconductor device described in any of the above embodiments is mounted in each of the housing 771 and the remote controller 780. Thus, a television set with sufficiently lowered power consumption, in which writing and reading of data can be performed at high speed and data can be stored for a long time, can be realized.

As described above, the electronic devices described in this embodiment each include the semiconductor device according to any of the above embodiments. Therefore, the electronic devices with lowered power consumption can be realized.

(Embodiment 6)

In this embodiment, an example of a transistor that can be applied to a semiconductor device disclosed in this specification will be described. In addition, a calculation (or simulation) result of characteristics of the transistor is shown. The transistor described in this embodiment can be suitably used as the transistor 162 described in any of the above embodiments.

The actually measured field-effect mobility of an insulated gate transistor can be lower than its original mobility because of a variety of reasons; this phenomenon occurs in not only transistors using oxide semiconductor but also all types of transistors. One of the reasons why the mobility is lowered is a defect inside a semiconductor or a defect at an interface between a semiconductor and an insulating film When a Levinson model is adopted, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the following formula is obtained.

$$\mu = \mu_0 \exp\left(-\frac{E}{kT}\right) \qquad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[FORMULA 4]}$$

Here, L represents the channel length and W represents the channel width, and L and W are each 10 μm (L=W=10 μm). In addition, $V_d$ represents the drain voltage. When dividing both sides of the above formula by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT \varepsilon C_{ox} V_g} \qquad \text{[FORMULA 5]}$$

The right side of Formula 5 is a function of $V_g$. From the formula, it is found that the defect density N can be obtained from the slope of a line in a graph which is obtained by plotting actual measured values with $\ln(I_d/V_g)$ as the axis of ordinate and $1/V_g$ as the axis of abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density etc., obtained in this manner, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{l}\right)$$ [FORMULA 6]

Here, D represents the electric field in the gate electrode direction, and B and G are constants. B and G can be obtained from actual measurement results; according to the above measurement results, B is 4.75×10$^7$ cm/s and G is 10 nm (the depth which the influence of interface scattering reaches). When D is increased (i.e., when the gate voltage is increased), the second term of Formula 6 is increased and accordingly the mobility $\mu_1$ is decreased.

Figure 21:
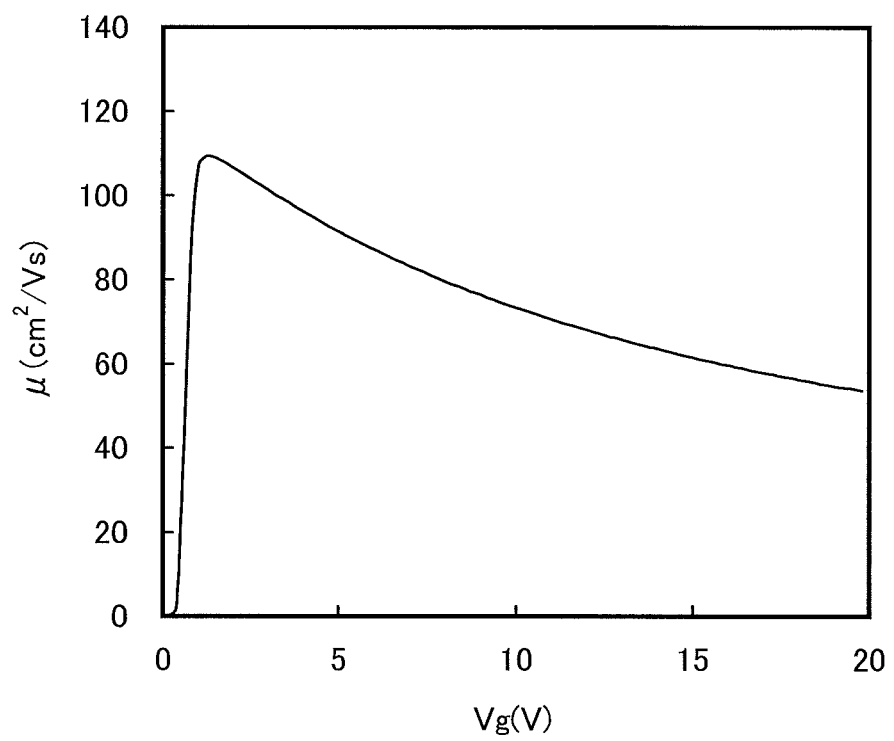
FIG. 21 is a diagram illustrating gate-voltage dependence of mobility obtained by a calculation.

Calculation results of the mobility $\mu_2$ of a transistor, a channel of which includes an ideal oxide semiconductor without a defect inside the semiconductor, are shown in FIG. 21. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage V$_d$ was assumed to be 0.1 V.

As shown in FIG. 21, the mobility has a peak of more than 100 cm$^2$/Vs at a gate voltage that is a little over 1 V and is decreased as the gate voltage becomes higher because the influence of interface scattering is increased. Note that in order to suppress interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 22A to 22C, FIGS. 23A to 23C, and FIGS. 24A to 24C. FIGS. 25A and 25B illustrate cross-sectional structures of the transistors used for the calculation. The transistors illustrated in FIGS. 25A and 25B each include a semiconductor region 2103a and a semiconductor region 2103c which have n$^+$-type conductivity in an oxide semiconductor layer. The resistivities of the semiconductor region 2103a and the semiconductor region 2103c are 2×10$^{-3}$ Ωcm.

The transistor illustrated in FIG. 25A is formed over an insulating layer 2101 and an embedded insulator 2102 which is embedded in the insulating layer 2101 and formed of aluminum oxide. The transistor includes the semiconductor region 2103a, the semiconductor region 2103c, an intrinsic semiconductor region 2103b serving as a channel formation region interposed therebetween and a gate electrode 2105. The width of the gate electrode 2105 is 33 nm.

The transistors illustrated in FIGS. 25A and 25B each can be used as the transistor 162 described in any of the above embodiments.

As in the transistor illustrated in FIGS. 10A to 10D, a gate insulating layer 2104 is formed between the gate electrode 2105 and the semiconductor region 2103b, and a source electrode 2108a and a drain electrode 2108b are provided in contact with the semiconductor region 2103a and the semiconductor region 2103c. Note that the channel width of this transistor is 40 nm.

The transistors illustrated in FIGS. 25A and 25b each include a sidewall insulating layer 2106a and a sidewall insulating layer 2106b on the opposite side surfaces of the gate electrode 2105, and an insulator 2107 over the gate electrode 2105 in order to prevent short circuiting between the gate electrode and another wiring. The sidewall insulating layer has a width of 5 nm.

The transistor of FIG. 25B is similar to the transistor of FIG. 25A in that it is formed over the insulating layer 2101 and the embedded insulator 2102 formed of aluminum oxide and that it includes the semiconductor region 2103a, the semiconductor region 2103c, the intrinsic semiconductor region 2103b interposed therebetween, the gate electrode 2105 having a width of 33 nm, the gate insulating layer 2104, the sidewall insulating layer 2106a, the sidewall insulating layer 2106b, the insulator 2107, the source electrode 2108a and the drain electrode 2108b.

The transistor illustrated in FIG. 25A is different from the transistor illustrated in FIG. 25B in the conductivity type of semiconductor regions under the sidewall insulating layer 2106a and the sidewall insulating layer 2106b. In the transistor illustrated in FIG. 25A, the semiconductor regions under the sidewall insulating layer 2106a and the sidewall insulating layer 2106b are part of the semiconductor region 2103a having n$^+$-type conductivity and part of the semiconductor region 2103c having n$^+$-type conductivity, whereas in the transistor illustrated in FIG. 25B, the semiconductor regions under the sidewall insulating layer 2106a and the sidewall insulating layer 2106b are part of the intrinsic semiconductor region 2103b. In other words, a region having a width of L$_{off}$ which overlaps with neither the semiconductor region 2103a (or the semiconductor region 2103c) nor the gate electrode 2105 is provided. This region is called an offset region, and the width L$_{off}$ is called an offset length. As is seen from the drawing, the offset length is equal to the width of the sidewall insulating layer 2106a (or the sidewall insulating layer 2106b).

Figure 22A:
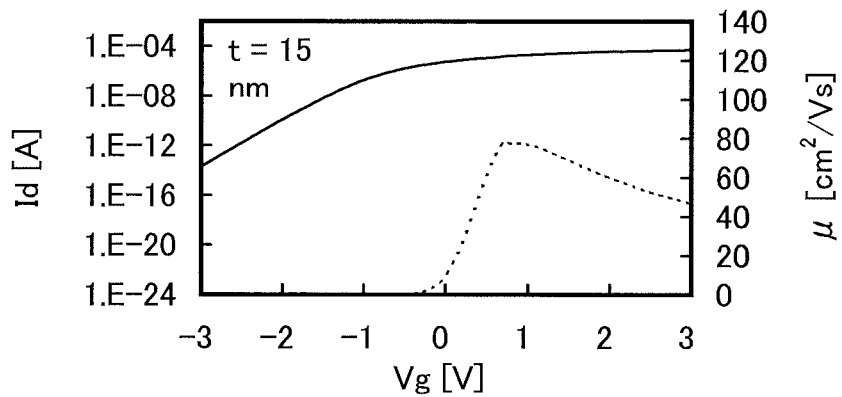
FIGS. 22A to 22C are diagrams illustrating gate-voltage dependence of drain current and mobility obtained by a calculation.
Figure 22B:
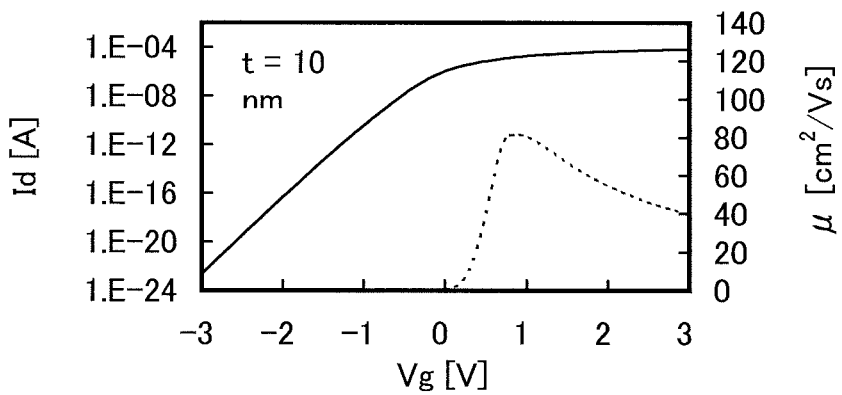
Figure 22C:
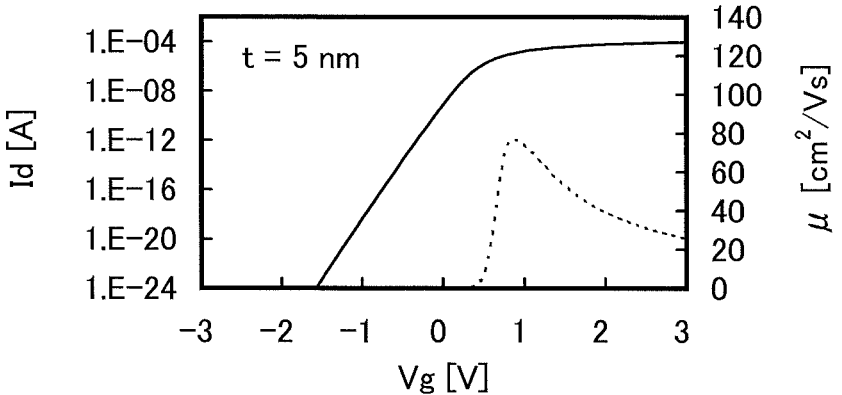

The other parameters used in the calculation are as described above. For the calculation, device simulation software Sentaurus Device manufactured by Synopsys, Inc. was used. FIGS. 22A to 22C show the gate voltage (V$_g$: a potential difference between the gate and the source) dependence of the drain current (I$_d$, a solid line) and the mobility (μ, a dotted line) of the transistor having the structure illustrated in FIG. 25A. The drain current I$_d$ is obtained by calculation under the assumption that the drain voltage (a potential difference between the drain and the source) is +1 V and the mobility μ is obtained by calculation under the assumption that the drain voltage is +0.1 V.

FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm. As the gate insulating layer is thinner, the drain current I$_d$ (off-state current) particularly in an off state is significantly decreased. In contrast, there is no noticeable change in the peak value of the mobility μ and the drain current I$_d$ (on-state current) in an on state. The graphs show that the drain current exceeds 10 μA, which is required in a memory cell and the like, at a gate voltage of around 1 V.

Figure 23A:
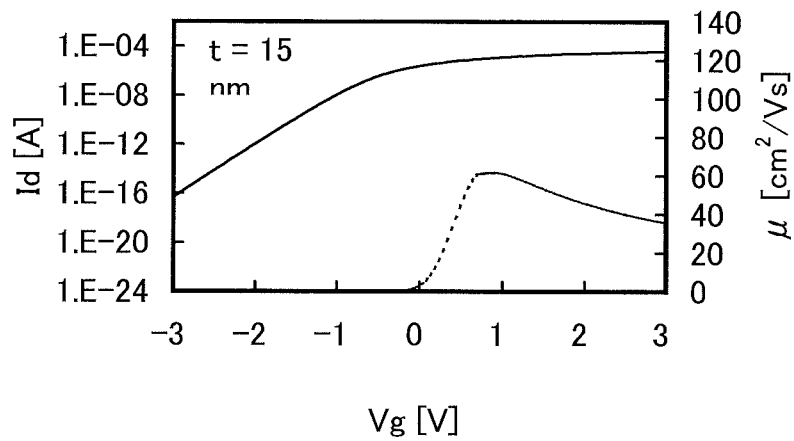
FIGS. 23A to 23C are diagrams illustrating gate-voltage dependence of drain current and mobility obtained by a calculation.
Figure 23B:
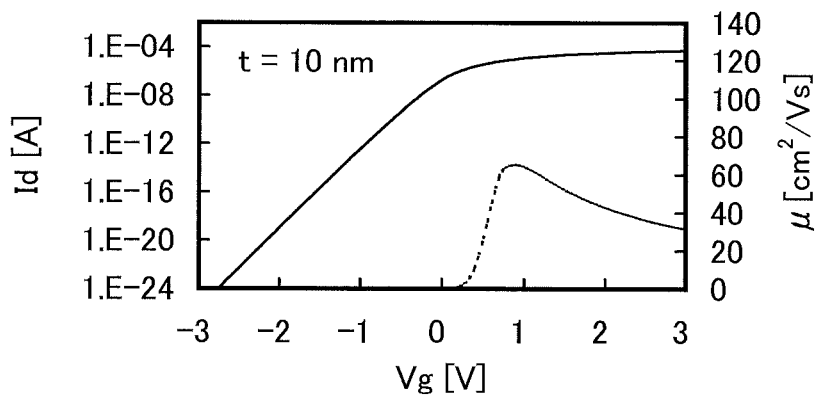
Figure 23C:
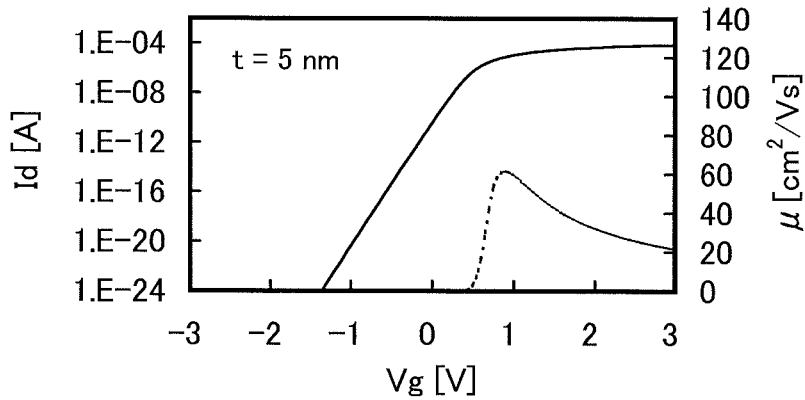

FIGS. 23A to 23C show the gate voltage V$_g$ dependence of the drain current I$_d$ (a solid line) and the mobility μ (a dotted line) of the transistor having the structure illustrated in FIG. 25B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 23A shows the gate voltage dependence of the transistor in the case where the thickness of the gate insulating layer is 15 nm, FIG. 23B shows that of the transistor in the case where the thickness of the gate insulating layer is 10 nm, and FIG. 23C shows that of the transistor in the case where the thickness of the gate insulating layer is 5 nm.

Figure 24A:
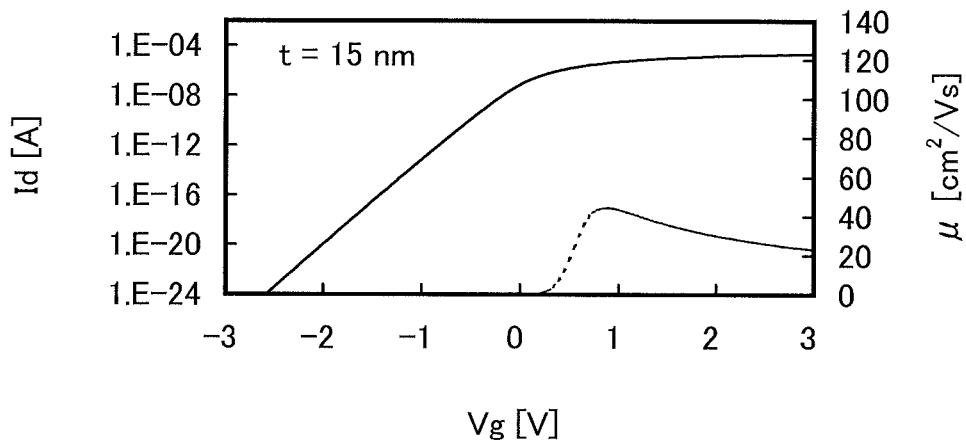
FIGS. 24A to 24C are diagrams illustrating dependence of drain current and mobility obtained by a calculation on gate-voltage.
Figure 24B:
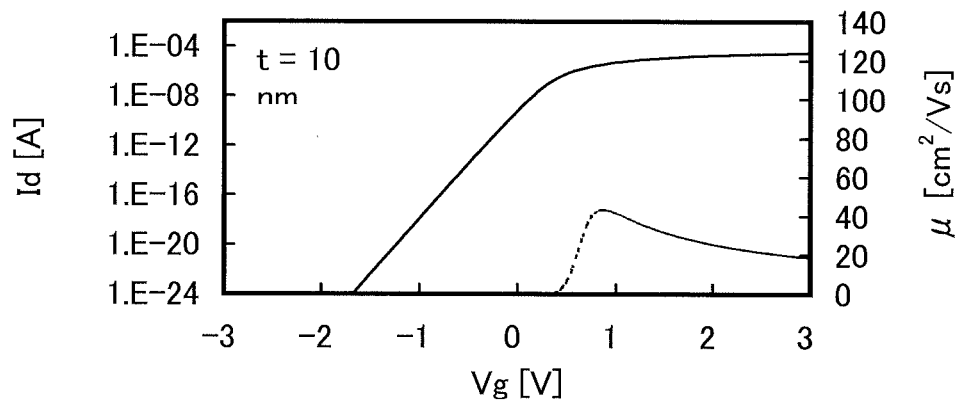
Figure 24C:
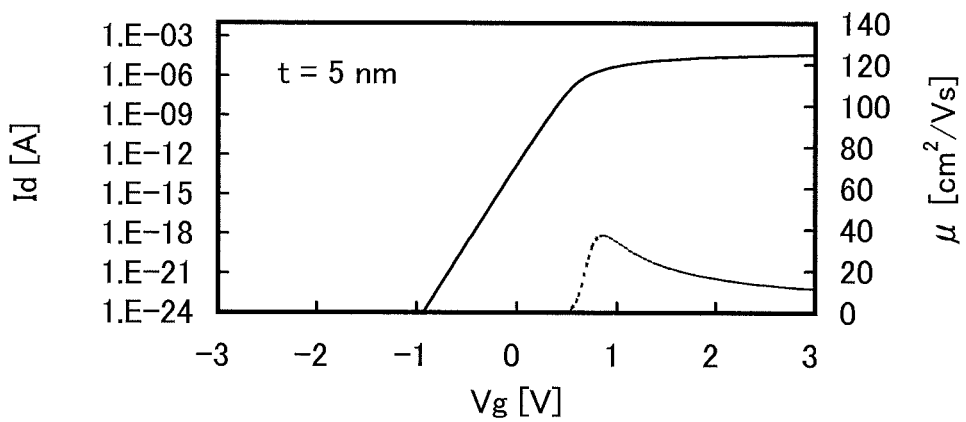
Figure 25A:
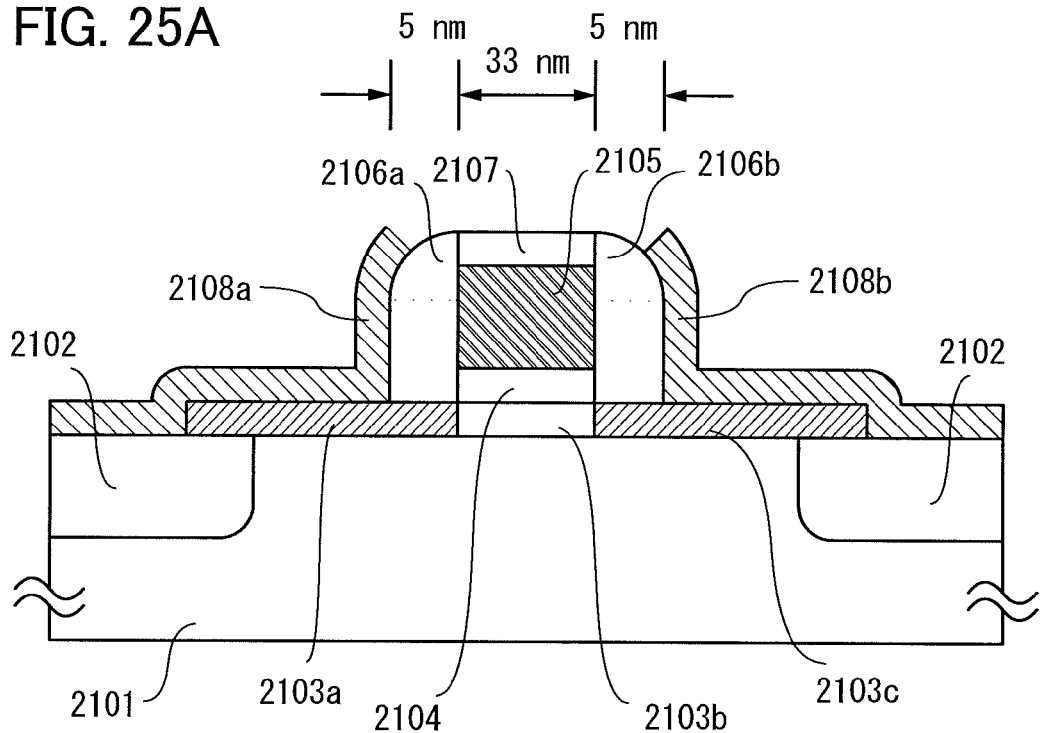
FIGS. 25A and 25B are diagrams illustrating cross-sectional structures of transistors which are used for calculation.
Figure 25B:
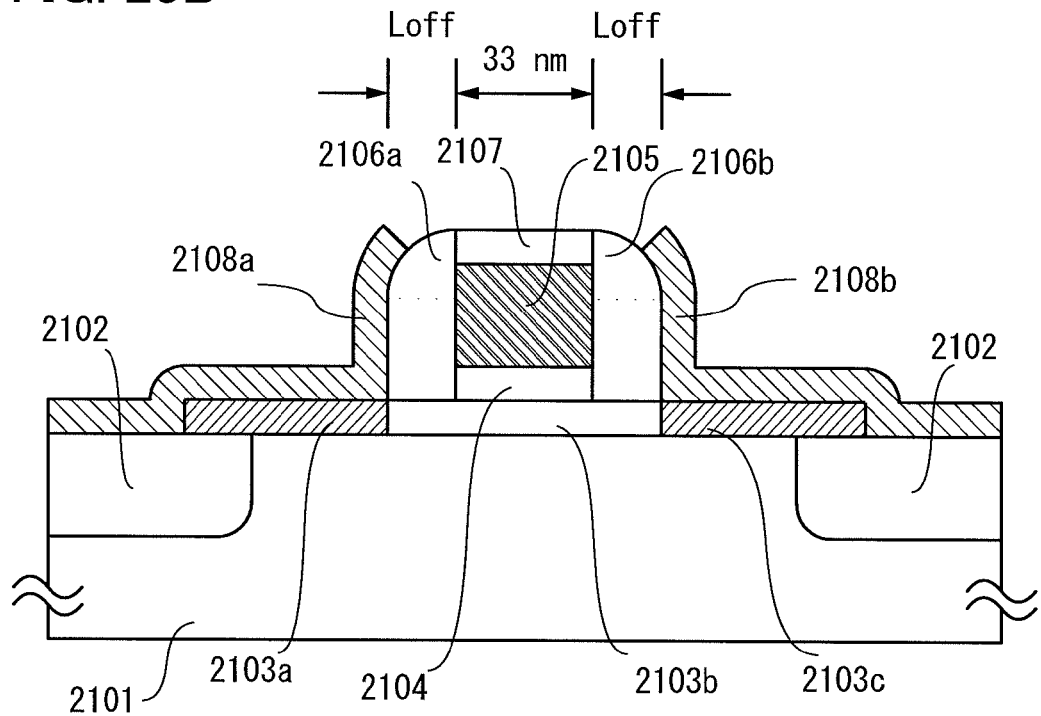

Further, FIGS. 24A to 24C show the gate voltage dependence of the drain current $I_d$ (a solid line) and the mobility μ (a dotted line) of the transistor having the structure illustrated in FIG. 25B where the offset length $L_{off}$ is 15 nm The drain current $I_d$ is obtained by calculation under the assumption that the drain voltage is +1 V and the mobility μ is obtained by calculation under the assumption that the drain voltage is +0.1 V. FIG. 24A shows the gate voltage dependence of the transistor in the case where the thickness of the gate insulating layer is 15 nm, FIG. 24B shows that of the transistor in the case where the thickness of the gate insulating layer is 10 nm, and FIG. 24C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm$^2$/Vs in FIGS. 22A to 22C, approximately 60 cm$^2$/Vs in FIGS. 23A to 23C, and approximately 40 cm$^2$/Vs in FIGS. 24A to 24C; thus, the peak of the mobility μ is decreased as the offset length $L_{off}$ is increased. Further, such a tendency applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory cell and the like, at a gate voltage of around 1 V.

(Embodiment 7)

In this embodiment, an example of a transistor that can be applied to a semiconductor device disclosed in this specification will be described. The transistor described in this embodiment can be suitably used as the transistor 162 described in any of the above embodiments.

In this embodiment, an example of a transistor in which an In—Sn—Zn—O film is used as an oxide semiconductor layer will be described with reference to FIGS. 33A and 33B and the like.

Figure 33A:
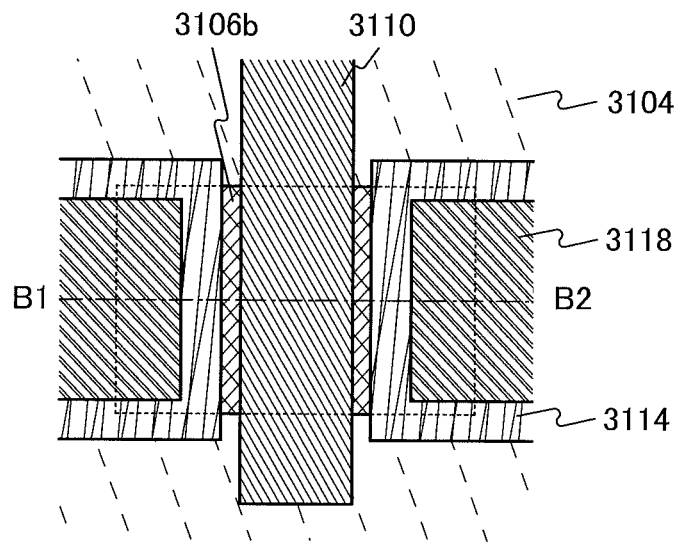
FIGS. 33A and 33B are a top view and a cross-sectional view of a semiconductor device respectively.
Figure 33B:
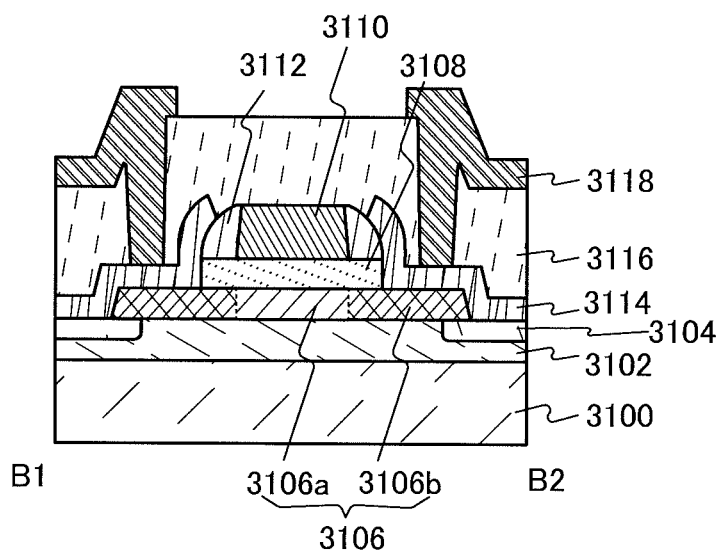

FIGS. 33A and 33B are a top view and a cross-sectional view of a coplanar transistor having a top-gate structure. FIG. 33A is the top view of the transistor. FIG. 33B illustrates cross section B1-B2 along dashed-dotted line B1-B2 in FIG. 33A.

The transistor illustrated in FIG. 33B includes a substrate 3100; an insulating layer 3102 provided over the substrate 3100; an embedded insulator 3104 provided in the periphery of the insulating layer 3102; an oxide semiconductor layer 3106 provided over the insulating layer 3102 and the embedded insulator 3104 and including a high-resistance region 3106a and low-resistance regions 3106b; a gate insulating layer 3108 provided over the oxide semiconductor layer 3106; a gate electrode 3110 provided to overlap with the oxide semiconductor layer 3106 with the gate insulating layer 3108 positioned therebetween; a sidewall insulating layer 3112 provided in contact with a side surface of the gate electrode 3110; a pair of electrodes 3114 provided in contact with at least the low-resistance regions 3106b; an interlayer insulating film 3116 provided to cover at least the oxide semiconductor layer 3106, the gate electrode 3110, and the pair of electrodes 3114; and a wiring 3118 provided to be connected to at least one of the pair of electrodes 3114 through an opening formed in the interlayer insulating film 3116.

Although not illustrated, a protective film may be provided to cover the interlayer insulating film 3116 and the wiring 3118. With the protective film, a minute amount of leakage current generated by surface conduction of the interlayer insulating film 3116 can be reduced and thus the off-state current of the transistor can be reduced.

(Embodiment 8)

In this embodiment, an example of a transistor that can be applied to a semiconductor device disclosed in this specification will be described. The transistor described in this embodiment can be suitably used as the transistor 162 described in any of the above embodiments.

In this embodiment, another example of a transistor in which an In—Sn—Zn—O film is used as an oxide semiconductor layer will be described.

Figure 34A:
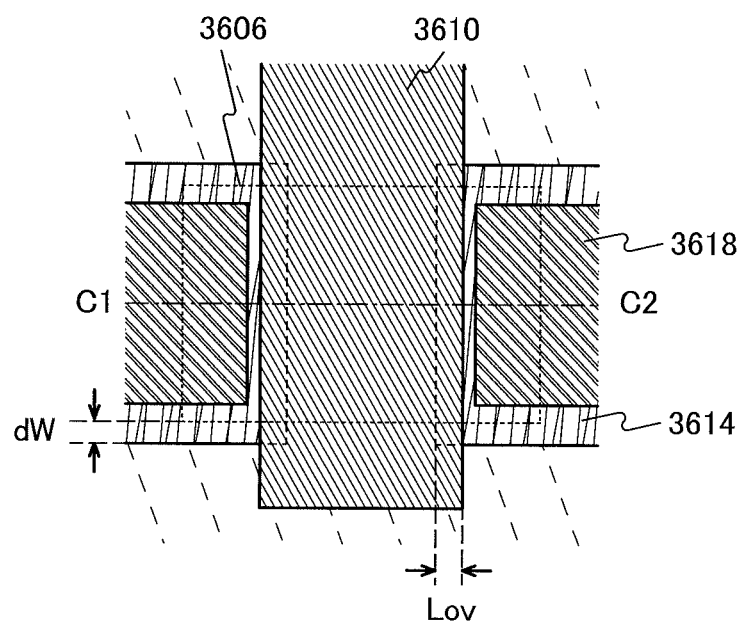
FIGS. 34A and 34B are a top view and a cross-sectional view of a semiconductor device respectively.
Figure 34B:
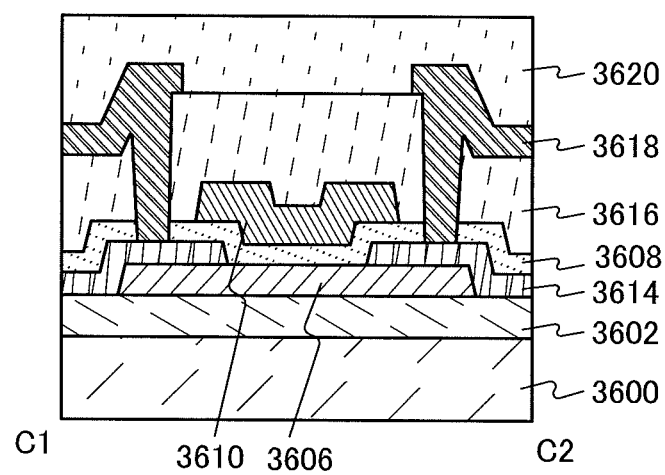

FIGS. 34A and 34B are a top view and a cross-sectional view which illustrate a structure of a transistor manufactured in this embodiment. FIG. 34A is the top view of the transistor. FIG. 34B is a cross-sectional view along dashed-dotted line C1-C2 in FIG. 34A.

The transistor illustrated in FIG. 34B includes a substrate 3600; an insulating layer 3602 provided over the substrate 3600; an oxide semiconductor layer 3606 provided over the insulating layer 3602; a pair of electrodes 3614 in contact with the oxide semiconductor layer 3606; a gate insulating layer 3608 provided over the oxide semiconductor layer 3606 and the pair of electrodes 3614; a gate electrode 3610 provided to overlap with the oxide semiconductor layer 3606 with the gate insulating layer 3608 interposed therebetween; an interlayer insulating film 3616 provided to cover the gate insulating layer 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate is used. As the insulating layer 3602, a silicon oxide film is used. As the oxide semiconductor layer 3606, an In—Sn—Zn—O film is used. As the pair of electrodes 3614, a tungsten film is used. As the gate insulating layer 3608, a silicon oxide film is used. The gate electrode 3610 has a stacked structure of a tantalum nitride film and a tungsten film. The interlayer insulating film 3616 has a stacked structure of a silicon oxynitride film and a polyimide film. The wirings 3618 each has a stacked structure in which a titanium film, an aluminum film, and a titanium film are formed in this order. As the protective film 3620, a polyimide film is used.

Note that in the transistor having the structure illustrated in FIG. 34A, the width of a portion where the gate electrode 3610 overlaps with one of the pair of electrodes 3614 is referred to as Lov. Similarly, the width of a portion of the pair of electrodes 3614, which does not overlap with the oxide semiconductor layer 3606, is referred to as dW.

EXAMPLE 1

A transistor in which an oxide semiconductor including In, Sn, and Zn as main components is used as a channel formation region can have favorable characteristics by depositing the oxide semiconductor while heating a substrate or by performing heat treatment after an oxide semiconductor layer is formed. Note that a "main component" refers to an element included in a composition at 5 atomic % or more.

By intentionally heating the substrate after formation of the oxide semiconductor layer including In, Sn, and Zn as main components, the field-effect mobility of the transistor can be enhanced. Further, the threshold voltage of the transistor can be positively shifted to make the transistor normally off.

Figure 26A:
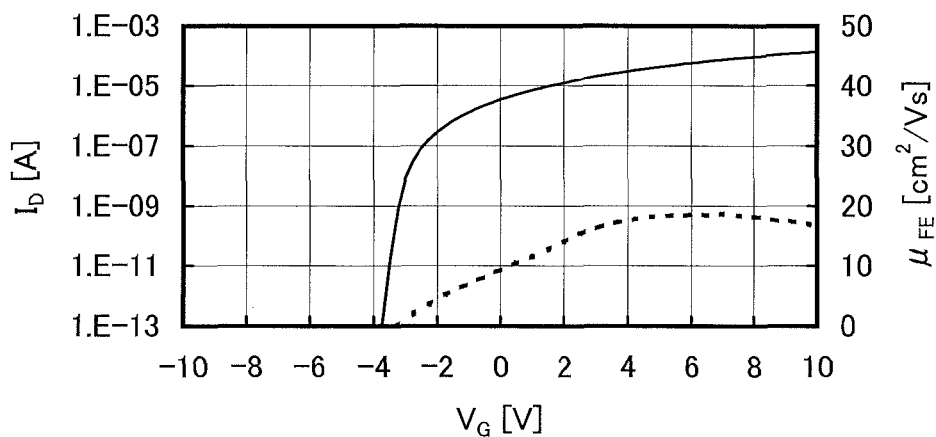
FIGS. 26A to 26C are graphs each showing characteristics of a transistor including an oxide semiconductor layer.
Figure 26B:
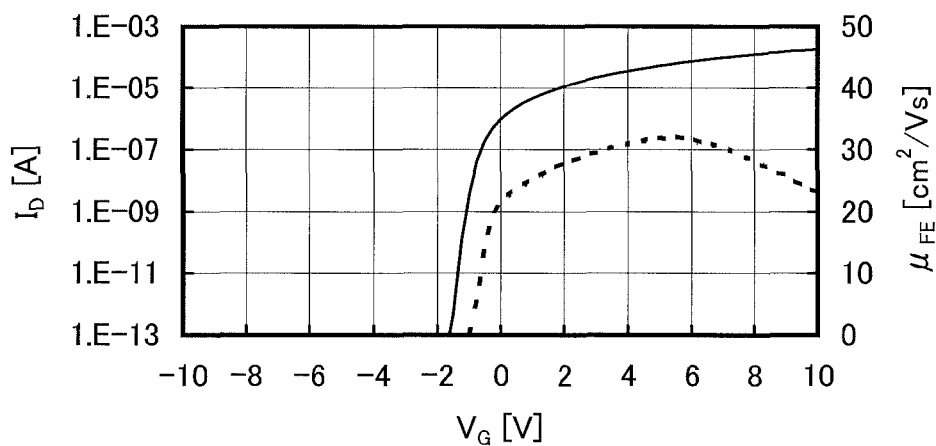
Figure 26C:
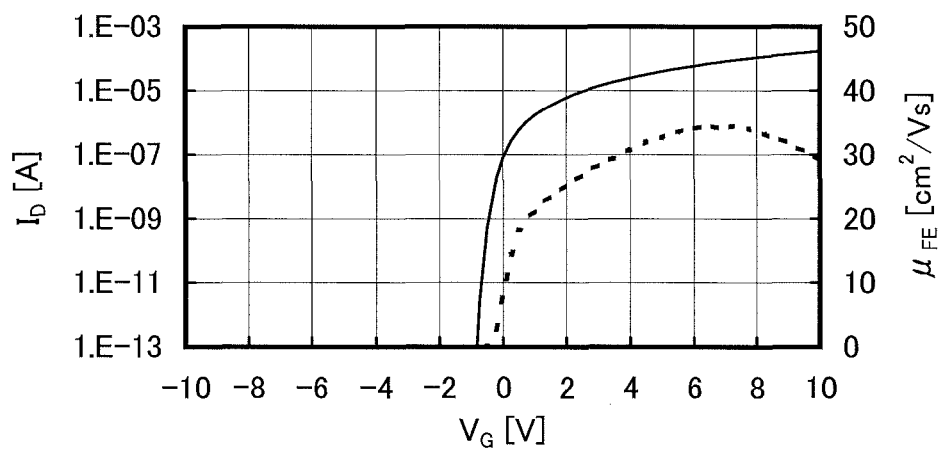

As an example, FIGS. 26A to 26C each show characteristics of a transistor in which an oxide semiconductor layer including In, Sn, and Zn as main components and having a channel length L of 3 μm and a channel width W of 10 μm, and a gate insulating layer with a thickness of 100 nm are used. Note that $V_d$ was set to 10 V.

FIG. 26A shows characteristics of a transistor whose oxide semiconductor layer including In, Sn, and Zn as main components was formed by a sputtering method without heating a substrate intentionally. The field-effect mobility of the transistor is 18.8 cm$^2$/Vsec. On the other hand, when the oxide semiconductor layer including In, Sn, and Zn as main components is formed while heating the substrate intentionally, the field-effect mobility can be increased. FIG. 26B shows characteristics of a transistor whose oxide semiconductor layer including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor layer including In, Sn, and Zn as main components. FIG. 26C shows characteristics of a transistor whose oxide semiconductor layer including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor layer during the formation by sputtering. Further, the heat treatment after film formation enables hydrogen, a hydroxyl group, or moisture to be released and removed from the oxide semiconductor layer. In this manner, the field-effect mobility can be enhanced. The enhancement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor layer that includes In, Sn, and Zn as main components and is formed without heating a substrate intentionally is used as a channel formation region, the threshold voltage tends to be shifted negatively. However, when the oxide semiconductor layer formed while heating the substrate intentionally is used, the negative shift of the threshold voltage can be settled. That is, the threshold voltage is shifted so that the transistor becomes normally off this tendency can be confirmed on the basis of comparison between FIGS. 26A and 26B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor layer having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, the drift of the threshold voltage can be less than ±1.5 V, preferably less than ±1.0 V.

A BT test was performed on the following two transistors: Sample 1 on which heat treatment was not performed after formation of an oxide semiconductor layer, and Sample 2 on which heat treatment at 650° C. was performed after formation of an oxide semiconductor layer.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and at $V_d$ of 10 V. Then, the substrate temperature was set at 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 27A:
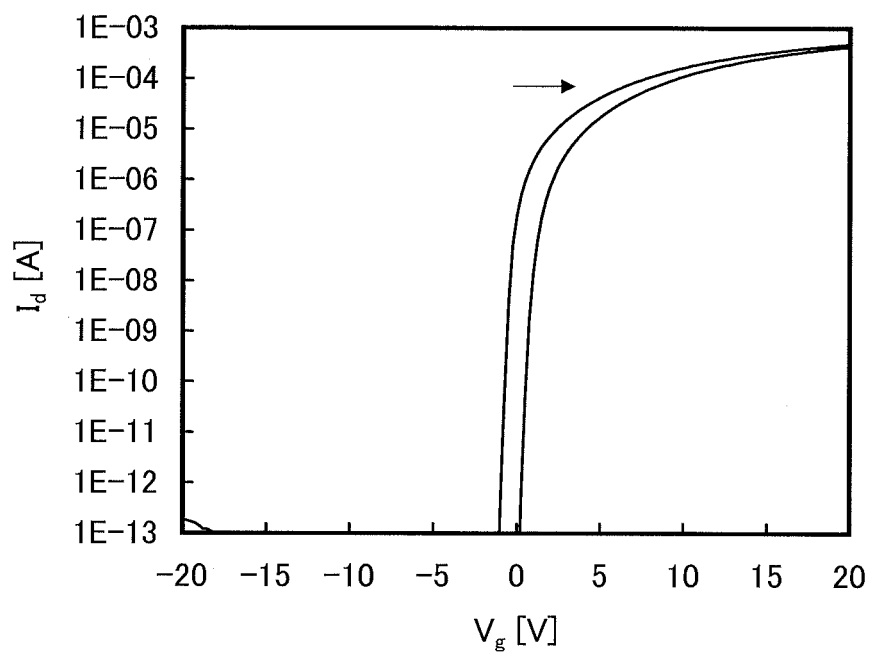
FIGS. 27A and 27B are graphs showing $V_g$-$I_d$ characteristics after a BT test of a transistor as Sample 1.
Figure 27B:
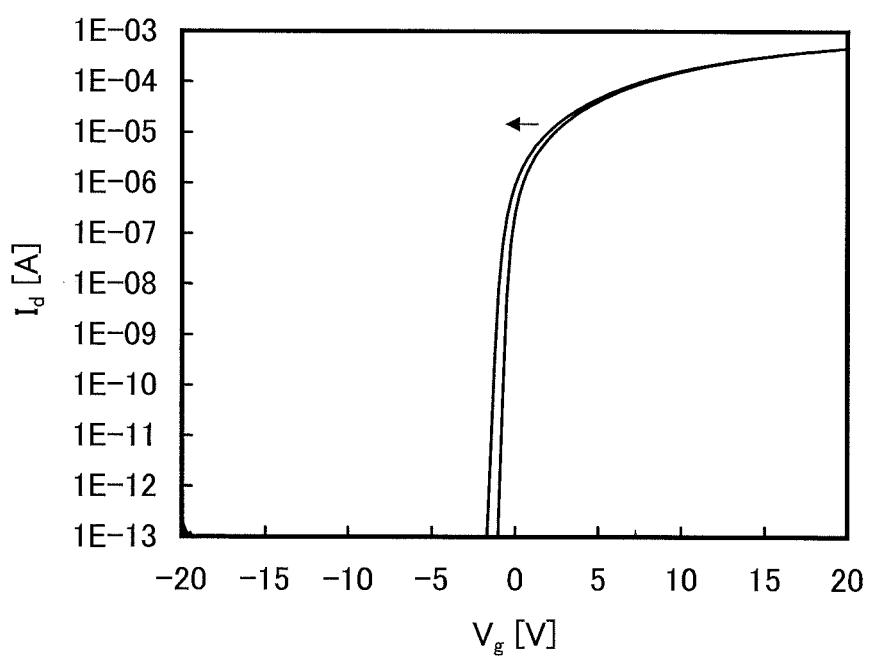
Figure 28A:
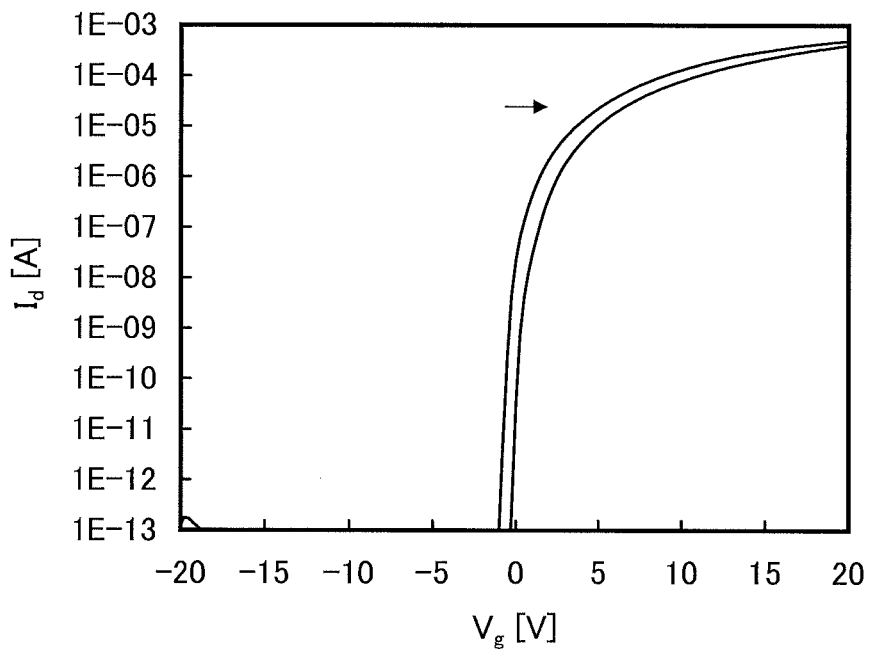
FIGS. 28A and 28B are graphs showing $V_g$-$I_d$ characteristics after a BT test of a transistor as Sample 2.
Figure 28B:
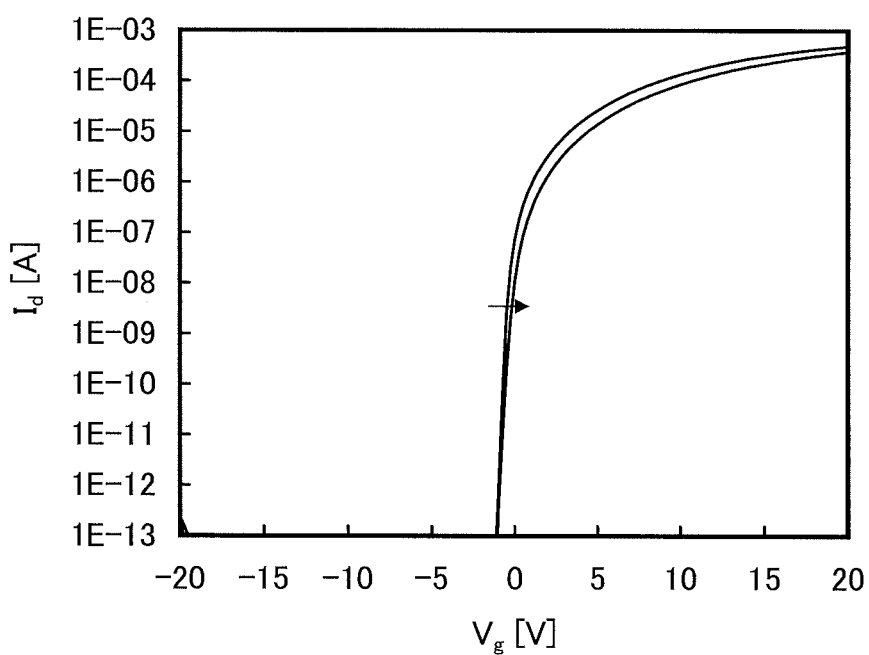

FIGS. 27A and 27B show a result of the positive BT test of Sample 1 and a result of the negative BT test of Sample 1, respectively. FIGS. 28A and 28B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amounts of shift in the threshold voltages of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor layer can be obtained. For example, when an oxide semiconductor layer which is formed by sputtering using a target having a composition ratio of In:Sn:Zn=1:1:1 without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 29:
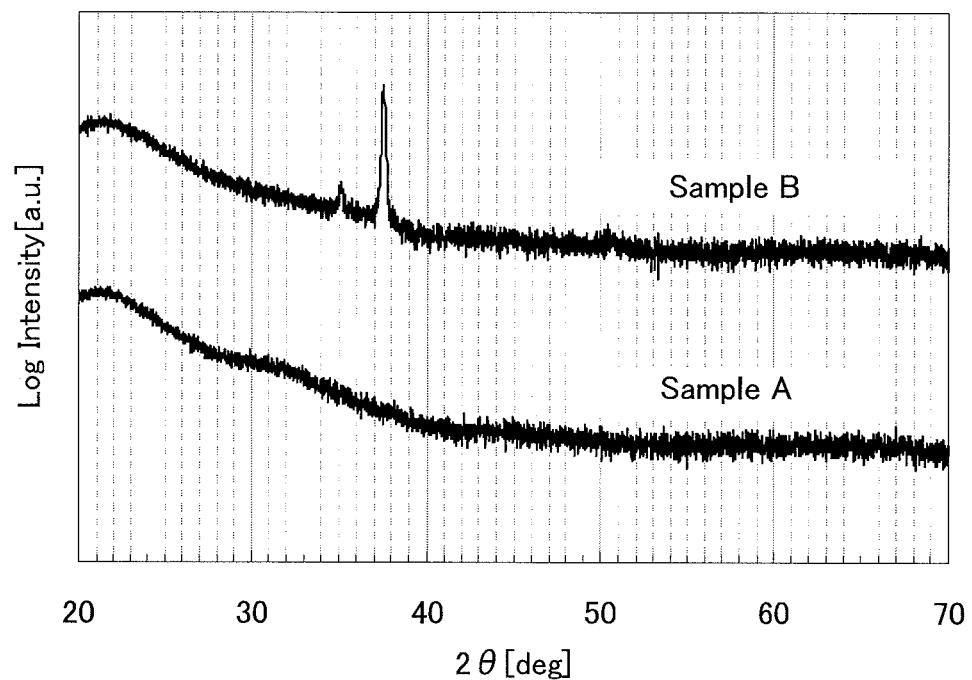
FIG. 29 is a graph showing XRD spectra of Sample A and Sample B.

FIG. 29 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 30:
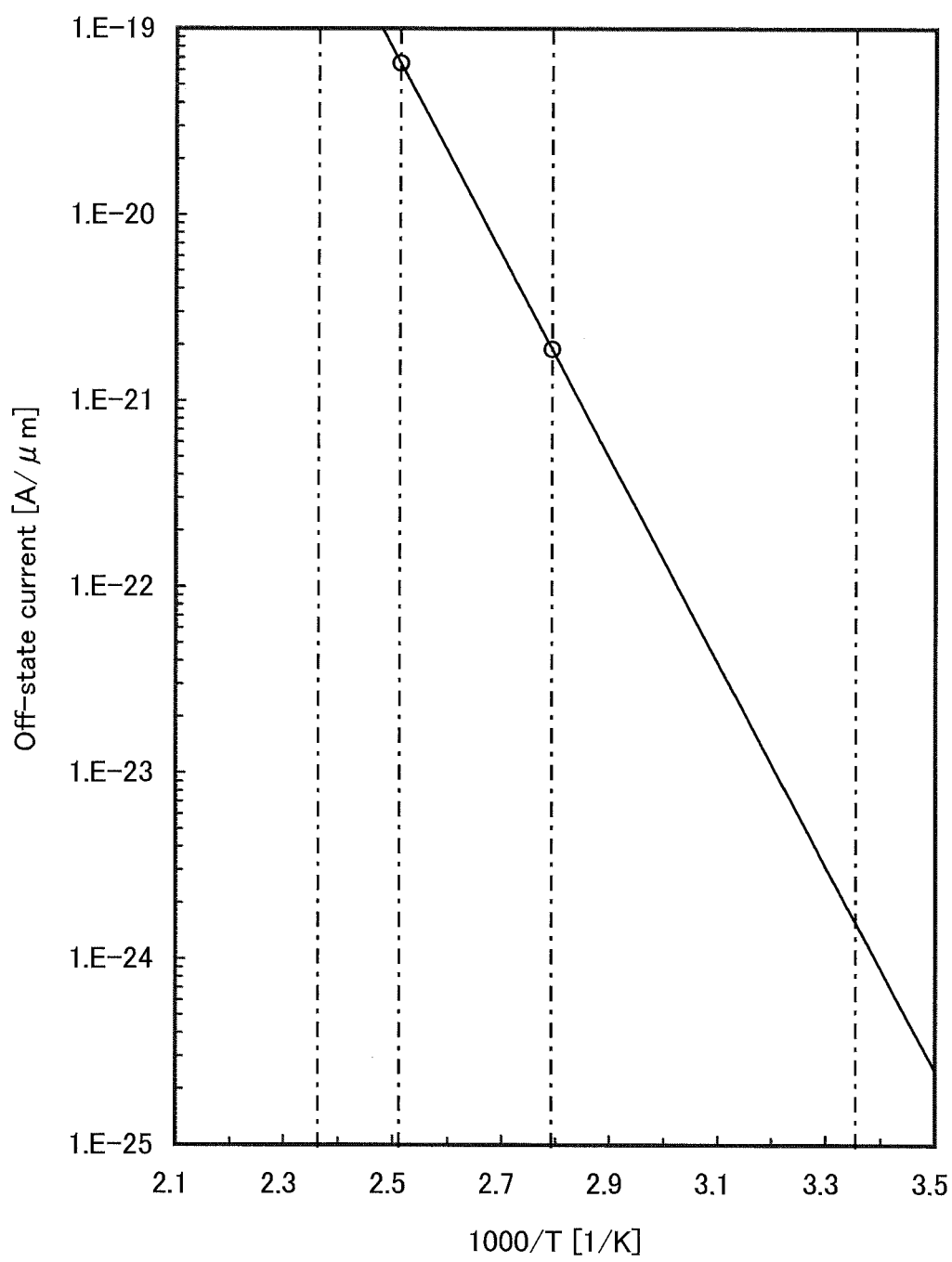
FIG. 30 is a graph showing a relation between off-state current of a transistor and a substrate temperature in measurement.

Specifically, as shown in FIG. 30, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga and Zn as main components.

The relation between the substrate temperature and electric characteristics of a transistor formed using the sample, on which heat treatment at 650° C. was performed after formation of the oxide semiconductor layer, was evaluated.

The transistor used for the measurement has a channel length L of 3 μm, a channel width W of 10 μm, Lov of 0 μm and dW of 0 μm. Note that $V_d$ was set to 10 V. Note that the substrate temperature was −40° C., −25° C., 25° C., 75° C., 125° C. and 150° C. Here, in a transistor, the width of a portion where a gate electrode overlaps with one of a pair of electrodes is referred to as Lov, and the width of a portion of the pair of electrodes, which does not overlap with an oxide semiconductor layer, is referred to as dW.

Figure 31:
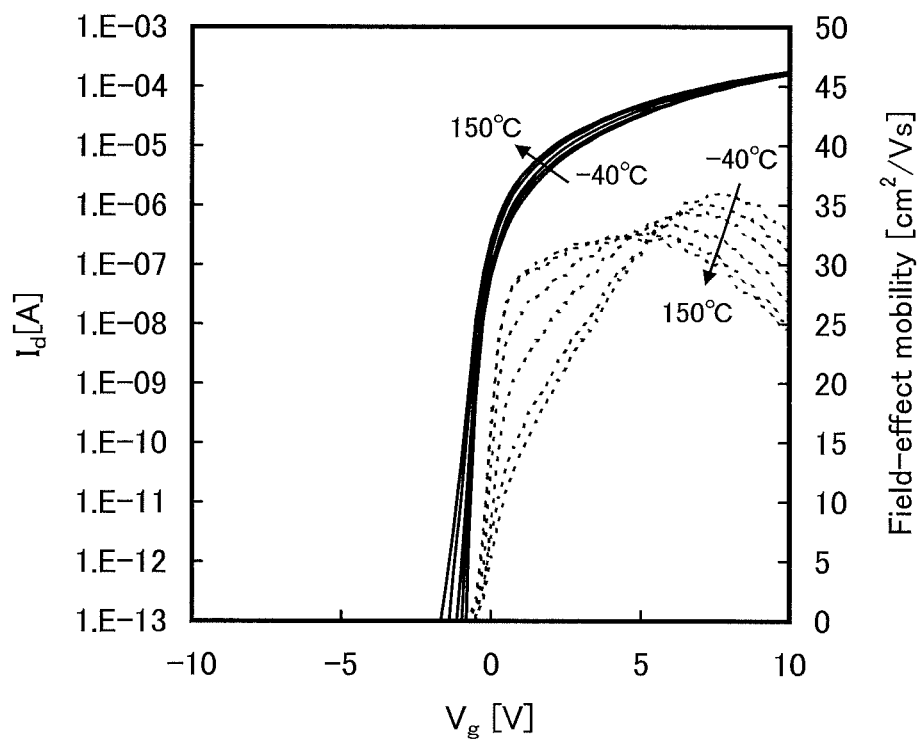
FIG. 31 is a graph showing $V_g$ dependence of $I_d$ and a field-effect mobility.
Figure 32A:
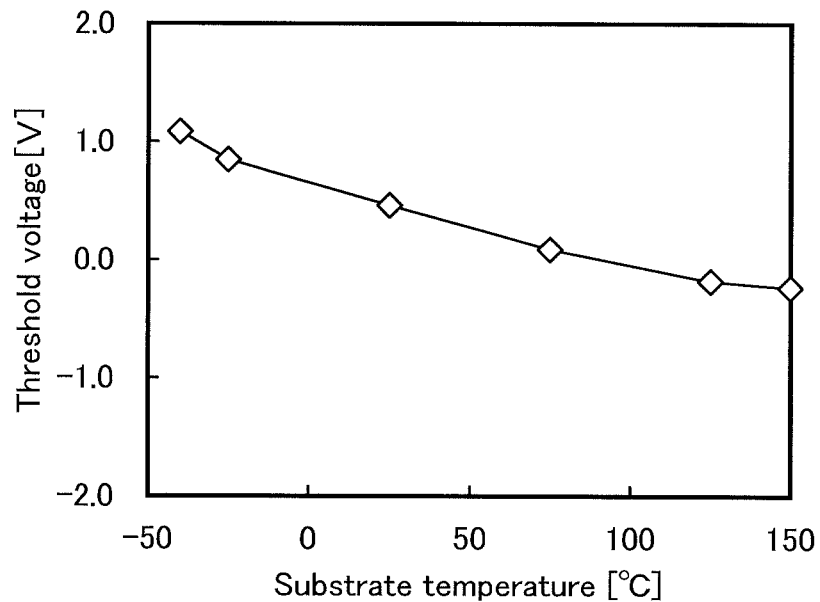
FIGS. 32A and 32B are graphs showing, respectively a relation between a substrate temperature and a threshold voltage and a relation between a substrate temperature and a field-effect mobility.

FIG. 31 shows the $V_g$ dependence of $I_d$ (a solid line) and field-effect mobility (a dotted line). FIG. 32A shows a relation between the substrate temperature and the threshold voltage, and FIG. 32B shows a relation between the substrate temperature and the field-effect mobility.

From FIG. 32A, it is found that the threshold voltage gets lower as the substrate temperature increases. Note that the threshold voltage is decreased from 1.09 V to −0.23 V in the range from −40° C. to 150° C.

Figure 32B:
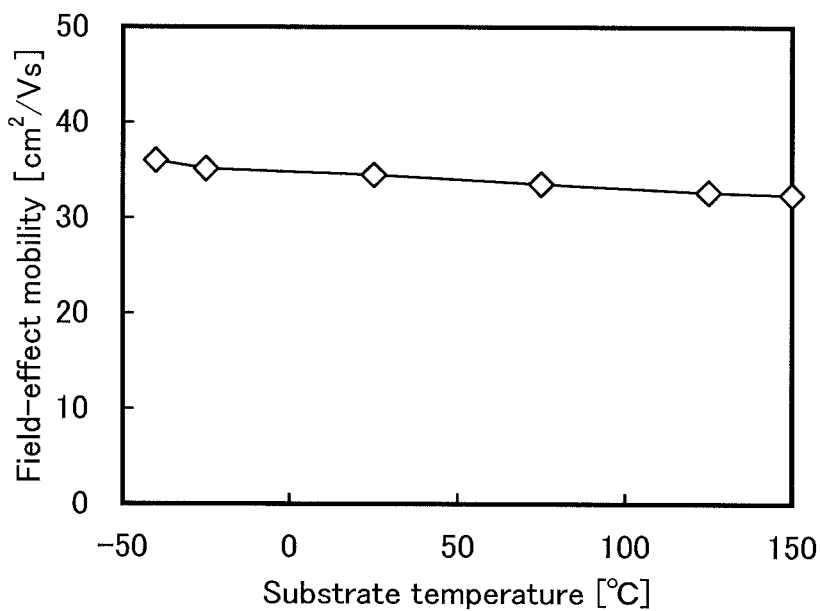

From FIG. 32B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in this temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow at when the gate voltage is 2.7 V of the gate voltage and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

This application is based on Japanese Patent Application serial No. 2010-177874 filed with Japan Patent Office on Aug. 6, 2010 and Japanese Patent Application serial No. 2011-108422 filed with Japan Patent Office on May 13, 2011, the entire contents of which are hereby incorporated by reference.

What is claimed is:

1. A semiconductor device comprising:
a selection transistor, a first memory cell, and a second memory cell which are electrically connected in series between a bit line and a source line, each of the first and second memory cells comprising:
a first transistor including a first gate, a first source, and a first drain;
a second transistor including a second gate, a second source, and a second drain; and
a capacitor having one terminal electrically connected to the first gate and the second source;
a first signal line electrically connected to the second drain of the first memory cell and the second drain of the second memory cell;
a second signal line electrically connected to the second gate of the first memory cell and the second gate of the second memory cell;
a first word line electrically connected to the other terminal of the capacitor of the first memory cell;
a second word line electrically connected to the other terminal of the capacitor of the second memory cell; and
a selection line electrically connected to a gate of the selection transistor,
wherein the bit line is electrically connected to the first drain of the first memory cell through the selection transistor,
wherein the first source of the first memory cell and the first drain of the second memory cell are electrically connected to each other,
wherein the source line is electrically connected to the first source of the second memory cell, and
wherein the second transistor includes an oxide semiconductor layer.

2. The semiconductor device according to claim 1, the first transistor of the first memory cell comprising:
a channel formation region provided in a substrate including a semiconductor material;
impurity regions with the channel formation region interposed therebetween;
a first gate insulating layer over the channel formation region; and
a first gate electrode overlapping with the channel formation region and over the first gate insulating layer.

3. The semiconductor device according to claim 2, wherein the substrate is a single crystal semiconductor substrate or an SOI substrate.

4. The semiconductor device according to claim 2, wherein the semiconductor material is silicon.

5. The semiconductor device according to claim 1, wherein the oxide semiconductor layer comprises In, Ga, and Zn.

6. A semiconductor device comprising:
a source line;
a bit line;
first to m-th word lines (m is a natural number greater than or equal to 2);
a first signal line;
a second signal line;
a first selection line;
a second selection line;
first to m-th memory cells connected in series between the source line and the bit line, each of the first to m-th memory cells comprising;
a first transistor including a first gate, a first source and a first drain,
a second transistor including a second gate, a second source, and a second drain, and
a capacitor;
a first selection transistor having a gate electrically connected to the first selection line; and
a second selection transistor having a gate is electrically connected to the second selection line,
wherein the second transistor includes an oxide semiconductor layer,
wherein the source line is electrically connected to the first source of the m-th memory cell through the second selection transistor,
wherein the bit line is electrically connected to the first drain of the first memory cell through the first selection transistor,
wherein the first signal line is electrically connected to the second drain of the first to m-th memory cells,
wherein the second signal line is electrically connected to the second gate of the first to m-th memory cells,
wherein the first drain of the l-th (l is a natural number of from 2 to m) memory cell is electrically connected to the first source of the (l−1)-th memory cell,
wherein the k-th (k is a natural number of from 1 to m) word line is electrically connected to one terminal of the capacitor of the k-th memory cell, and
wherein the second source of the k-th memory cell is electrically connected to the first gate of the k-th memory cell and the other terminal of the capacitor of the k-th memory cell.

7. The semiconductor device according to claim 6, the first transistor comprising:
a channel formation region provided in a substrate including a semiconductor material;
impurity regions with the channel formation region interposed therebetween;
a first gate insulating layer over the channel formation region; and
a first gate electrode overlapping with the channel formation region and over the first gate insulating layer.

8. The semiconductor device according to claim 7, wherein the substrate including is a single crystal semiconductor substrate or an SOI substrate.

9. The semiconductor device according to claim 7, wherein the semiconductor material is silicon.

10. The semiconductor device according to claim 6, wherein the oxide semiconductor layer comprises In, Ga, and Zn.

11. A semiconductor device comprising:
a first selection transistor, a second selection transistor, a first memory cell, and a second memory cell which are electrically connected in series between a bit line and a source line, each of the first and second memory cells comprising:

a first transistor including a first gate, a first source, and a first drain;
a second transistor including a second gate, a second source, and a second drain; and
a capacitor having one terminal electrically connected to the first gate and the second source;
a first signal line electrically connected to the second drain of the first memory cell and the second drain of the second memory cell;
a second signal line electrically connected to the second gate of the first memory cell and the second gate of the second memory cell;
a first word line electrically connected to the other terminal of the capacitor of the first memory cell;
a second word line electrically connected to the other terminal of the capacitor of the second memory cell;
a first selection line electrically connected to a gate of the first selection transistor; and
a second selection line electrically connected to a gate of the second selection transistor,
wherein the bit line is electrically connected to the first drain of the first memory cell through the first selection transistor,
wherein the first source of the first memory cell and the first drain of the second memory cell are electrically connected to each other,
wherein the source line is electrically connected to the first source of the second memory cell through the second selection transistor, and
wherein the second transistor includes an oxide semiconductor layer.

12. The semiconductor device according to claim 11, the first transistor of the first memory cell comprising:
a channel formation region provided in a substrate including a semiconductor material;
impurity regions with the channel formation region interposed therebetween;
a first gate insulating layer over the channel formation region; and
a first gate electrode overlapping with the channel formation region and over the first gate insulating layer.

13. The semiconductor device according to claim 12, wherein the substrate is a single crystal semiconductor substrate or an SOI substrate.

14. The semiconductor device according to claim 12, wherein the semiconductor material is silicon.

15. The semiconductor device according to claim 11, wherein the oxide semiconductor layer comprises In, Ga, and Zn.

* * * * *

UNITED STATES PATENT AND TRADEMARK OFFICE
CERTIFICATE OF CORRECTION

PATENT NO. : 8,792,284 B2
APPLICATION NO. : 13/196226
DATED : July 29, 2014
INVENTOR(S) : Tatsuya Ohnuki It is certified that error appears in the above-identified patent and that said Letters Patent is hereby corrected as shown below:

In the Specification

Column 11, line 2 – replace "in" with --m--;

Column 17, line 43 – replace "(1-1)-th" with --(I-1)th--;

Column 18, line 44 – replace "foamed" with --formed--;

Column 28, line 34 – replace "$In_2SnZn_2O_7(ZnO)$," with --$In_2SnZn_2O_7(ZnO)_m$--;

Column 29, line 45 – replace "farm" with --form--;

Column 35, line 6 – replace "fanned" with --formed--;

Column 47, line 15 – after "15 nm" insert --.--;

Column 49, line 51 – after "manner" insert --:--;

Column 50, line 4 – after "normally off" insert --;--; and

In the Claims

Column 54, line 12 – after "memory cells comprising" replace ";" with --:--.

Signed and Sealed this
Twelfth Day of May, 2015

Michelle K. Lee
*Director of the United States Patent and Trademark Office*